United States Patent
Cunningham et al.

(10) Patent No.: US 9,436,784 B2
(45) Date of Patent: Sep. 6, 2016

(54) VALIDATING AND CALIBRATING A FORECAST MODEL

(71) Applicant: University of Alaska Fairbanks, Fairbanks, AK (US)

(72) Inventors: Keith W. Cunningham, Fairbanks, AK (US); Peter Webley, Fairbanks, AK (US)

(73) Assignee: University of Alaska Fairbanks, Fairbanks, AK (US)

( * ) Notice: Subject to any disclaimer, the term of this patent is extended or adjusted under 35 U.S.C. 154(b) by 0 days.

(21) Appl. No.: 14/176,449

(22) Filed: Feb. 10, 2014

(65) Prior Publication Data
US 2015/0019185 A1    Jan. 15, 2015

Related U.S. Application Data

(60) Provisional application No. 61/762,680, filed on Feb. 8, 2013.

(51) Int. Cl.
*G06F 17/50* (2006.01)
*G06F 19/00* (2011.01)

(52) U.S. Cl.
CPC .......... *G06F 17/5009* (2013.01); *G06F 19/00* (2013.01)

(58) Field of Classification Search
USPC ................ 703/2, 6; 340/971, 945, 949, 963; 701/415
See application file for complete search history.

(56) References Cited

U.S. PATENT DOCUMENTS

| | | | |
|---|---|---|---|
| 6,501,392 B2 * | 12/2002 | Gremmert et al. ........... | 340/971 |
| 7,027,898 B1 * | 4/2006 | Leger .................... | B64D 43/00 701/14 |
| 7,383,131 B1 * | 6/2008 | Wey .......................... | G01W 1/00 702/4 |
| 7,414,706 B2 * | 8/2008 | Nichols ................. | G01S 13/867 356/28 |
| 7,467,043 B1 * | 12/2008 | Estupinan ......................... | 702/3 |
| 7,612,688 B1 * | 11/2009 | Vigeant-Langlois .. | G01C 23/00 340/539.28 |
| 8,244,418 B1 * | 8/2012 | Frank ..................... | G01C 23/00 701/14 |
| 8,295,989 B2 * | 10/2012 | Rettger et al. ................ | 700/291 |
| 8,781,719 B1 * | 7/2014 | Bernhardt ..................... | 701/120 |
| 8,903,571 B2 * | 12/2014 | Kirk ......................... | G01W 1/04 701/14 |
| 9,014,415 B2 * | 4/2015 | Chen ..................... | G06T 7/0002 382/100 |
| 2010/0160962 A1 * | 6/2010 | Dreyfuss et al. ............. | 606/228 |
| 2010/0198420 A1 * | 8/2010 | Rettger et al. ................ | 700/291 |
| 2010/0204844 A1 * | 8/2010 | Rettger et al. ................ | 700/291 |

(Continued)

OTHER PUBLICATIONS

Arason, I., Bjornsson, H., and Petersen G. N., 2011. Plume-top altitudes during the Eyjafjallajökull 2010 eruption. European Geophysical Union, vol. 13, 2011-7978 (2 pages).

(Continued)

*Primary Examiner* — Thai Phan
(74) *Attorney, Agent, or Firm* — Ballard Spahr LLP

(57) ABSTRACT

Disclosed are methods and systems of rapidly validating accuracy in particle cloud forecast transport and dispersion models. An example method can comprise accessing a forecast model of a volcanic ash cloud. An example method can comprise generating first data based at least on the forecast model. The first data can have at least one fewer spatial dimension than second data associated with the forecast model. An example method can comprise determining accuracy of the forecast model based at least on measurements of at least a portion of the volcanic ash cloud. An example method can comprise refining the forecast model based at least on the determined accuracy, thereby improving a representation of the volcanic ash cloud.

20 Claims, 39 Drawing Sheets

(56) References Cited

U.S. PATENT DOCUMENTS

| | | | |
|---|---|---|---|
| 2012/0033851 A1* | 2/2012 | Chen et al. | 382/100 |
| 2012/0068862 A1* | 3/2012 | Tillotson | 340/963 |
| 2015/0138355 A1* | 5/2015 | Tillotson | B64D 47/08 348/144 |

OTHER PUBLICATIONS

Bailey, J.E., et al., 2010, Integrated satellite observations of the 2006 eruption of Augustine Volcano, chapter 20 of Power, J.A., Coombs, M.L., and Freymueller, J.T., eds., The 2006 eruption of Augustine Volcano, Alaska: U.S. Geological Survey Professional Paper, 1769, 481-506.

Bean, B. R. and Dutton, E. J., 1966. Radio Meteorology. National Bureau of Standards Monograph 92. Government Printing Office, Washington, DC, USA, 435pp.

Bursik, M., 2001. Effect of wind on the rise height of volcanic plumes, Geophys. Res. Lett., 28 (18), 3621-3624, doi:10.1029/2001GL013393 (7 pages).

Bursik, M., et al., 2012. Polynomial Chaos Quadrature Weighted Ensemble modeling of the Eyjafjallajokull plume of Apr. 14-18, 2010. Special Issue of Journal of Geophysical Research: Eyjafjallajökull 2010 Eruption. (18 pages).

Carn, S., et al., 2009. Tracking volcanic sulfur dioxide clouds for aviation hazard mitigation. Natural Hazards, 51 (2), 325-343.

Carn, S., et al., 2007. Sulfur dioxide emissions from Peruvian copper smelters detected by the Ozone Monitoring Instrument. Geophysical Research Letters, 34, doi:10.1029/2006 GL029020 (5 pages).

Casadevall, T.J., 1994. The 1989-1990 eruption of Redoubt Volcano Alaska: impacts on aircraft operations. Journal of Volcanology and Geothermal Research, 62 30. 301-316.

Dacre, H. F., et al., 2012. Evaluating the structure and magnitude of the ash plume during the initial phase of the 2010 Eyjafjallajökull eruption using Lidar observations and Name simulations, J. Geophys. Res., 116, D00UO3, doi:10.1029/2011JD015608.

D'Amours, et al., 2010. Application of the atmospheric Lagrangian particle dispersion model MLDP0 to the 2008 eruptions of Okmok and Kasatochi volcanoes, Journal of Geophysical Research, 115, D00L11, doi:10.1029/2009 JD013602.

Dean, K. G., et al., 2004. Integrated satellite observations of the 2001 eruption of Mt. Cleveland, Alaska. Journal of Volcanology and Geothermal Research. 135. 51-73.

Dehn, J., et al., 2000, Thermal monitoring of north Pacific volcanoes from space, Geology, 28, 755-758.

Drexler, R.R. and Rolph, G.D., 2011. HYSPLIT Hybrid Single-Particle Lagrangian Integrated Trajectory Model access via NOAA ARL READY Website NOAA Air Resources Laboratory, Silver Spring, MD http://ready.arl.noaa.gov/HYSPLIT.php (2 pages).

Eichelberger, J. C., et al., 1995, The 1992 eruptions of Crater Peak Vent, Mount Spurr volcano, Alaska: chronology and summary: in Keith, T. E. C., (ed.), The 1992 eruptions of Crater Peak Vent, Mount Spurr volcano, Alaska, U.S. Geological Survey Bulletin B 2139, p. 1-18.

Ekstrand, A.E., et al., 2012. Height discrepancy for ash plumes generated by 2009 Redoubt eruption. Journal of Volcanology and Geothermal Research, Special Issue on the 2009 Redoubt Eruption. In Press.

Freitas, S. R., et al., 2012. Inclusion of ash and sulfur dioxide emissions from volcanic eruptions in WRF-Chem: Development and some applications. Geoscientific Model Development, In Review (27 pages).

Freitas, S. R., et al., 2011. PREP-CHEM-SRC 1.0: A preprocessor of trace gas and aerosol emission fields for regional and global atmospheric chemistry models. Geoscientific Model Development, 4, 419-433.

Ghoddousi-Fard, R., et al., 2009. A web-based package for ray tracing the neutral atmosphere radiometric path delay, Computers & Geosciences, 35 (6), 1113-1124.

Grell, G., et al., 2005. Fully coupled "online" chemistry within the WRF model. Atmospheric Environment, 37, 6957-6975.

Gudmundsson, M. T., et al., 2010. Eruptions of Eyjafjallajökull Volcano, Iceland. EOS, 91 (21), 190-191.

Hoblitt, R. P., and Schneider, D. J., 2009. Radar observations of the 2009 eruption of Redoubt Volcano, Alaska: Initial deployment of a transportable Doppler radar system for volcano-monitoring. Eos Trans. AGU, 90(52), Fall Meet. Suppl., Abstract V43A-2209.

Krotkov, N.A., et al., 2006. Band Residual Difference algorithm for retrieval of SO2 from the Aura Ozone Monitoring Instrument OMI. IEEE Transactions in Geoscience Remote Sensing, AURA Special Issue, 44 5, 1259-1266, doi:10.1109/TGRS.2005.861932.

Lopez, T., et al., 2012. Evaluation of Redoubt Volcano's sulfur dioxide emissions by the Ozone Monitoring Instrument Journal of Volcanology and Geothermal Research, Special Issue on the 2009 Redoubt Eruption. In review.

Marzano, F.S., et al., 2010, Model-based weather radar remote sensing of explosive volcanic ash eruption: IEEE Transactions on Geoscience and Remote Sensing, v. 48, n. 10, p. 3591-3607, doi:10.1109/TGRS.2010.2047862.

Mastin, L. G., 2007, A user-friendly one-dimensional model for wet volcanic plumes, G3, Geochemistry, Geophysics, Geosystems, 8, (3) 24pp.

Mastin, L.G., et al., (2009). A multidisciplinary effort to assign realistic source parameters to model of volcanic ash-cloud transport and dispersion during eruptions. Journal of Volcanology and Geothermal Research: Special Issue on Volcanic Ash Clouds, eds. Larry Mastin and Peter Webley. 186 (1-2), 10-21.doi: 10.1016/j.jvolgeores. 2009/01.008.

Pavolonis, M., and Sieglaff, M., 2009. GOES-R Advanced Baseline Imager (ABI) Algorithm Theoretical Basis Document for Volcanic Ash (Detection and Height). NOAA CSTAR Tech. Doc: Ver. 2.0. Jun. 30, 2009. 56 pp.

Peterson, R., et al., 2012. Volcanic Ash Cloud Dispersion Models. Chapter 7 in Volcanoes of the North Pacific: Observations from Space. In Press.

Prata, A. J. and Grant, I. F., 2001. Determination of mass loadings and plume heights of volcanic ash clouds from satellite data. CSIRO Atmospheric Research Technical Paper, 48. 41 pp.

Prata, A. J., 1989. Infrared radiative transfer calculations for volcanic ash clouds, Geophysical Research Letters, 16, 1293-1296.

Prata, A.J. 1989. Observations of volcanic ash clouds in the 10-12 μm window using AVHRR/2 data, International Journal of Remote Sensing, 10, 751-761.

Rose, W. I., et al., 1995, Real-time C-band radar observations of 1992 eruption clouds from Crater Peak, Mount Spurr Volcano, Alaska: in Keith, T. E. C., (ed.), The 1992 eruptions of Crater Peak vent, Mount Spurr Volcano, Alaska, U.S. Geological Survey Bulletin B 2139, p. 19-26.

Rybin, A. et al., 2011.The Jun. 2009 eruption of Sarychev Peak volcano, Matua Island, Central Kuriles. Bulletin of Volcanology, 73 9, 1377-1392. DOI: 10.1007/s00445-011-0481-0.

Schaefer, J., 2012. The 2009 Eruption of Redoubt Volcano, Alaska. Editor: Schaefer, J., Contributing Authors: Bull, K., Cameron, C., Coombs, M., Diefenbach, A., Lopez, T., McNutt, S., Neal, C., Payne, A., Power, J., Schneider, D., Scott, W., Snedigar, S., Thompson, G., Wallace, K., Waythomas, C., Webley, P.W., and Werner, C., ADDGS Circular, In Press, 74 pp.

Schumann, U., et al., Airborne observations of the Eyjafjalla volcano ash cloud over Europe during air space closure in Apr. and May 2010, Atmos. Chem. Phys., 11, 2245-2279, doi:10.5194/acp-11-2245-2011 (35 pages).

Searcy, C., et al., 1998. Puff: A volcanic ash tracking and prediction model, Journal of Volcanology and. Geothermal Research, vol. 80, 1-16.

Sparks, R.S.J., et al., 1997. Volcanic Plumes. Chichester: Wiley, 589 pp.

Steensen, T, et al., 2012. Plume characteristics during the 2009 Mount Redoubt Eruption: A comparison between satellite data and dispersion models. Journal of Volcanology and Geothermal Research, Special Issue on the 2009 Redoubt Eruption. In review.

Steensen, T., et al., 2011. Sensitivity Analysis of Input Parameters for Near-Real-Time Monitoring of Volcanic Ash Emissions—A

(56) References Cited

OTHER PUBLICATIONS

Satellite and Model-Based Approach. Presented at 2011 Fall Meeting, AGU, San Francisco, Calif., Dec. 5-9.

Stohl, A., et al., 2011. Determination of time- and height-resolved volcanic ash emissions and their use for quantitative ash dispersion modeling: the 2010 Eyjafjallajökull eruption, Atmos. Chem. Phys., 11, doi:10.5194/acp-11-4333-2011 (19 pages).

Unige, 2010. Ash Dispersal Forecast and Civil Aviation Workshop—Consensual Document, Geneva, Switzerland, Oct. 19-20, 2010 http://www.unige.ch/sciences/terre/mineral/CERG/Workshop/results/ADFCAW2010-cons-doc.pdf, (26 pages).

Waythomas, C.F., et al., 2010. The Aug. 7-8, 2008 eruption of Kasatochi Volcano, central Aleutian Islands, Alaska, Journal of Geophysical Research, 115, B00B06, doi:10.1029/2010 JB007437.

Webley, P.W. and Mastin, L. G., 2009. Improved Prediction and tracking of Volcanic Ash clouds. Journal of Volcanology and Geothermal Research: Special Issue on Volcanic Ash Clouds, eds. Larry Mastin and Peter Webley. 186 (1-2), 1-9.doi:10.1016/j.jvolgeores. 2008.10.022 (10 pages).

Webley, P.W., et al., 2010. Volcanic-ash dispersion modeling of the 2006 eruption of Augustine Volcano Using the Puff Model, chapter 21 of Power, J.A., Coombs, M.L., and Freymueller, J.T., eds., The 2006 eruption of Augustine Volcano, Alaska: USGS Professional Paper 1769, 507-526.

Webley, P.W., et al., 2009. Near Real Time Volcanic Ash Cloud Detection: Experiences from the Alaska Volcano Observatory. Journal of Volcanology and Geothermal Research: SI on Volcanic Ash Clouds, eds. Larry Mastin and Peter Webley, 186 1-2, 79-90.

Wen, S. M., and Rose, W. I., 1994. Retrieval of sizes and total masses of particles in volcanic clouds using AVHRR bands 4 and 5, Journal of Geophysical Research-Atmospheres, 99 D3, 5421-5431.

Wood, J., Scott, C., and Schneider, D., 2007, WSR-88D radar observations of volcanic ash: Fourth International Workshop on Volcanic Ash, World Meteorological Organization (WMO) in close collaboration with the International Civil Aviation Organization (ICAO) and the Civil Aviation Authority of New Zealand, Rotorua, New Zealand, Mar. 26-20, 2007 9 p., http://www.caa.govt.nz/Volcanic_Ash_Workshop/Papers/VAWS4WP0403.pdf.

Wooster, M. J., et al., 2005. Enhancing Volcanic Hazard Avoidance Capacity in Central America through Local Remote Sensing and Improved Risk Communication (EVHAC). DfID EngKaR Technical Report: R8181. Nov. 2005. (226 pages).

\* cited by examiner

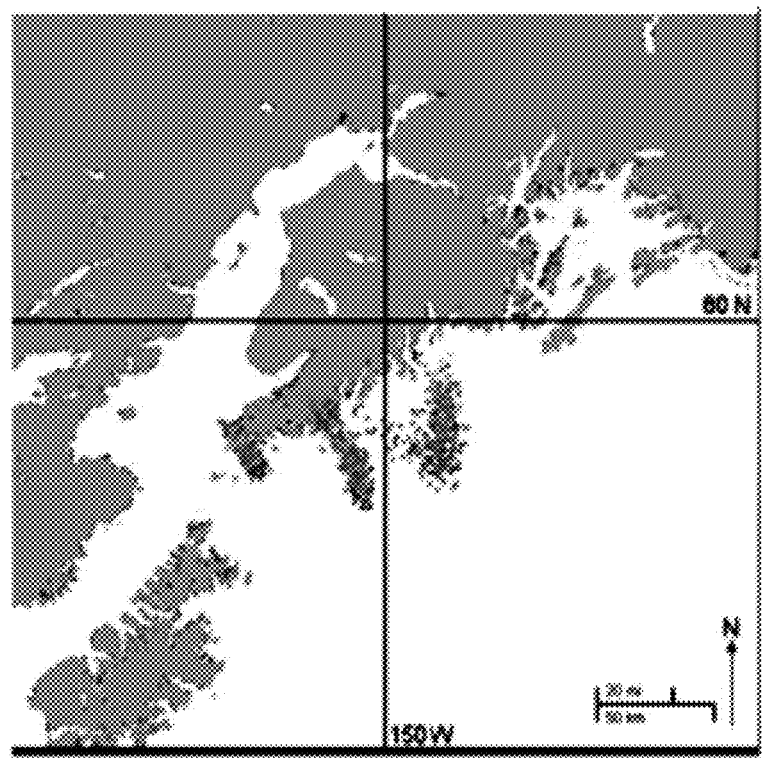
FIG. 3A
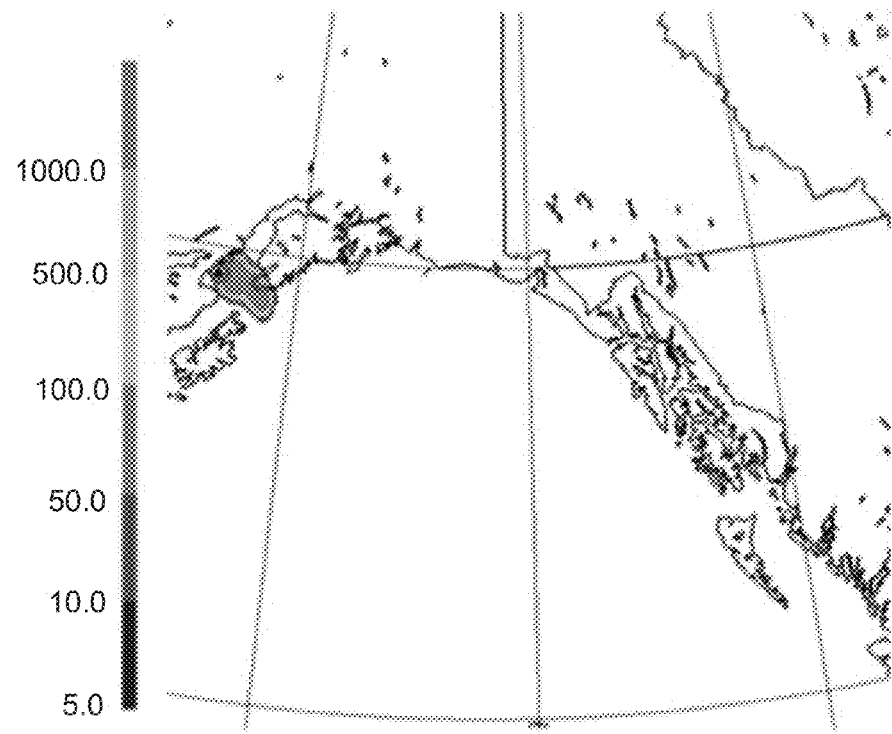
FIG. 3B

FIG. 4

| | ASH3D | ATHAM | FALL3D | FLEXPART | HYSPLIT | MLDP0 | MOCAGE | NAME | PUFF | TEPHRA2 | VOL-CALPUFF |
|---|---|---|---|---|---|---|---|---|---|---|---|
| Operational | | | | | | | | | | | |
| Approach (1) | E/H | E | E | L | H | L | E | L | L | E | H |
| Method (2) | N | N | N | N | N | N | N | N | N | A | S |
| Coverage (3) | LRG | L | LR | LRG | LRG | LRG | G | LRG | LRG | L | LR |
| Topography | | | | | | | | | | | |
| H wind advection | | | | | | | | | | | |
| V wind advection | | | | | | | | | | | |
| H atm. diffusion | | | | | | | | | | | |
| V atm. diffusion | | | | | | | | | | | |
| Particle sed. | | | | | | | | | | | |
| Other dry dep. | | | | | | | | | | | |
| Wet deposition | | | | | | | | | | | |
| Dry part. aggr. | | | | | | | | | | | |
| Wet part. aggr. | | | | | | | | | | | |
| Particle shape | | | | | | | | | | | |
| Gas species | | | | | | | | | | | |
| Chemical processes | | | | | | | | | | | |
| Variable size class | | | | | | | | | | | |
| Variable GS distr. | | | | | | | | | | | |
| Variable size limits | | | | | | | | | | | |
| Mass distribution (4) | LN | O | ALL | PS/L/U/P /O | PS/L/U/P P/LN | PS/L/U/P /O | PS/L | PS/L/O | PS/L/U/P | PS/L/U/LN | PS/BP |

(1) L=Lagrangian, E=Eulerian, H=Hybrid
(2) A=Analytical, S=Semi-analytical, N=Numerical
(3) L=Local, R=Regional, G=Global
(4) PS=Point Source, L=Linear, U=Umbrella-type, P=Poisson, LN=Log-normal, BP=Buoyant Plume, O=Other (see Appendix).

HYSPLIT 4.3E+03 Maximum at square
1.1E+02 Minimum 1.0E+06   1.0E+02
   1.0E+04   1.0E+00

PUFF

CaNERM

HYSPLIT 1.0E+03   1.0E+01   2.0E+02 Maximum at square
   1.0E+02   1.0E+00   6.0E-23 Minimum

PUFF

CaNERM (A) BTD Image, (B) PUFF Ash Heights and (C) Comparison of BTD to PUFF

Cross section through
Three dimensional model
Showing satellite viewing angle
And volcanic ash concentrations

VALIDATING AND CALIBRATING A FORECAST MODEL

CROSS REFERENCE TO RELATED PATENT APPLICATION

This application claims priority to U.S. Provisional Application No. 61/762,680 filed Feb. 8, 2013, herein incorporated by reference in its entirety.

STATEMENT REGARDING FEDERALLY SPONSORED RESEARCH

This invention was made with government support under government contract FA865012M2223 issued on Nov. 17, 2011 awarded by the United States Air Force Research Laboratory. The government has certain rights in the invention.

SUMMARY

It is to be understood that both the following general description and the following detailed description are exemplary and explanatory only, and are not restrictive, as claimed. Provided are methods and systems for validating and improving forecast accuracy for airborne particle clouds.

An example method can comprise accessing a forecast model of a volcanic ash cloud. An example method can comprise receiving (e.g., generating) first data based at least on the forecast model. The first data can have at least one fewer spatial dimension than second data associated with the forecast model. An example method can comprise determining accuracy of the forecast model based at least on measurements of at least a portion of the volcanic ash cloud. An example method can comprise refining the forecast model based at least on the determined accuracy, thereby improving a representation of the volcanic ash cloud.

In another aspect, an example method can comprise accessing a three dimensional forecast model comprising a representation a particle cloud. An example method can comprise generating a two dimensional synthetic image of the three dimensional forecast model based on a time parameter. An example method can comprise receiving measurements of the particle cloud. The measurements can be associated with a time indicated by the time parameter. An example method can comprise determining a difference between the representation of the particle cloud and the particle cloud based on the measurements and the two dimensional synthetic image. An example method can comprise adjusting the three dimensional forecast model based on the difference between the representation of the particle cloud and the particle cloud.

In another aspect, an example system can comprise a memory having computer-executable instructions encoded thereon. An example system can comprise at least one processor functionally coupled to the memory and configured, by the computer-executable instructions, for, accessing a forecast model of a volcanic ash cloud; generating first data based at least on the forecast model; determining accuracy of the forecast model based at least on measurements of at least a portion of the volcanic ash cloud; and refining the forecast model based at least on the determined accuracy, thereby improving a representation of the volcanic ash cloud. In one aspect, the first data can have at least one fewer spatial dimension than second data associated with the forecast model Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3A shows an example PUFF model;

FIG. 3B shows an example CaNERM model;

FIG. 4 shows comparisons of various models;

DETAILED DESCRIPTION

Figure 1:
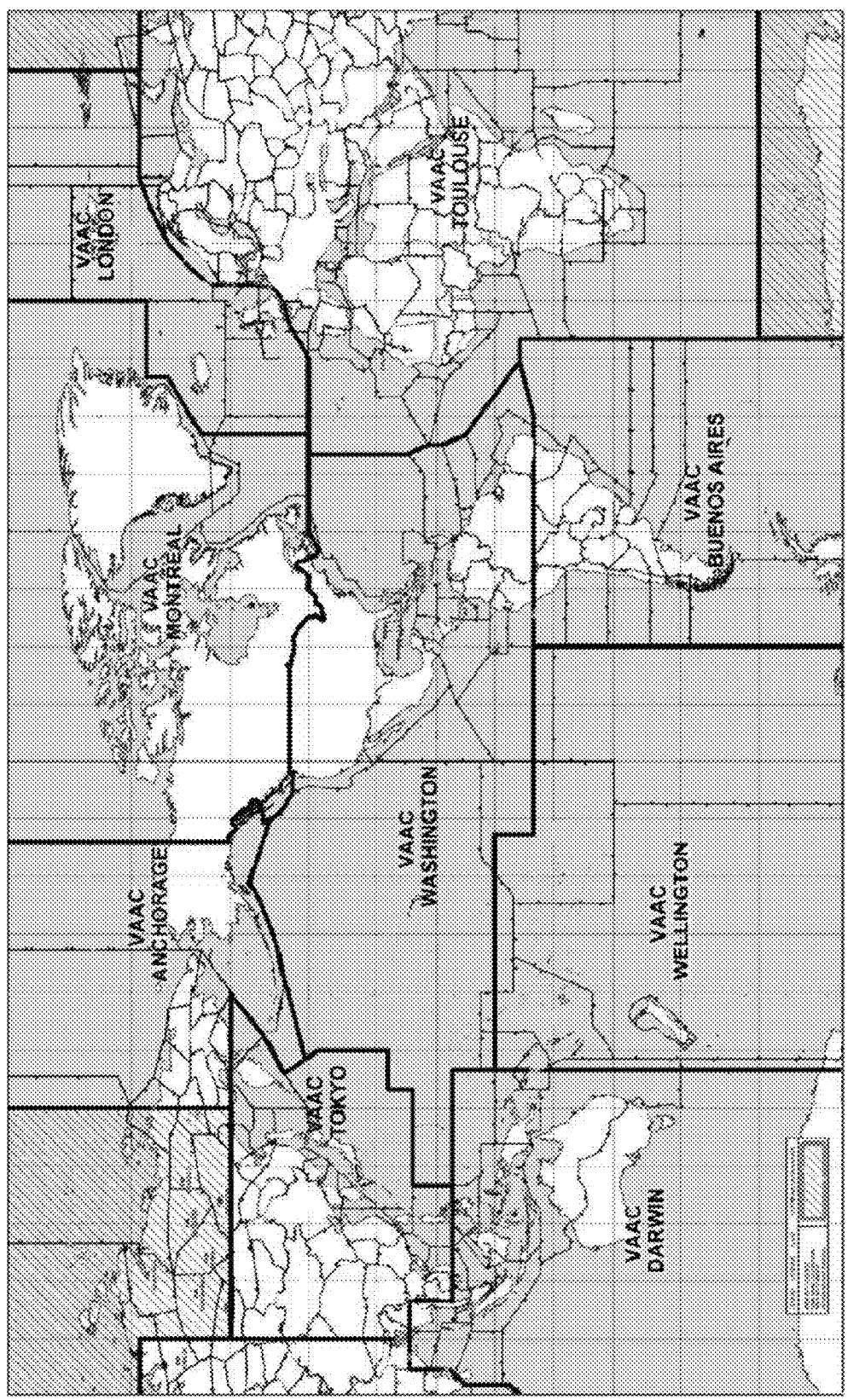
FIG. 1 illustrates a map of the Volcanic Ash Advisory Centers (VAAC) areas of responsibility.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Airborne particle clouds can be a risk to flight safety, commerce, and human health. After an eruption, volcanic ash may remain aloft for weeks and may circle the planet numerous times, depending upon the size and concentrations of the ash, and the heights to which it is lofted. If jet engines ingest airborne ash the engine may flame out, losing power, and thus, airborne ash is a risk to aviation. The effects of airborne volcanic ash clouds upon aviation are of concern to national governments and political concerns, as well as meteorologists, and volcanologists. This was illustrated in the 2010 Icelandic volcano eruption whose dispersing ash drifted over Europe, and the effect was the cancellation of over 100,000 flights during the two weeks in which European airspace was closed. This closure came at an economic cost that has been estimated at $5 billion.

The ability to forecast the paths of particle clouds has an unambiguous economic value, and though there are at least twelve different volcanic ash forecast transport and dispersion (VAFTD) models in operation around the world, the models are typically varied and immature. The accuracy of the models is affected by the complexity of modeling airborne ash, the models integration with weather forecast models, and the scarcity of data to refine the models. The lack of data is compounded by the relative infrequency of volcanic eruptions, the fact that eruptions can occur in remote locations, and the unique characteristics of each eruption because of the chemistry of the ash and the water content. Modeling the transport and dispersion of eruption plumes and clouds is complicated by the effect of ash size and concentration and the way in which ash stratifies and at different altitudes with in the cloud. Reducing the time and cost of validating the accuracy of the models would improve flight safety and reduce economic costs and health concerns.

The volcanic eruption hazards are both terrestrial and airborne. Flows of lava, rock, ash, and mud mixed with water from snow melt can travel very quickly over the ground. The airborne hazards can comprise plumes of ash and steam. These hazards are usually mixed with a variety of chemically laden gases such as sulfur dioxide.

These airborne plumes and clouds can pose a variety of threats to aircraft. The lofted ash can be a mixture of silica-rich glass, which can melt inside aircraft jet turbine engines and cause engine flame outs. There have been instances where aircraft have lost all engine power, causing them to lose altitude before the engines could be restarted. Further, flying through the coarse ash can pit and score an aircraft's exterior. The corrosive volcanic gases can also form sulfuric acid that can short out the aircraft's electronics and interfere with its hydraulics. Pilots may not always be aware that they have entered an ash cloud because the cloud can be difficult to see. Often pilots have difficulty seeing the ultra-fine airborne ash or distinguishing the ash, which may look like a harmless layer of clouds or pollution particulates and aerosols. Additionally, this is even more hazardous in nighttime flights.

There can be an immediate risk to aviation wherever there are active volcanoes, especially if those volcanoes are prone to explosive eruptions because of their silica content and chemistry. These volcanoes may disperse ash clouds along the aviation routes that connect North America with Europe and Asia. The 2010 eruption of Eyjafjallajökull, which was a relatively modest eruption, caused the cancellation of 107,000 flights in the European and trans-Atlantic airspace. The eruption's economic consequences amounted to $2 billion in aviation business losses and an additional $3 billion in dependent commercial losses.

Once a volcano erupts, volcanologists can begin collecting data to forecast the movement of the ash cloud in conjunction with weather forecast data. These VAFTD models can be developed to predict the movement and structure of volcanic clouds. VAFTD models can provide detailed information such as vertical dimensions of the ash cloud, spatial extent of ash particles of different sizes, and the distribution of different chemical species. Some VAFTD models can be used to forecast the amount and rate of ash fallout beneath an ash cloud.

There are over a dozen different VAFTD models in use around the world. Each of these VAFTD models has different strengths and weaknesses, such as how quickly they generate a forecast. Also, each Volcanic Ash Advisory Center (VAAC) has its own preferred model used in its operations, largely because the VAAC may have played a role in the model's independent development.

Timely ash cloud detection, location, and forecasting of the ash cloud's movement can impact aviation safety. It can be useful to know where the ash cloud will be moving, but also the height of the cloud, and the concentration of ash at various altitudes within the cloud. With notice of an eruption, the VAFTD model can then be used to determine if the volcanic ash cloud poses a risk to aviation. This form of situational awareness has not historically been available to aviators.

The information on volcanic ash location to aviation can be issued in the form of a volcanic ash advisory (VAA). Groups such as the National Weather Service (NWS) and the Federal Aviation Agency (FAA) in the USA can be in contact during an eruption and are responsible for releasing and distributing the VAA. These groups can issue other reports such as volcanic ash graphics (VAG), significant meteorological information (SIGMETS) advisories, and the notice to airmen (NOTAM). Coordinated by the International Civil Aviation Organization (ICAO), these notices can be used by individual air carriers to alert their pilots of an ash cloud. Some national governments can choose to close air space over entire regions and countries.

VAACs, who issue the VAA, were set up by ICAO and nine exist around the world, namely, the Anchorage, Washington D.C., Montreal, London, Tokyo, Toulouse, Buenos Aires, Wellington, and Darwin VAACs. FIG. 1 shows the nine VAACs and the portion of the world and airspace each VAAC is responsible for reporting on volcanic ash.

The first line of situational awareness during a volcanic eruption can comprise a network of real-time sensors, such as global positioning system (GPS) receivers and tilt meters that monitor the inflation and deflation of a volcano's crater and flanks Seismic monitors can detect the movement of magma beneath the volcano. Web cameras can watch for small puffs of steam. Minor earthquakes and steam releases can provide clues of imminent volcanic activity.

These networks do not exist for all volcanoes. There are over 100 active volcanoes just in Alaska, yet only those most accessible and closest to towns and villages are monitored from ground instruments. The eruptive activity of remote volcanoes, like Mt Cleveland may only be detected by a satellite. Satellite data can now routinely be collected across the North Pacific and North Atlantic using geosynchronous and polar-orbiting satellites. These satellites can use thermal infrared (TIR) sensors to detect eruptions and ash clouds.

Figure 2A:
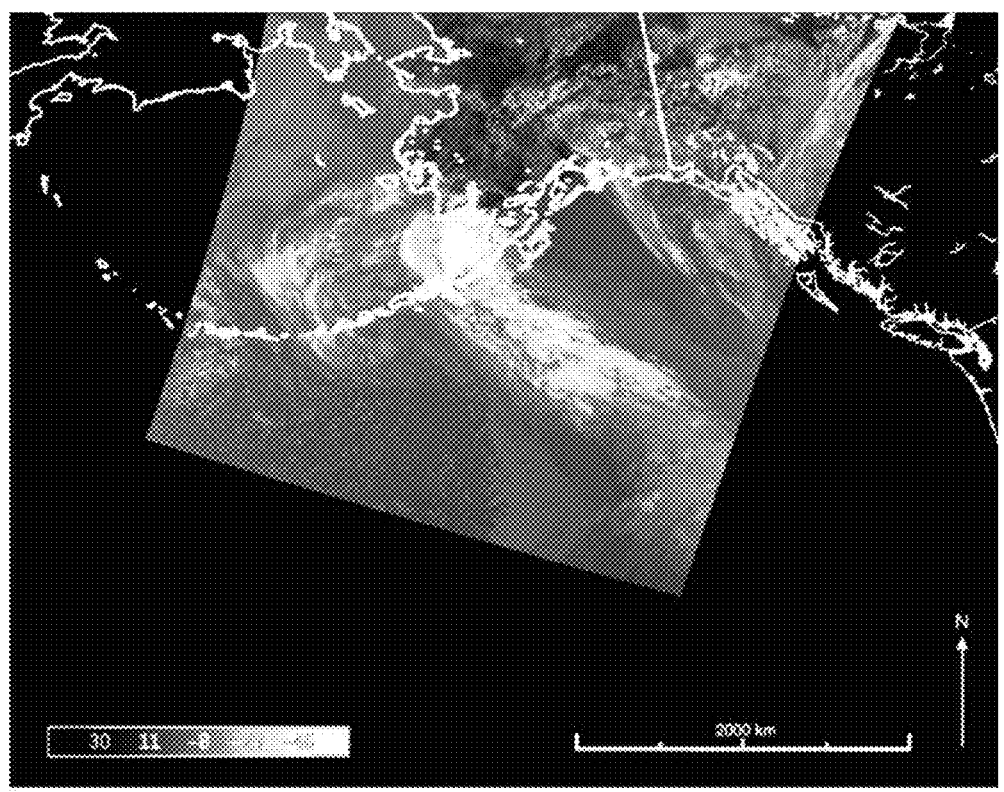
FIG. 2A illustrates images from a polar satellite.
Figure 2B:
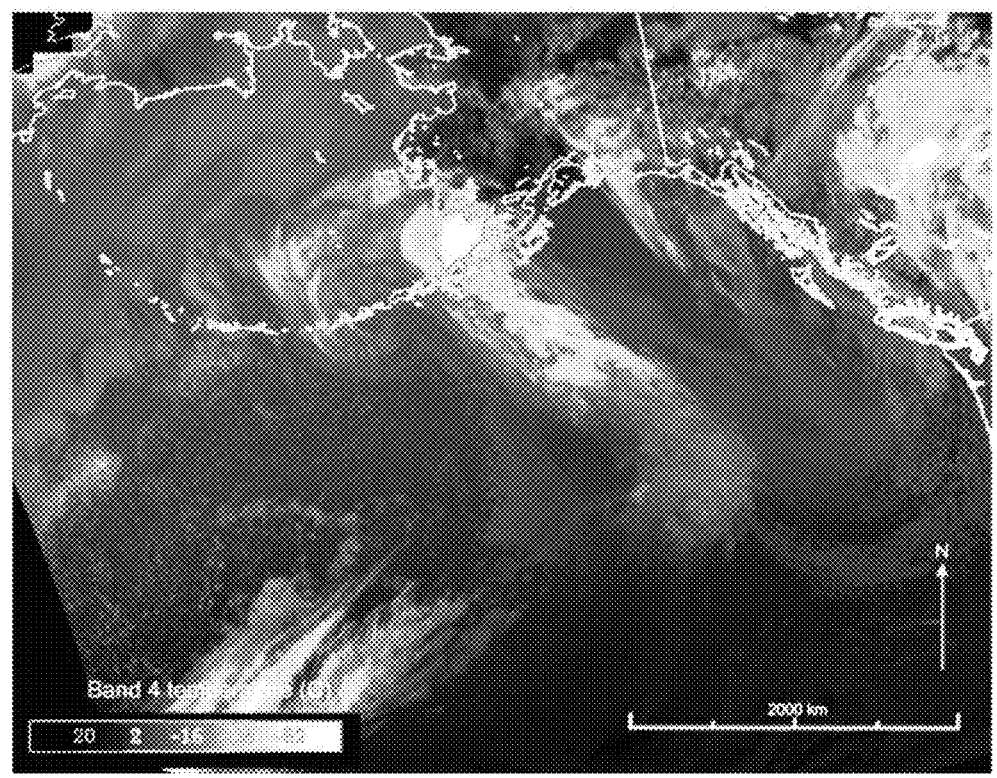
FIG. 2B illustrates images from a geostationary satellite.

In a geostationary orbit, the satellite's orbit 35,790 km above the equator follows precisely the rotation of the earth, thus there can be one orbit in twenty-four hours. In such an orbit, the satellite can stay at a fixed location relative to the Earth and hence is able to continuously image the same geographic area. See FIG. 2B which shows a thermal infrared (TIR) image from a geostationary orbit. The Geostationary Operational Environmental Satellite (GOES), for example, can collect an image every fifteen to thirty minutes, twenty four hours a day. Thus, the geostationary satellites can provide the "big-picture" view of the earth that can be ideal for monitoring weather, hurricanes, and storms.

In polar orbit, a satellite can travel from pole to pole, completing the satellite's low-earth orbit in about ninety minutes at an altitude of 700-800 km. During this time, the Earth turns beneath the orbiting satellite and the imagery collected can be part of an image swath that is later segmented into individual images See FIG. 2A which shows a TIR image from a polar orbit. This particular orbit can permit a higher resolution imaging because its altitude is less than the geostationary high-earth orbit. Due to the rotation of the earth beneath the satellite, there can be a repeat cycle where the same portion of the planet can be imaged many times in a day, but, in some cases, not as frequently as a geosynchronous satellite.

There can be several satellite sensors in orbit to collect TIR data. The GOES weather satellite mentioned earlier can have a TIR sensor called GOES imager. The Moderate Resolution Infrared Spectroradiometer (MODIS) sensor can be onboard the National Aeronautical and Space Administration (NASA) Aqua and Terra satellites. TIR data can be collected from the National Oceanic and Atmospheric Administration (NOAA) Advanced Very High Resolution Radiometer (AVHRR) sensor. The Terra satellite can have two additional sensors such as the Advanced Spaceborne Thermal Emission and Reflection Radiometer (ASTER) and the Multi-angle Imaging SpectroRadiometer (MISR). The Aqua satellite can also have the Atmospheric Infrared Sounder (AIRS). GOES can be used to monitor weather and can be managed by the NOAA. The Terra and Aqua satellites can be used for earth observation and mapping and are managed by the National Aeronautics and Space Administration (NASA). Additionally, the NOAA/NASA Suomi National Polar-orbiting Operational Environmental Satellite System (NPOESS) Preparatory Project (NPP) sensor can be used to collect TIR data in a polar orbit.

There are international satellites whose TIR sensors that can also be used to monitor volcanic activity. The Japanese Aerospace Exploration Agency (JAXA) operates the Multifunctional Transport Satellite (MTSAT) managed by the Japanese Meteorological Agency (JMA). The European Space Agency (ESA) and European Organisation for the Exploitation of Meteorological Satellites (EUMETSAT) operates a variety of weather and earth observing satellites, and the ESA's Spinning Enhanced Visible and Infrared Imager (SEVERI) sensor can be useful for thermal infrared imaging and monitoring volcanism.

The respective altitudes and orbits of all satellites affect the imagery collected by the satellite. A geostationary satellite can be designed to continuously keep half the globe in the satellite's view and persistently monitor the weather. In this geostationary position, the image pixels cover smaller geographic areas beneath the satellite over the equator, but the pixels represent larger geographic areas as you move away from the image center, i.e. towards the poles. Thus in the thermal infrared bands, the image resolution at the equator can be approximately 1 km but at the poles, a pixel can measure up to 8 km per side (Table 1). The same effect can be true for satellites in their lower orbits, where the geographic area covered by each image pixel can be smallest immediately beneath the sensor on the satellite, the point known as the image's nadir.

TABLE 1

Satellite Sensors that can be used for TIR Imaging, both past and present.

| Sensor | Agency | Orbit | Location | Channels | Temporal | Spatial |
|---|---|---|---|---|---|---|
| AVHRR | NOAA | Polar | Global | 5 VIS-IR | 1-6 hrs | 1 × 1 km |
| MODIS | NASA | Polar | Global | 36 VIS-IR | 2 × Daily | 1 × 1 km |
| GOES | NOAA | Geo | US | 5 VIS-IR | 25 min | TIR: 4-8 km |
| MTSAT | JMA | Geo | Pacific | 5 VIS-IR | 30 minutes | TIR: 4 km |
| AIRS | NASA | Polar | Global | 2378 IR | 2 × Daily | 13 × 24 km |
| SEVIRI | EUMETSAT | Geo | Europe | 12 VIS - IR | 15 mins | 3 × 3 km |
| GMS | JMA | Geo | Pacific | 4 VIS - IR | 30 mins | TIR: 5 km |
| NPP | NOAA/NASA | Polar | Global | 21 VIS - IR | 1 × Daily | TIR: 750 m |
| ASTER | NASA | Polar | Global | 14 VIS - IR | 16 days | TIR: 90 m |

As the table illustrates, the orbit of the satellite can affect the imaging resolution with the polar-orbiting platforms having higher resolutions. The drawback of these polar-orbiting satellites is that the geostationary satellites can provide more persistent observations with repeat imaging every fifteen to thirty minutes, with the same half of the earth in its view. The polar-orbiting satellites can image nearly the entire planet, at a relatively higher resolution, but the polar-orbiting satellites repeat observation of a specific volcano can be only every two weeks in some instances, depending on the satellite's orbital parameters and resolution.

Models can be used to forecast Volcanic Ash Forecast Transport and Dispersion (VAFTD). With weather forecasting, access to daily and hourly measurements and datasets can be available. However, there are very few comparable sets of ash data. In-situ weather measurements can be used, even with extreme events such as hurricanes, but there are no standardized methods or technology for in-situ sampling of actively erupting volcanic ash.

Ash Cloud Forecasting can be particularly useful in making forecasts. VAFTD models can forecast the movement and future location of a volcanic ash cloud. Many different dispersion models are used around the world. Some of dispersion models are used in research while others are used at specific VAACs or volcano observatories (VO). The table below describes many of the VAFTD models as well as the respective mathematics, used by each organization that developed the model, and the VAAC/VO where the model is used.

TABLE 2

Volcanic Ash Forecast Transport and Dispersion Models in Use.

| Model | Math | Developer | VAAC/VO |
|---|---|---|---|
| WRF-Chem | Eulerian | NOAA ESRL and CPTEC, Brazil | — |
| PUFF | Lagrangian | UAF-GI/AVO/NWS | AVO |
| FLEXPART | Lagrangian | Norwegian Inst. for Air Research (NILU) | — |
| HYSPLIT | Hybrid | NOAA | Washington Anchorage |
| ASH3D | Eulerian | USGS | AVO/CVO |
| ATHAM | Eulerian | Cambridge University, UK | — |
| FALL3D | Eulerian | Instituto Nazionale di Geofisica e Volcanologia (INGV), Naples Italy | INGV Buenos Aires |
| JMA | Lagrangian | Tokyo VAAC | Tokyo |
| MLDP0 | Lagrangian | Canadian Meteorological Centre | Montreal |
| MOCAGE | Eulerian | Meteo-France | Toulouse |
| NAME | Lagrangian | UK Meteorological Office | London |
| TEPHRA2 | Eulerian | University of South Florida | INGV Catania |
| VOL-CALPUFF | Hybrid | INGV, Catania | — |

In the United States, the common VAFTD models can comprise the Hybrid Single Particle Integrated Trajectory (HYSPLIT) model and the PUFF model. PUFF can be used as an operational tool for volcanic ash cloud tracking by, for example, AVO, the Air Force Weather Agency (AFWA), National Weather Service (NWS), and the Anchorage and Washington D.C. VAACs. In an aspect, the FAA, the National Centers for Environmental Prediction (NCEP), NWS, and the Washington VAAC can use, for example, HYSPLIT as an ash-tracking tool.

In Canada, for example, the Modèle Lagrangien de Dispersion de Particules d'Ordre 0 (MLDP0) is a VAFTD model that can be used by the Canadian Meteorological Centre (CMC) and the Montreal VAAC. In France at the Toulouse VAAC, the Modèle de Chimie Atmosphérique à Grande Echelle (MOCAGE) model can be used. In London, a VAFTD model in use is the Numerical Atmospheric-dispersion Modelling Environment (NAME). At the Tokyo VAAC, the Japan Meteorological Agency (JMA) developed its model. See FIG. 4 for table on comparing models.

Figure 3C:
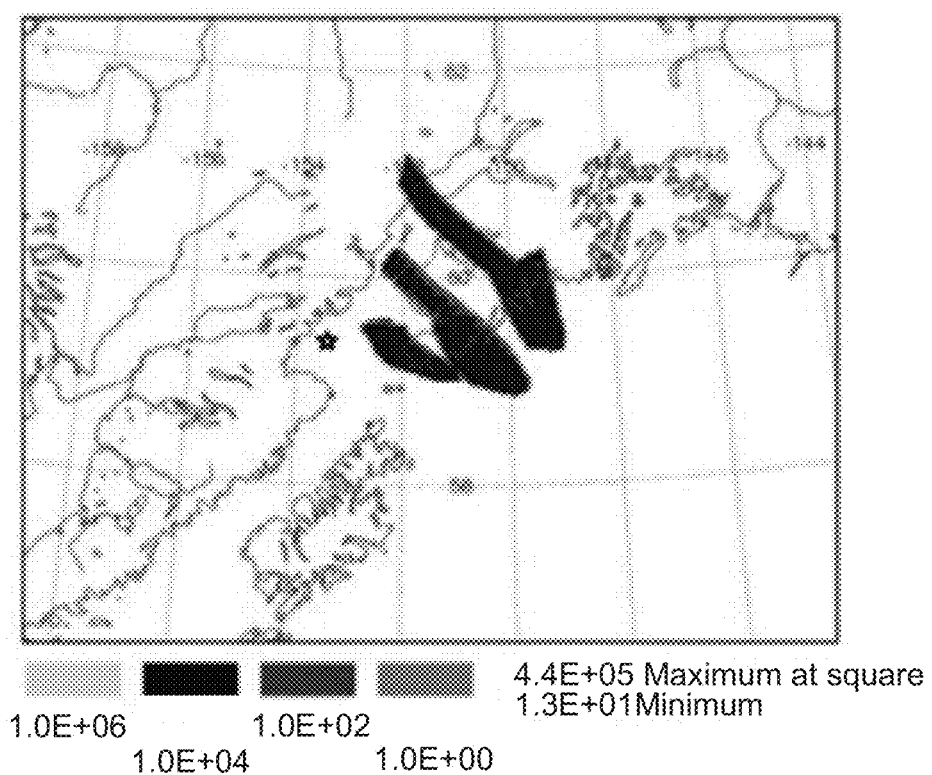
FIG. 3C shows an example HYSPLIT model.

There are at least two forms of VATFD models. These models can be distinguished by the mathematical operations used to model the ash data through space and time. A first group of models can be Lagrangian because these models use particle physics and vector math. A second form of model can be Eulerian because this form can comprise a three-dimensional grid, or voxel (volumetric pixel) for Cartesian mathematical modeling. FIG. 3 shows various VAFTD models for the Mt Augustine eruption. FIG. 3A is a PUFF model, FIG. 3B shows an example CaNERM (predecessor to MLDP0) model, and FIG. 3C shows an example HYSPLIT model.

Many factors can affect VAFTD model accuracy. In one aspect, factors can comprise the eruption source parameters described earlier. Other factors can comprise the weather model that operates in conjunction with most of the VAFTD models and the presence of airborne water that may cause the ash to aggregate and fall out quickly from the ash cloud. FIG. 4 lists some of these parameters and whether the models take these additional forecast variables into account.

Figures 5A, 5B, 5C:
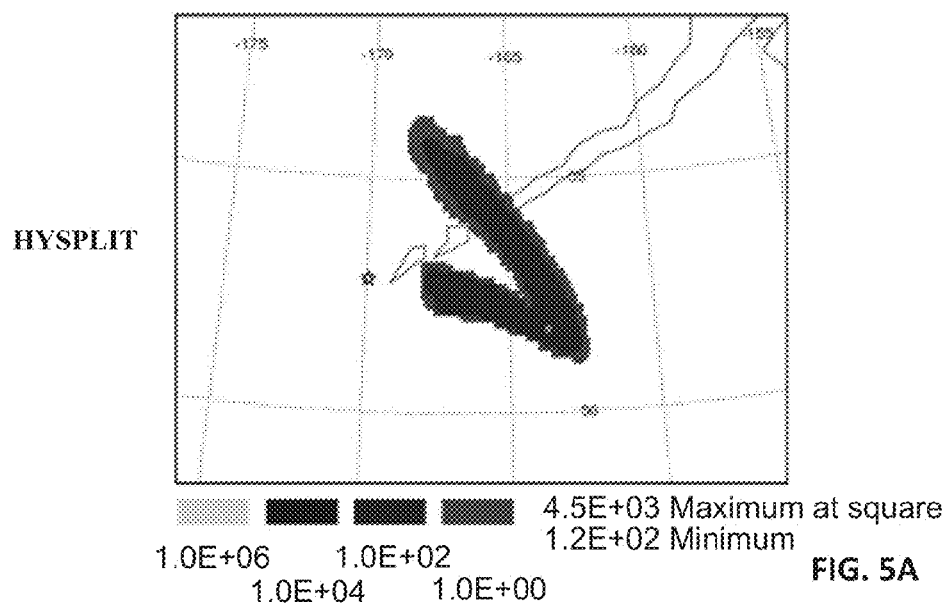
FIG. 5A shows a HYSPLIT model at a first time.
FIG. 5B shows a PUFF model at a first time.
FIG. 5C shows a CaNERM model at a first time.
Figure 5D:
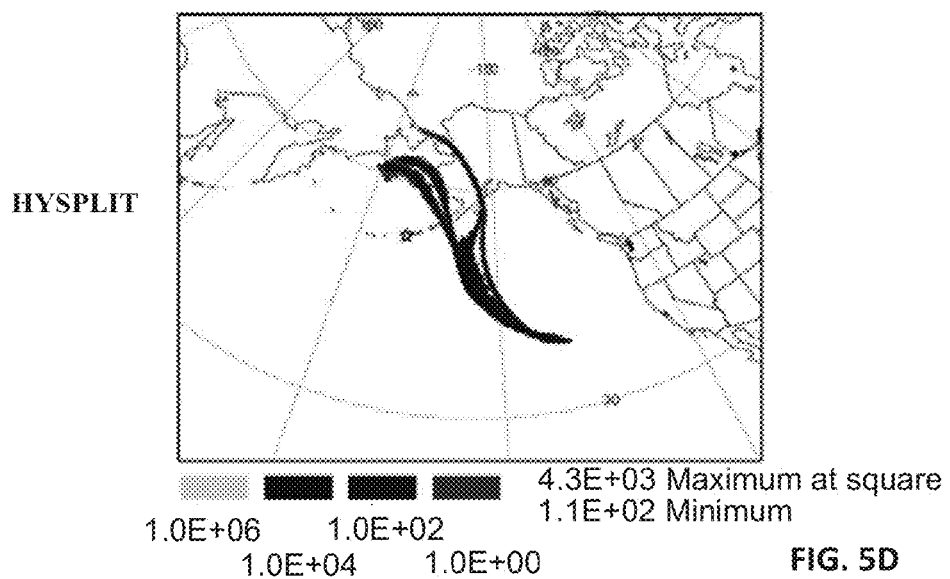
FIG. 5D shows a HYSPLIT model at a second time.
Figure 5E:
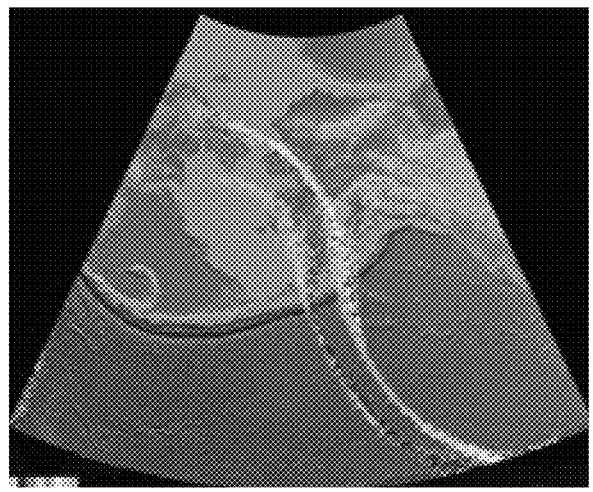
FIG. 5E shows a PUFF model at a second time.
Figure 5F:
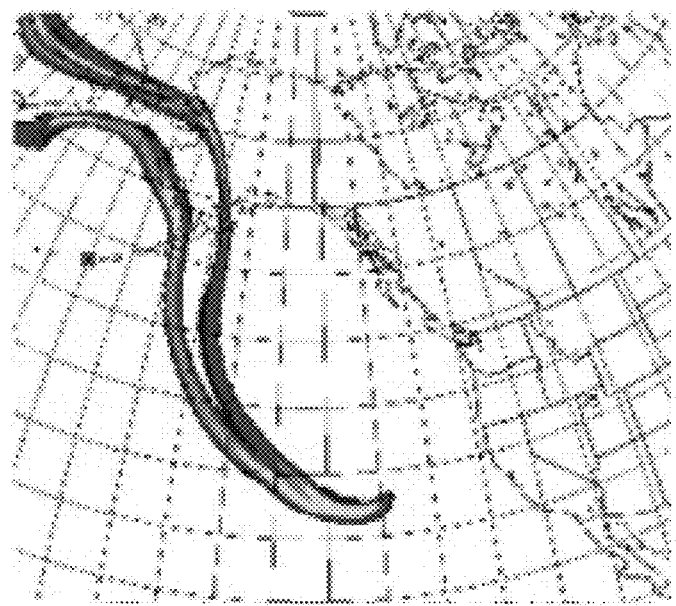
FIG. 5F shows a CaNERM model at a second time.
Figure 5G:
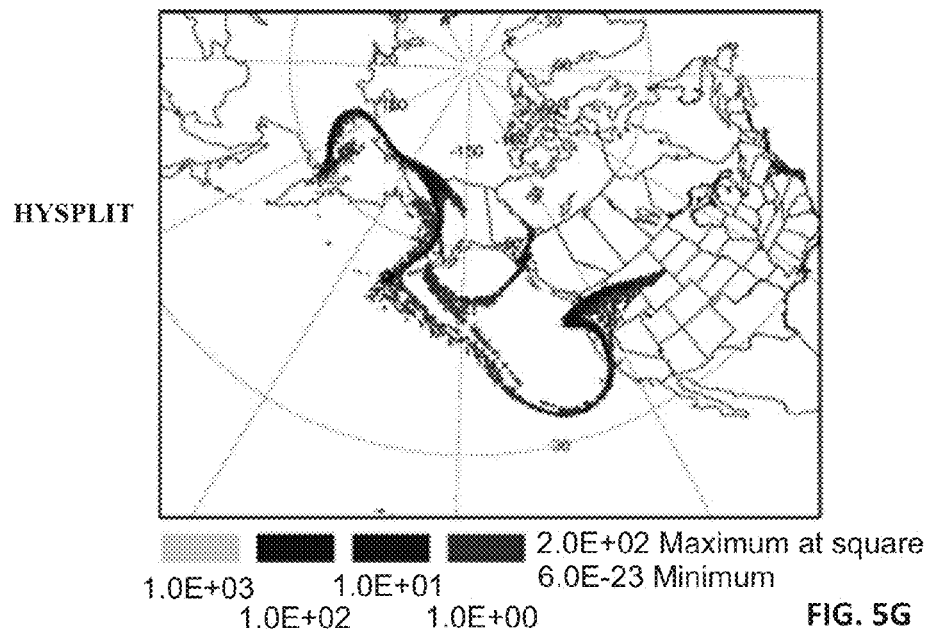
FIG. 5G shows a HYSPLIT model at a third time.
Figure 5H:
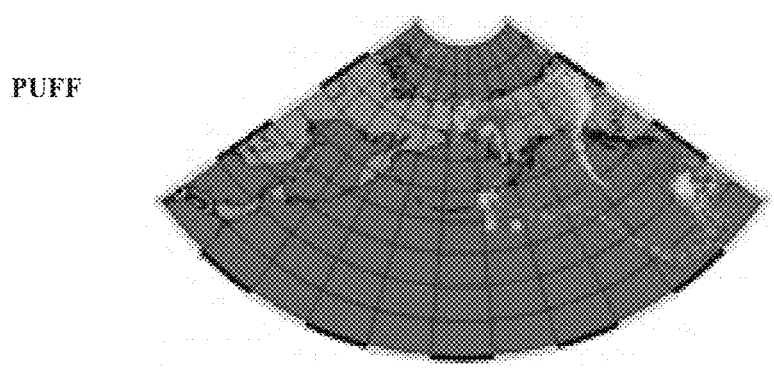
FIG. 5H shows a PUFF model at a third time.
Figure 5I:
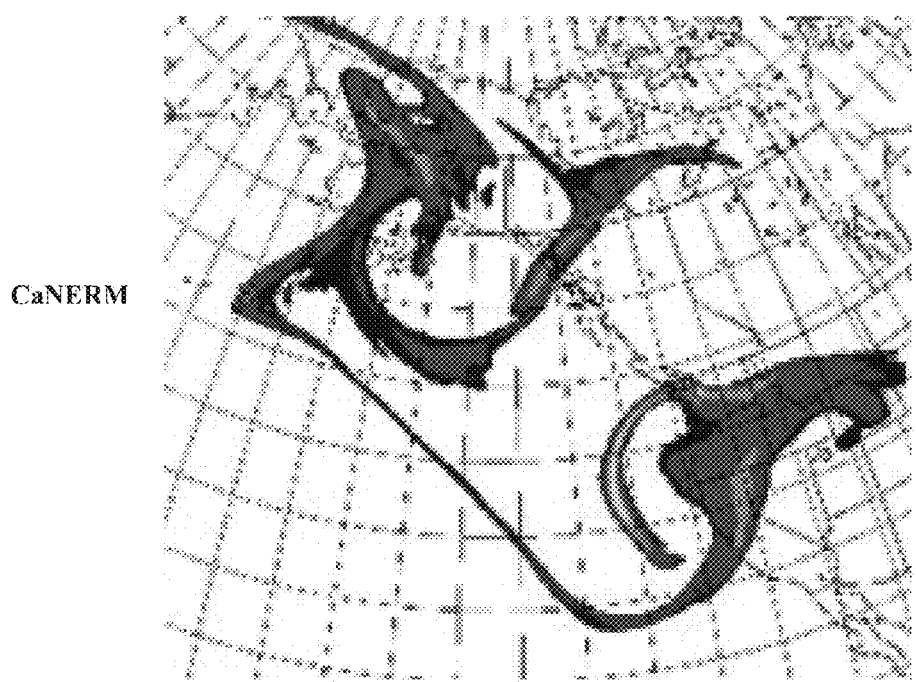
FIG. 5I shows a CaNERM model at a third time.

VAFTD model forecast accuracy can be corroborated with satellite observations to confirm the cloud's movement. VAFTD models not only can provide the horizontal location and movement of a cloud, but can also provide vertical information such as cloud height, vertical distribution of ash by size, and the distribution of different chemical species. When available, other observations can improve the forecast accuracy. These observations can comprise Doppler weather radar, as well as visual observations from the ground and aircraft. The direct, or in-situ, measurement of the ash cloud can also improve forecast accuracy. FIG. 5 shows comparisons of various models. FIG. 5A shows a HYSPLIT model at a first time. FIG. 5B shows a PUFF model at a first time. FIG. 5C shows a CaNERM model at a first time. FIG. 5D shows a HYSPLIT model at a second time. FIG. 5E shows a PUFF model at a second time. FIG. 5F shows a CaNERM model at a second time. FIG. 5G shows a HYSPLIT model at a third time. FIG. 5H shows a PUFF model at a third time. FIG. 5I shows a CaNERM model at a third time.

Remote sensing of ash clouds can be useful in detecting and then predicting the impact of volcanic activity upon on other areas. In an aspect, volcano monitoring can comprise a network of sensors and systems with satellite remote sensing being useful. Satellite remote sensing can be used as a tool for the detecting of the ash cloud's movement as the cloud moves and disperses in the atmosphere.

Real-time satellite monitoring and analysis can be viewed as comprising four broad categories. The imaging technology can be used to detect any and all changes in the thermal infrared radiant temperatures that would indicate a change in the surface activity and volcanic crater activity. It may also be used to sense and estimate rates of lava extrusion, locate and track volcanic ash clouds and plumes using the Brightness Temperature Difference (BTD) method, and detect and track airborne sulfur dioxide ($SO_2$) emissions using ultraviolet satellite remote sensing measurements.

Note that the above methods can use portions of the energy spectrum that are invisible to the human eye. The shorter invisible wavelength can be used for imaging in the ultraviolet region of the spectrum. Longer wavelengths that can be used can comprise several bands of the infrared spectrum.

Ash clouds, like normal atmospheric clouds, can be detected with thermal infrared TIR sensors. These sensors can measure both reflected and emitted IR energy. For example, the water in clouds can reflect much more IR energy than clouds composed of ice crystals or ash. Water droplets, ice crystals, and ash of larger sizes can reflect even more infrared (IR) energy. At night, when there is no sunlight to reflect, the same clouds can be imaged by the IR energy the clouds emit, with water droplets emitting less energy than the ice crystals or ash.

Figure 6B:
FIG. 6B illustrates clouds with brightness temperature difference (BTD) method.
Figure 6A:
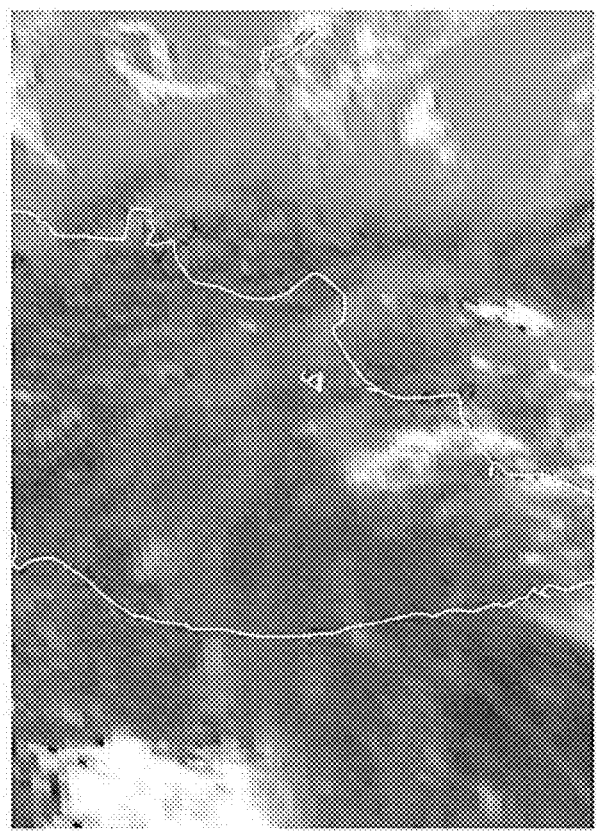
FIG. 6A illustrates clouds in TIR channel 4.
Figure 7A:
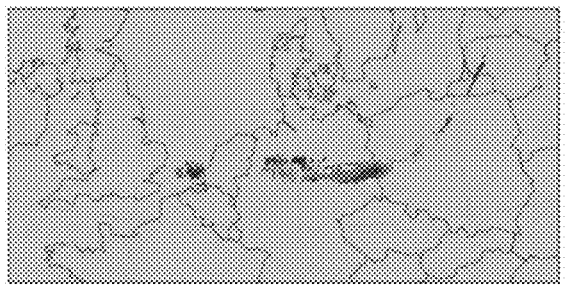
FIG. 7A shows satellite mass loading.
Figure 7B:
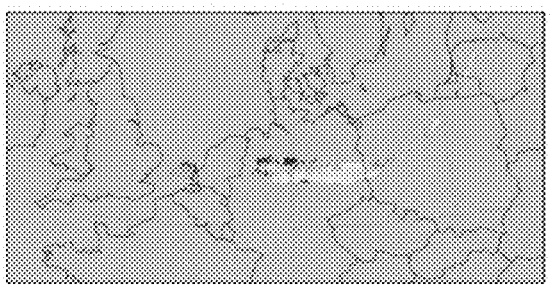
FIG. 7B shows cloud heights.
Figure 7C:
FIG. 7C shows an example of PUFF modeled mass loading.
Figure 7D:
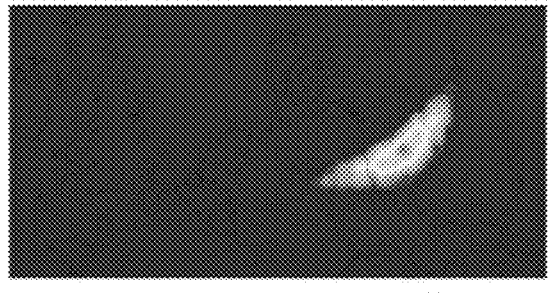
FIG. 7D shows another example of PUFF modeled mass loading.
Figure 7E:
FIG. 7E shows another example of PUFF modeled mass loading.

Using the thermal infrared sensors on satellite, it is possible to distinguish airborne ash from normal clouds. This determination is called the brightness temperature difference (BTD) because it subtracts one TIR band from another TIR band. By comparing two different bands of TIR measurements and subtracting the values of 12 µm channel (e.g., Band 5 in AVHRR) from 11 µm channel (e.g., Band 4 in AVHRR), BTD can cause the normal clouds in a satellite image to disappear while preserving the image of the volcanic ash. For AVHRR, when the differencing of channel 5 value from the channel 4 value results in a negative number (the $T_4$–$T_5$ method), the number can indicate the presence of dry silicate airborne ash, thus, discriminating the ash from clouds. FIG. 6A shows the brightness temperature difference (BTD) example results of this method. For example, FIG. 6A can illustrate clouds in TIR Channel 4. For example, FIG. 6B can illustrate clouds in BTD.

BTD can be an effective tool for estimating a variety of useful characteristics in an ash cloud. These characteristics can comprise, for example, parameters measuring the ash size (effective particle size in μm), the amount of the airborne ash (mass loading in kg/m$^2$), and the thickness and the opacity of the ash cloud (optical depth in a unitless BTD ratio).

A variation on the single channel TIR method, using the BTD method, can allow dry fine airborne ash to be detected and amounts estimated during both daytime and nighttime satellite imaging. This variation is called the reverse absorption method and can use the spectral signatures between thermal bands. For example, using the spectral signatures between thermal bands can provide examples of how a negative BTD signal discriminates ash from weather clouds in the 2006 Augustine and 2009 Redoubt eruptions.

It should be noted that the infrared ash signal detected by the satellite can be weakened and changed by the atmosphere and the airborne ash. The atmosphere can refract and scatter the signal. Additional signal strength can be lost through atmospheric attenuation and absorption.

There are various types of signal scatter caused by the atmosphere, such as Rayleigh, Mie, and some non-selective scattering. For example, in the case of thermal infrared measurements at the 10-12 μm short wavelengths of volcanic ash, Mie scattering can affect the signal.

Scattering of the TIR signal can be used to estimate the mass loading of ash and particle size distribution in the volcanic cloud. Estimation is possible, at least in part, because of knowledge of the differences in thermal radiance between the ground and the top of the ash cloud. Using a technique called volcanic ash retrieval (VAR), the refractive index of the ash cloud can be estimated which provides information on the particle size distribution. This estimation also can help to establish the mass loading (ash in kg/m$^2$) per image pixel and the effective particle size (ash in μm).

Effective particle size tells us if a distribution is a Gaussian distribution of ash size or if the ash cloud varies from the mean with a larger proportion of fine ash. Fine ash concentrations can be lofted higher in the ash cloud and transported further before dispersing. This fine ash can be invisible to an aircraft pilot's eyes and is the same ash that can cause the engines to flame out. FIG. 7 shows mass loading and cloud heights, with Satellite Mass Loading at FIG. 7A, Cloud Height at FIG. 7B, and PUFF-Modeled Mass Loading at FIG. 7C-FIG. 7E.

BTD measurements coupled with the reverse absorption techniques can be used to estimate the eruptions source parameters (ESP). ESP can be used to initialize the VAFTD models and can be helpful for the forecast accuracy. Inaccurate ESP measurements can lead to poor estimates of the amount of ash in the cloud, leading to inaccurate ash forecasts.

Figure 8A:
FIG. 8A shows a plot illustrating BTD of a particle cloud.
Figure 8B:
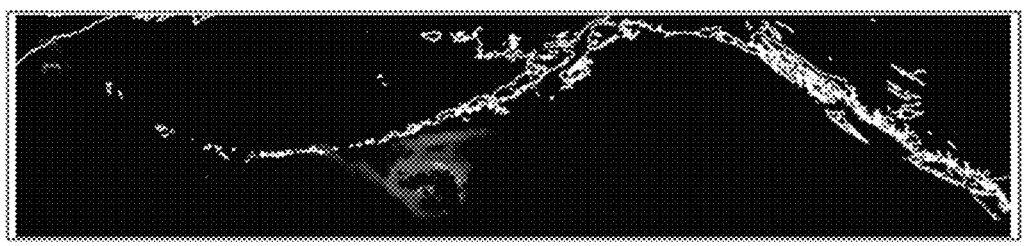
FIG. 8B shows a plot illustrating Mass of a particle cloud.
Figure 8C:
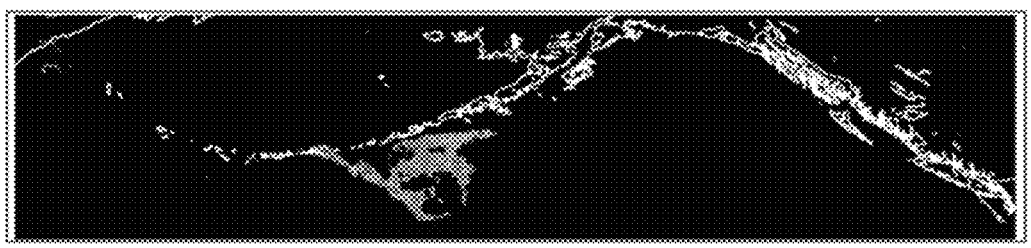
FIG. 8C shows a plot illustrating Effective Size of a particle cloud.
Figure 8D:
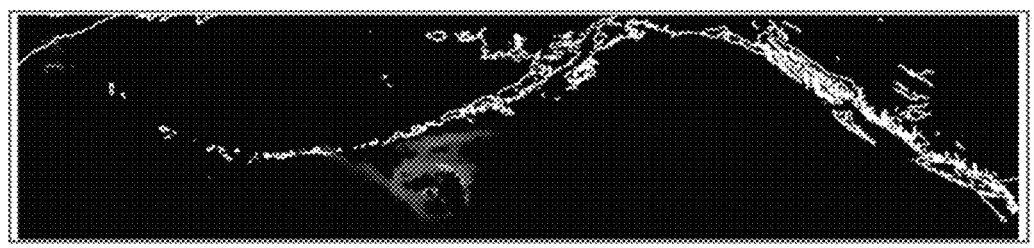
FIG. 8D shows a plot illustrating Optical Depth of a particle cloud.

The BTD values can measure cloud radiance (thermal temperature) and ground surface temperature. Using two separate TIR images, the cloud's properties describing the ash can be retrieved, as shown in FIG. 8. FIG. 8A shows a plot illustrating BTD of a particle cloud. FIG. 8B shows a plot illustrating Mass of a particle cloud. FIG. 8C shows a plot illustrating Effective Size of a particle cloud. FIG. 8D shows a plot illustrating Optical Depth of a particle cloud. Using ash retrieval techniques, the behavior of the temperature differences within the cloud can be estimated. This estimation in turn allows the estimation of ash-mass loading, particle-size distribution and the microphysical properties of the ash within the cloud. For the VAR method, these inputs, measurements, and measurement uncertainties are listed in Table 3.

TABLE 3

Volcanic Ash Retrieval (VAR) Inputs and their Mass Error Sensitivity

| Input | Units | Known or measured | Mass Error |
|---|---|---|---|
| Surface Temp. | K | Can be measured from NWP or satellite data | 37.4% |
| Ground Leaving Radiance | W/m$^2$/str/μm | | |
| Cloud Top Temp. | K | Can be measured from other TIR data or earlier opaque cloud | 4.3% |
| Cloud Leaving Radiance | W/m$^2$/str/μm | | |
| Max. radii in particle size distribution | μm | Assumed to be 50 μm | 1.0% |
| Min. radii in particle size distribution | μm | Assumed to be 0.1 μm | 0.5% |
| Shape of initial particle size distribution (σ) | Unit-less | Defines shape/variance of Gaussian distribution as 0.74 | 4.6% |

Accurate estimates of ESP can be problematic. Inaccurate knowledge of the temperatures between the ground and top of the ash cloud can lead to up to a 40% variation in the estimated ash loading. There are some techniques to improve these estimates utilizing numerical weather models, but estimating the ESP ash loadings are still problematic.

Integrating modeling with the remote sensing data can improve the quality of the models. VAFTD models can provide a representation of the ash cloud location and predict cloud movement with model inputs. VAFTD models can produce three-dimensional (3D) concentrations of volcanic ash, with accurate knowledge of the input volcanic mass, particle size distribution, as well as the duration of the eruption. In one aspect, volcanic ash advisory centers and observatories can run the forecast twenty-four hours in advance.

The twenty-four-hour forecast with the next available satellite image can be used to assess the accuracy of the forecast. The two-dimensional (2D) spatial location of the moving ash cloud can be compared and the model's accuracy assessed. It is also possible to compare the modeled 3D data that describes the size and concentration of the ash to the next-available imagery.

Satellite-to-model comparisons are performed on ash mass loading and are generally created through spatial rather than point-to-point comparisons. These point-to-point comparisons in 3D can be performed in a gridded Eulerian model or in a vector Lagrangian trajectory model.

Figures 9A, 9B, 9C:
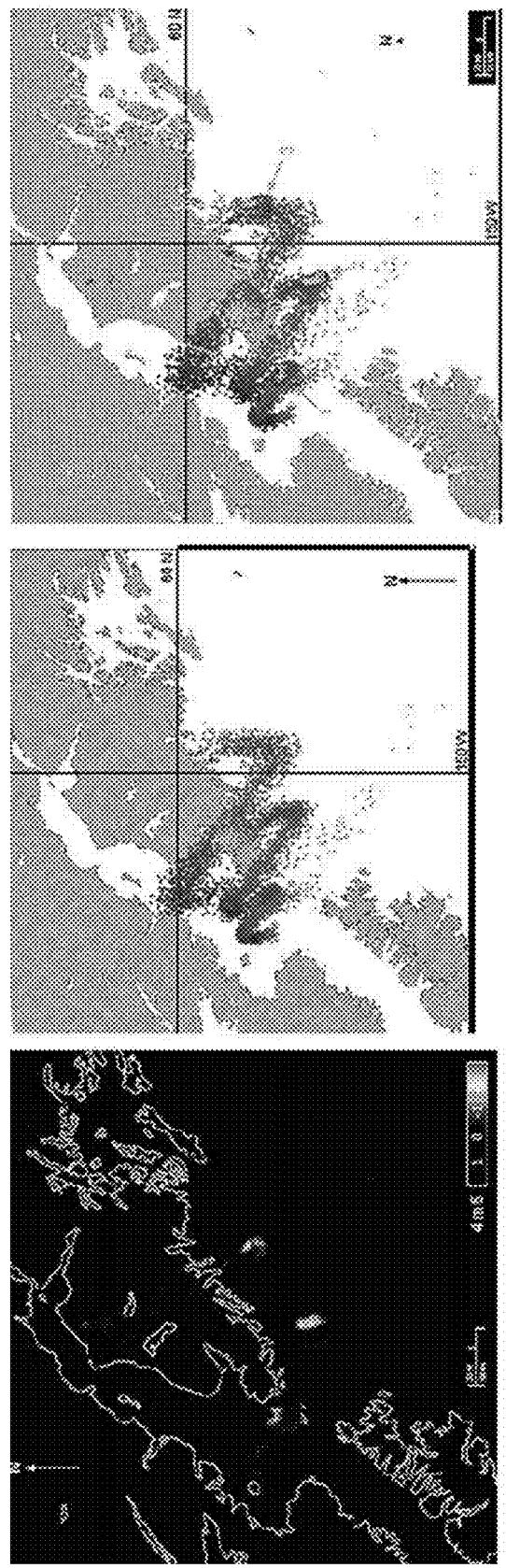
FIG. 9A shows an example BTD Image.
FIG. 9B shows an example PUFF model of ash heights.
FIG. 9C compares BTD to PUFF.
Figure 10A:
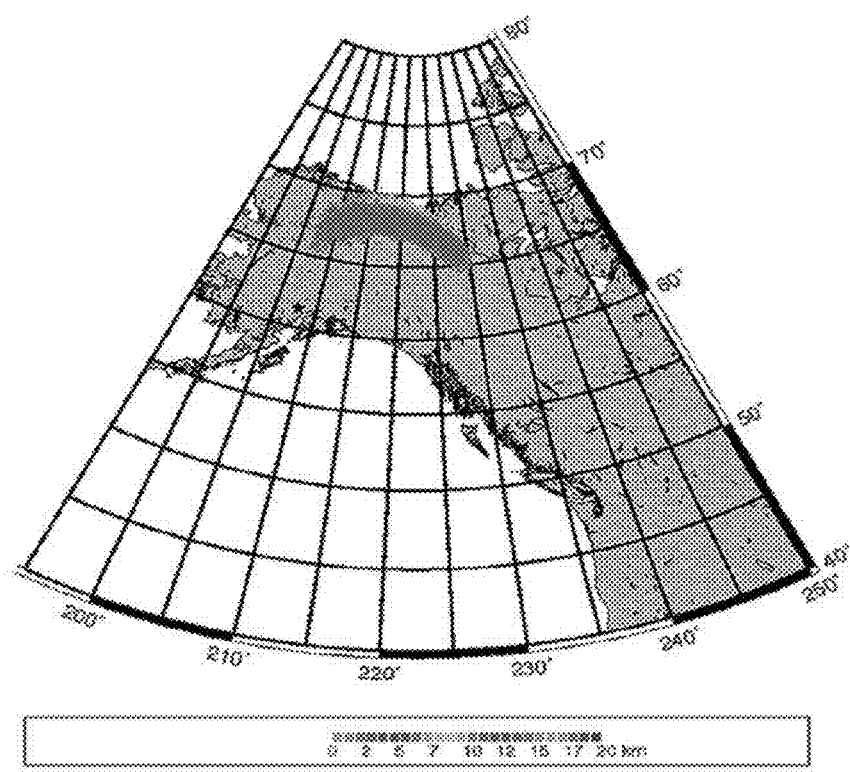
FIG. 10A illustrates an example PUFF model of ash heights.
Figure 10B:
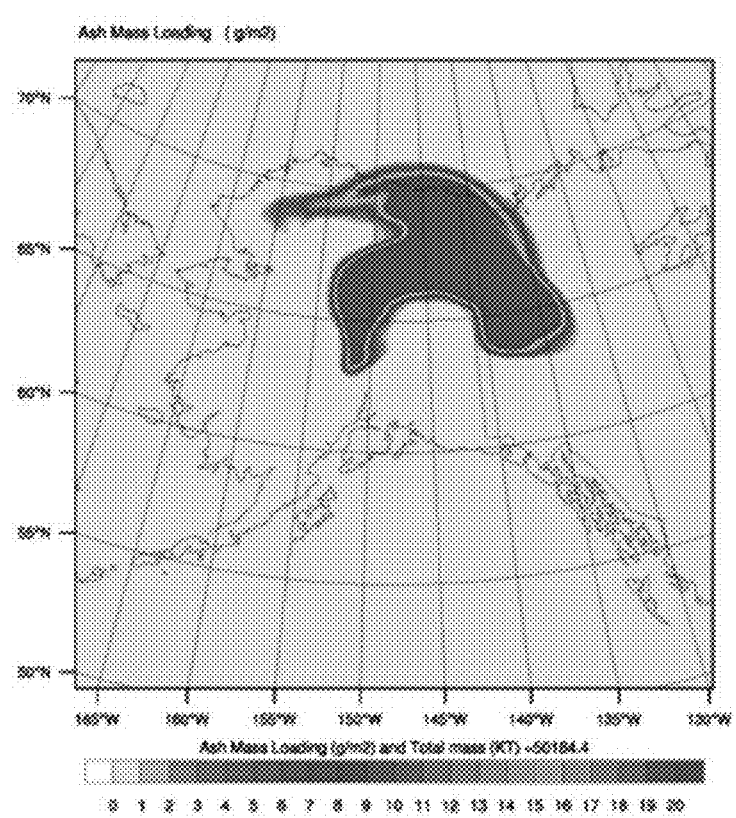
FIG. 10B illustrates an example WRF-Chem model of ash mass loading.

FIG. 9 compares the forecast locations of ash clouds with the next available satellite imagery. FIG. 9A shows an example BTD Image, FIG. 9B shows an example PUFF model of ash heights, and FIG. 9C compares BTD to PUFF. The accuracy of the 2D spatial model can then be validated against the satellite image. It is also possible to make more complex comparisons of the 3D model data with ash loading and ash concentrations at defined altitudes. FIG. 10A illustrates an example PUFF model of ash heights and FIG. 10B illustrates an example WRF-Chem model of ash mass loading.

In order to compare the 3D ash cloud model to the 2D satellite image, the 3D dataset can be converted to a simulated 2D map or synthetic image. For example, the synthetic image can be in the same coordinate system as the real satellite image, allowing for a direct comparison of the forecast against the satellite image.

Figure 11A:
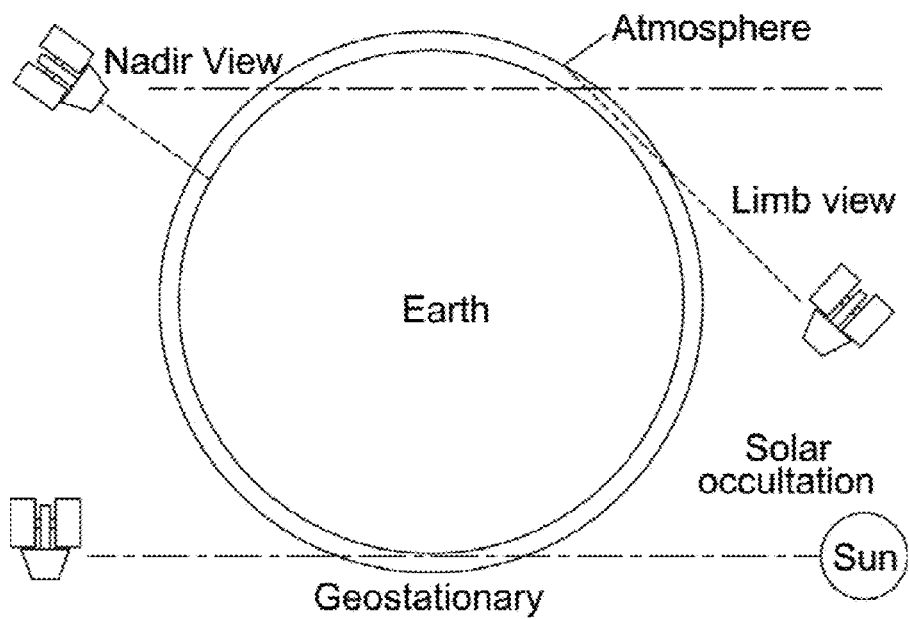
FIG. 11A shows that polar orbit satellites can have a different viewing angle of an ash cloud compared to a geostationary satellite.
Figure 11B:
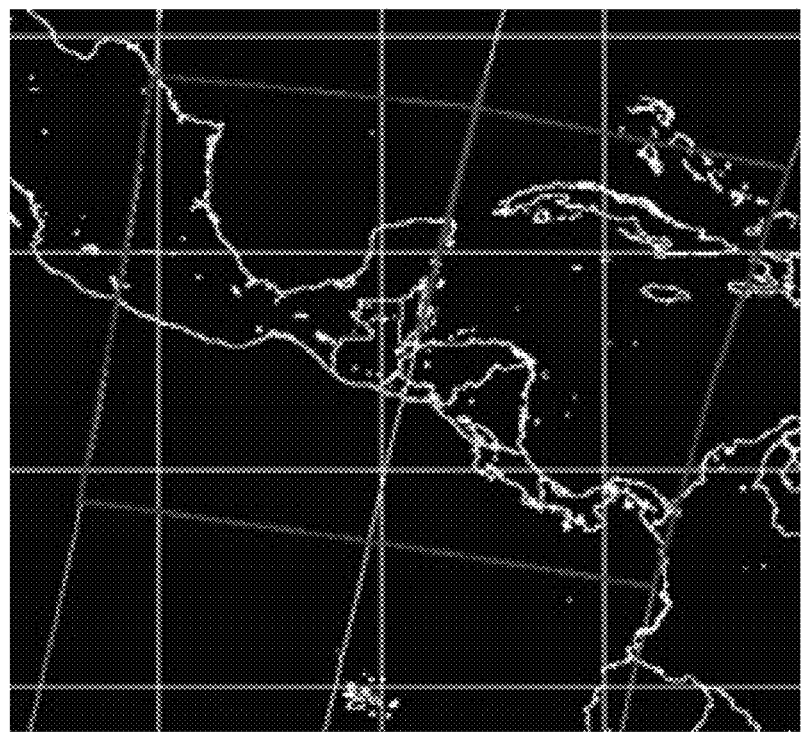
FIG. 11B shows an example ash cloud.

In order to make this direct comparison, the conversion of the 3D forecast model to a simulated image can take into account many factors. The first factor to account for is the satellite's orbit and the look angle of the satellite's sensor. Geosynchronous satellites can have a fixed orbital plane and look angle, though the view angle of a volcanic ash cloud will increase with distance from the image nadir, e.g., higher latitudes as shown in FIG. 11A. Polar-orbiting satellites can follow defined orbital planes, and thus, do not have a fixed location with respect to the earth when viewing an ash cloud as shown in FIG. 11B. For this reason, polar orbit satellites will likely have a different viewing angle of an ash cloud compared to a geostationary satellite.

These satellite orbital parameters can be recorded for every image taken by a satellite. The location of the satellite in space and the look angle of the sensor can allow the modeling of the look angles and image coordinates. With this information, the 3D forecast model can be rendered in the 2D synthetic image exactly as the satellite would be seeing the volcanic ash cloud from space.

Figure 12:
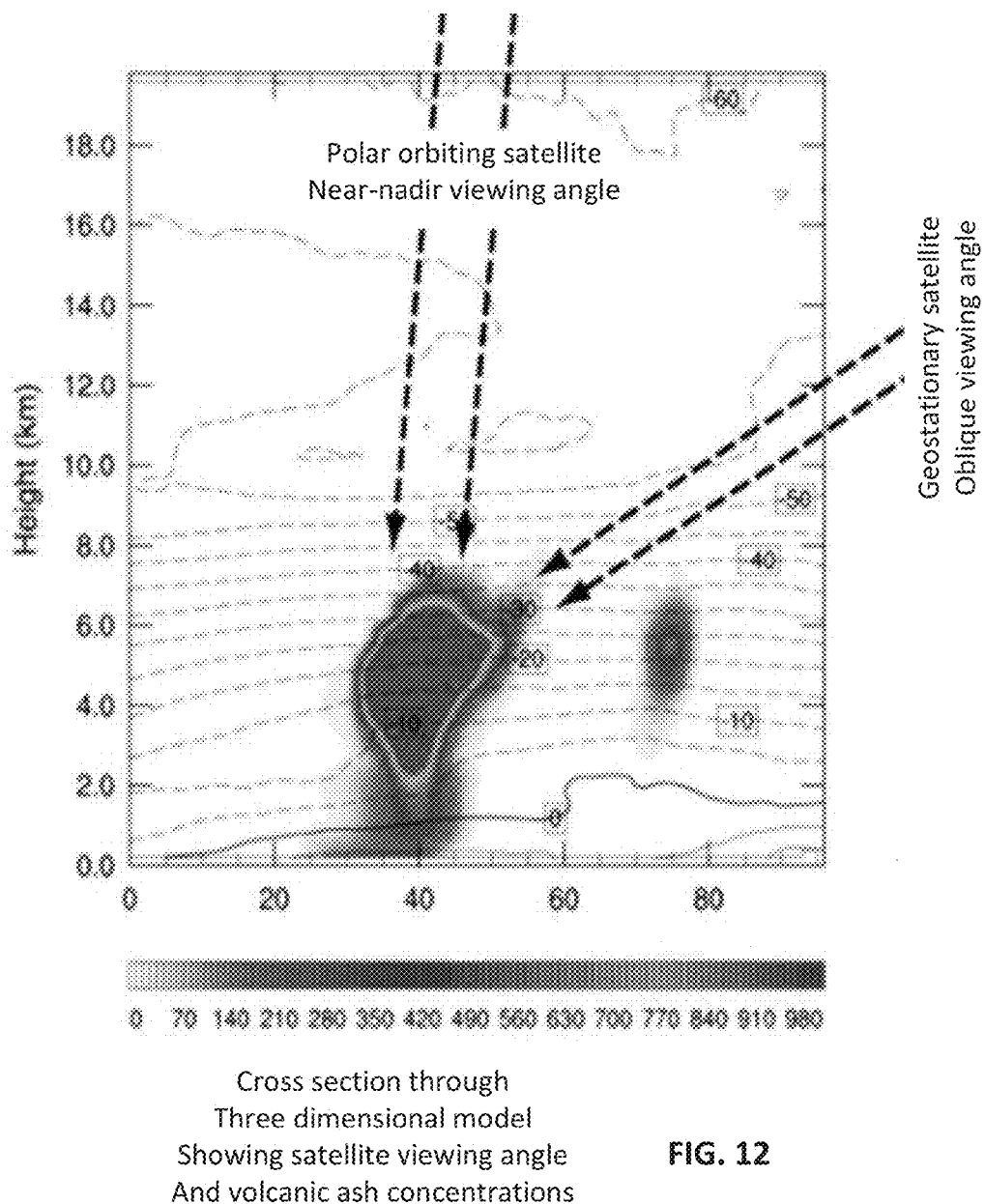
FIG. 12 illustrates a two dimensional slice through a three dimensional forecast model.

FIG. 12 illustrates a 2D slice through a 3D forecast model. FIG. 12 also illustrates geostationary and polar satellite view geometries of an ash cloud. There are subtle issues with creating the 2D synthetic image from the 3D forecast model. These issues can affect the water and ash in the atmosphere and the method of measuring thermal infrared radiation. In one aspect, the 2D synthetic image can be determined based on ray tracing. Using ray tracing, the propagation effects of water and ash in the atmosphere can be modeled. This ray-tracing concept for modeling refraction borrows from RADAR interferometry's equivalent approach to measuring signals that are refracted and delayed by water vapor.

In another aspect, a similar approach can be used to model the effect of airborne ash with TIR signal refraction, a technique that also provides information on the density of the ash. Another variable to account for in the generation of the synthetic image can be numerical weather prediction (NWP) data, which can help account for the variation in the ash cloud between the ground and the top of the cloud.

Detailed below are methods of generating a 2D synthetic image from a 3D forecast model and a comparison of the synthetic image to later satellite imagery to confirm the accuracy of the forecast model. One of the complexities can be the varying spatial resolution of the satellite imagery used in the validation. At the equator GOES pixels in the TIR image can be 1 km (per side) at nadir and up to 8 km (per side) at the Poles; AVHRR can have nadir resolution of 1 km and the pixels at the image edge can be 3-4 km (per side). The two VAFTD models can also have spatial resolutions that vary from each other as well as from the satellite data.

Many VAFTD models can depend on the spatial resolution of the model's numerical weather prediction (NWP) data. Thus, the resolution of the 3D grids to model the ash concentration and particle density can be driven by the weather data. Therefore, the methods can compare datasets from different spatial domains. Hence, either sub-sampling the VAFTD models or applying spatial averaging of the satellite data in order to match the satellite data to the modeled maps can be a helpful approach. Different sampling techniques can be applied to determine the effect they have on the assessment of the modeled cloud.

The present methods and systems can help to improve the forecast accuracy of volcanic ash forecast transport and dispersion models. The present methods and systems are not only for a specific VAFTD model, but instead represent a general technique that can be applied to all VAFTD models.

The described general technique can be applied to all VAFTD models and other models and can be called validation and calibration (VAL-CAL). This term implies validating a prior forecast (e.g., forecast model) with some form of "truth" data (e.g., actual measured data or calculated from measured data) to identify errors and discrepancies in the forecast model. The next step can be to identify the sources of the forecast error and quantify the model input error so that the next forecast can be calibrated with revised inputs.

With this technique, VAFTD models accuracy can be improved with the first VAL-CAL process. Subsequent VAL-CAL steps on later forecasts can result in further improvement, so long as the eruption source parameters (ESP) remain similar between each forecast. ESP can be relevant because there are no technically defined standards or metrics for collecting in-situ ESP measurements. Establishing these input parameters so that in-situ data collection can be standardized can help to ensure accurate forecasting.

Validation and calibration can help to improve volcanic ash forecast models. A faster method of validating and then calibrating the next forecast will improve forecast accuracies. The present methods and systems can comprise creating a synthetic 2D image from the 3D forecast model, permitting the synthetic image to be compared to the next available satellite image. The two images can be inspected for differences.

Generation of a synthetic image can allow for the direct comparison to the next satellite image, and can thus, permit the validation of the forecast model's accuracy. If there are differences in the forecast model's prediction, then the model's next forecast can be calibrated based on the measured differences in the synthetic image and satellite image used in the image's validation.

As an illustrative example, a forecast model can comprise and/or be based upon Weather Research Forecasting with inline Chemistry (WRF-Chem) VAFTD model, the PUFF model applied at the Alaska Volcano Observatory, and/or the like. Both models provide three-dimensional representation of the ash cloud's location, but the models differ in that PUFF is a Lagrangian model while WRF-Chem is an Eulerian model. The method can work with different types of mathematical models to gain insights as to whether there will be any difference in how the synthetic image is generated.

PUFF can comprise a Lagrangian model that tracks individual particle trajectories to create ash concentration maps. PUFF was developed by Geophysical Institute, University of Alaska Fairbanks for use by the Alaska Volcano Observatory (AVO) and has been used at various times by the Anchorage VAAC. WRF-Chem is an Eulerian model in which ash can be modeled on a three-dimensional Cartesian grid. WRF-Chem has been developed in conjunction with the NOAA Earth Systems Research Laboratory and the Center for Weather Forecast and Climate Studies, Brazil. WRF-Chem can augment the ash dispersion models with forecasts of the ultra-fine particles and chemical aerosols ejected as part of a volcanic steam eruption.

In an aspect, different 3D forecast models can be rendered as 2D synthetic images. It is anticipated that any differences in the 2D synthetic images that are noted can be related, for example in how the eruption source parameters—such as vertical distribution, initial height, or eruption rates—are used in the model.

Using a process called hindcasting, a model can be mathematically integrated backwards through time to confirm the accuracy of the forecast model. Hindcasting can provide control over the input modeling data. Unfortunately, datasets can be difficult to obtain for hindcast modeling.

The available hindcast data can comprise, for example, several sets of data. The first set of data can comprise the start and end times of the eruption and the height of the eruption plume. For some events, ash eruption rate and particle size distributions have been estimated. Meteorological radar observations of these eruptions can help determine the accuracy of the models. There also exist a variety of satellite data for many of these events, with many satellite data options for the most recent events. With the 2008 Kasatochi eruption, BTD data at every thirty minute interval of the eruption can be obtained from GOES. Kasatochi also has data from the polar-orbiting AVHRR, MODIS, and AIRS sensors.

In one aspect, another piece of information that can be used to generate the hindcast model can be the weather during the eruptions. Numerical weather prediction (NWP) can be used to provide information on the patterns of the wind that transport the ash. NWP is a direct input for PUFF while WRF-Chem integrally can contains the NWP information.

Example available data sets are described in Table 4. For example, the present methods and systems can be applied to the 2008 Kasatochi eruption data as well as other data listed in Table 4.

TABLE 4

Eruption Data Available for Validation and Hindcast Analysis

| Event | Eruption Data & ESP |
| --- | --- |
| Mt. Spurr 1992 | Three eruptions between June-September 1992 Seismic data control on start/end time Plume heights from RADAR and TIR satellite data |
| Mt. Cleveland 2001 | Events in February-March 2001 Ash clouds seen in GEO- and Polar orbit satellites TIR to constrain plume heights in VAFTD models |
| Kasatochi 2008 | 3 separate explosive events Cloud height >18 km; tracked across N. Pacific |
| Redoubt 2009 | 19 eruptions from Mar. 23-Apr. 4, 2009 Seismic data to known start/end time Plume heights from RADAR and TIR satellite data |
| Eyjafjallajokull 2010 | Explosive eruption from April-May 2010 Plume heights: 4-9 km |

While working with past events using hindcast models, several assumptions can be made regarding these models. These assumptions include the initial vertical shape of the eruption column as well as the distribution and amount of the erupted ash. As the VAFTD models can be controlled, the results of a particular method can be assessed. This assessment can comprise understanding, at least in part, which size of ash particles can be detected from the satellite BTD data and whether or not the satellite BTD measurements match the synthetic image BTD measurements. If these measurements do not agree, then further measurements and/or analysis can be performed as to determine why these measurements do not agree and to calibrate the VAFTD model.

A hindcast model can be performed with Kasatochi, a stratovolcano in the southwest Aleutian Islands of Alaska. Kasatochi erupted explosively without any warning in August 2008, and the volcano had very little eruptive history. There are no seismographs or web cameras at Kasatochi, but monitoring networks from neighboring volcanoes picked up the activity.

Three separate ash clouds reached an altitude of up to 60,000 feet during the period of Aug. 7-8, 2008. The ash propagated across the North Pacific region, interfering with air traffic in the United States and Canada several days later.

In one aspect, validation and calibration with the Kasatochi eruption can be implemented based on one or more weather modeling packages, such as WRF-Chem. Because WRF-Chem can be an Eulerian model, a 3D grid can be established. For the analysis, example values can comprise an 18 km spatial resolution grid, with 300 by 300 grid points centered on the volcano. The 3D grid can have thirty vertical levels. The temporal resolution can be set for ninety-second time steps. These parameters can be configured to produce a volcanic ash simulation within a short time window, which can be useful for volcanic ash operations and producing volcanic ash advisories.

Figure 13A:
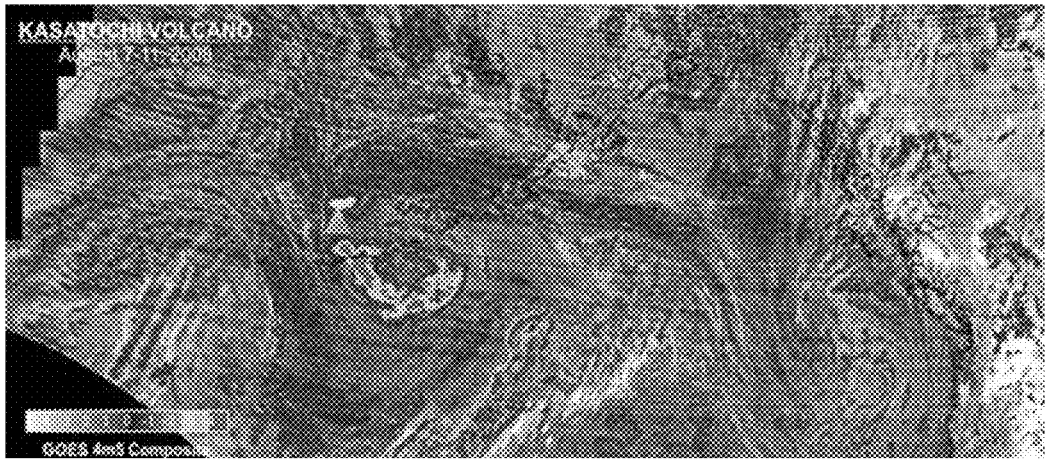
FIG. 13A shows a BTD Image of the Kasatochi volcanoes dispersing Ash Cloud at a first time.
Figure 13B:
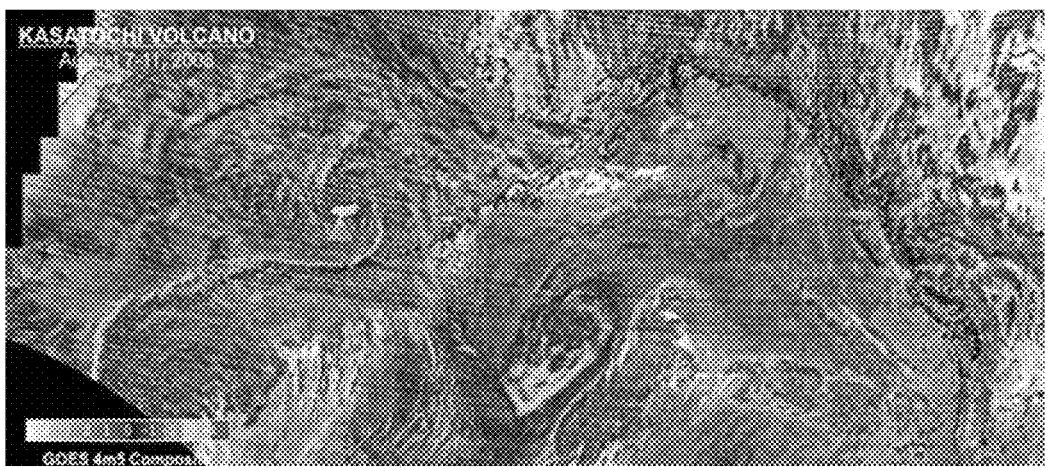
FIG. 13B shows a BTD Image of the Kasatochi volcanoes dispersing Ash Cloud after the first time.

In one aspect, a comparison of the WRF-Chem results to the satellite geostationary thermal infrared data from the Geostationary Operational Environmental Satellites (GOES) sensor can be performed. By way of example, the satellite data for the Kasatochi eruption showed a dispersing cloud, initially attached to the volcano, as shown in FIG. 13A at a first time and FIG. 13B at a later time. The ash was transported further into the North Pacific towards the Western coast of the USA and Canada.

Figure 14:
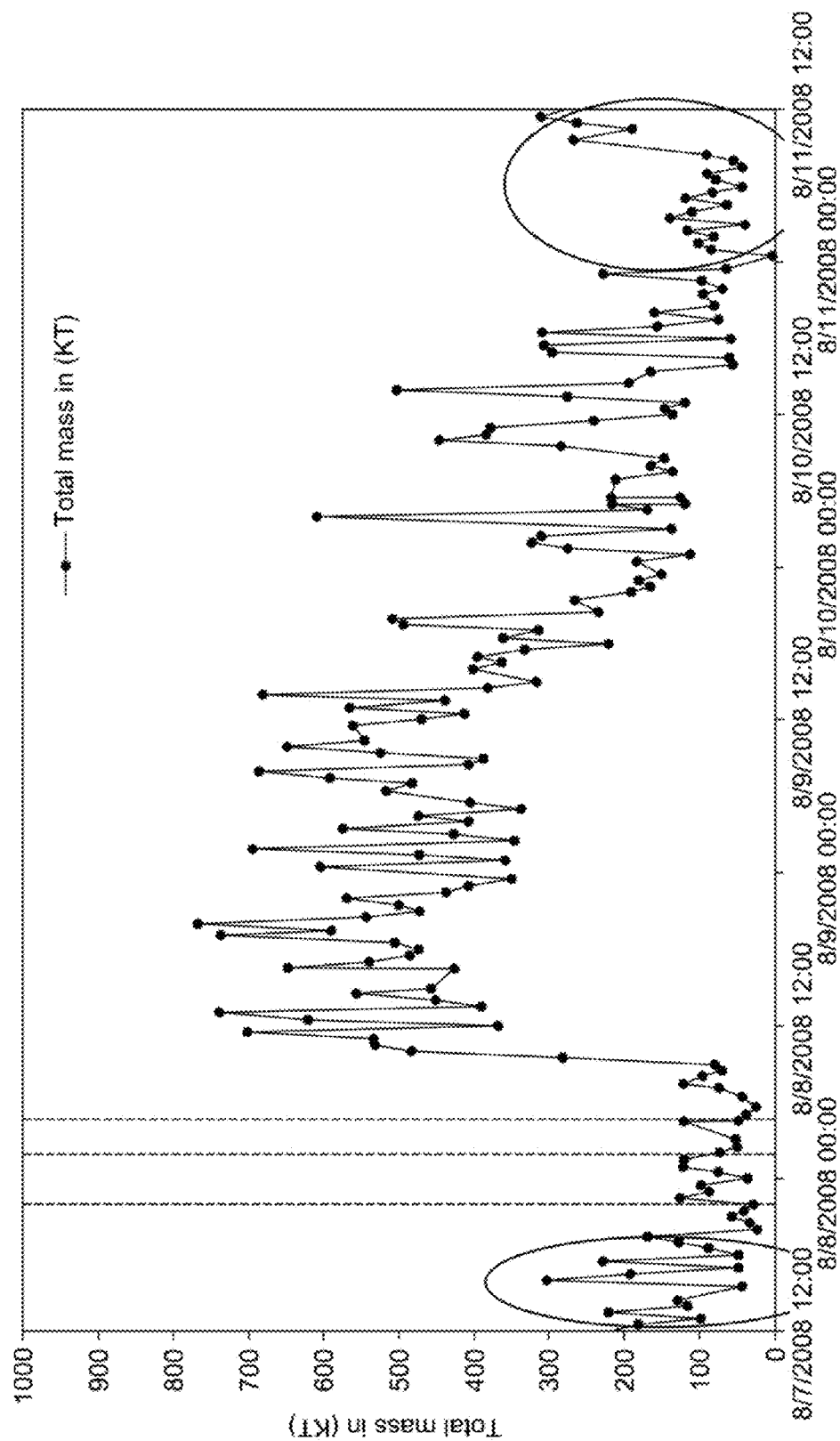
FIG. 14 shows a graph of total ash in terms of mass versus time.

In one aspect, a time series can be constructed using GOES satellite data to estimate the amount of airborne ash. As an example, the amount of ash recorded, using volcanic ash retrieval (VAR) techniques is displayed in FIG. 14. The three vertical lines of FIG. 14 show the times of the eruptions. The VAR approach can be sensitive to the temperature differences between the ground surface and the top of the ash cloud. This sensitivity can explain the whipsaw spikes in the time series data.

In one aspect, some of the noise can be reduced by converting the WRF-Chem modeled output to a BTD output. This operation can help normalize the ground-surface temperatures for each pixel in the image by converting the airborne ash estimates to a BTD thermal signal.

The two circles in FIG. 14 highlight times when the local weather systems caused noisy and inaccurate ash retrievals from the volcanic ash BTD images. Some of this noise is seen as peaks and troughs in the time series. The red line represents the smoothed data in the time series.

After the end of the eruptions, the ash mass from the satellite data can, for example, be observed to increase. This increase can be due to finer ash dominating the image, which causes the ash cloud to become more translucent. The infrared BTD technique can be heavily influenced by fine ash particles with the 1-50 μm size dominating the image. Direct comparison of the modeled and satellite BTD can help eliminate assumptions in the satellite-detected ash distribution and this permits a direct comparison in the validation process.

To initialize the WRF-Chem model, several values of the ESP can be estimated. The eruption rate, for example, can be calculated using the empirical relationships known in the art. The eruption rate can then be used to estimate the height of the volcanic plume. Note that if the eruption rate is inaccurate, the height errors can be propagated through the 3D model and the resulting BTD images. How this variability can be tested and how to assess sensitivity to the BTD maps will be discussed further herein. The particle size distribution for Kasatochi can also be estimated and can be a factor in the 3D BTD image.

In one aspect, volcanoes can be grouped by chemistry, which can determine if a volcano's lava is fluid or viscous. The volcanoes of Hawaii, for example, can be described as mafic, with the dominant rock being basalt. The volcanoes in Alaska, Washington, and Oregon can be explosive and with geochemistry rich in silica and aluminum, which creates rocks of andesite, rhyolite, and dacite.

Kasatochi can be classified as an ESP S2-type volcano and Table 5 shows the ESP used. The S2-type volcanoes are estimated to have a fine ash (<125 μm) for approximately 40% of the eruptive mass.

TABLE 5

Classification of Volcanoes and Eruptions

| Type | Magma Type | Eruption Characteristics<br>H = height,<br>VEI = Volcano Explosivity Index |
|---|---|---|
| M0 | Mafic (basalt) | Insufficient data |
| M1 | Mafic | H < 5 km or VEI < 3 |
| M2 | Mafic | H = 5-8 km or VEI = 3 |
| M3 | Mafic | H > 8 km or VEI > 3 |
| S0 | Silicic<br>(andesite, dacite, rhyolite) | Insufficient data |
| S1 | Silicic | H < 6 km or VEI < 3 |
| S2 | Silicic | H = 6-12 km or VEI = 3 |
| S3 | Silicic | H > 12 km or VEI > 3 |
| S8 | Silicic | Active column collapse |
| S9 | Silicic | Active lava dome |
| U0 | All magma times | Submarine vent in water > 50 km |

The S2-type volcanoes can be assumed to have a large amount of fine ash. This fine ash can remain aloft and be carried downwind. This behavior can be an issue with WRF-Chem if this model does not have a process to aggregate the ash and accelerate the fallout of the larger, aggregated particles.

When there is a high input value for fine ash, WRF-Chem can generate higher ash concentrations and mass loadings in the BTD images. These BTD images can match the satellite data used to validate the WRF-Chem forecast, but there can be a higher signal for the ash. When there is a low input value for fine ash, the simulated BTD image can also agree with the satellite image used to validate the location of the cloud, but the BTD image can have a weaker BTD signal. These differences in the particle size distribution can cause the increased sensitivity of the WRF-Chem model.

TABLE 6

WRF-Chem Model ESP

| Volcano | Start | Duration (hrs) | Height (km, asl) | ER (kg/s) | Total mass (kg/Tg) | ESP size distribution |
|---|---|---|---|---|---|---|
| Kasatochi | Aug 7, 22:20 Z | 1.67 | 14 | 7.60*10$^6$ | 4.57*10$^{10}$/45.68 | S2 |
| Kasatochi | Aug 8, 01:50 Z | 0.45 | 14 | 7.60*10$^6$ | 1.23*10$^{10}$/12.31 | S2 |
| Kasatochi | Aug 8, 04:30 Z | 9.42 | 18 | 2.20*10$^7$ | 7.47*10$^{11}$/746.65 | S2 |

Figure 15A:
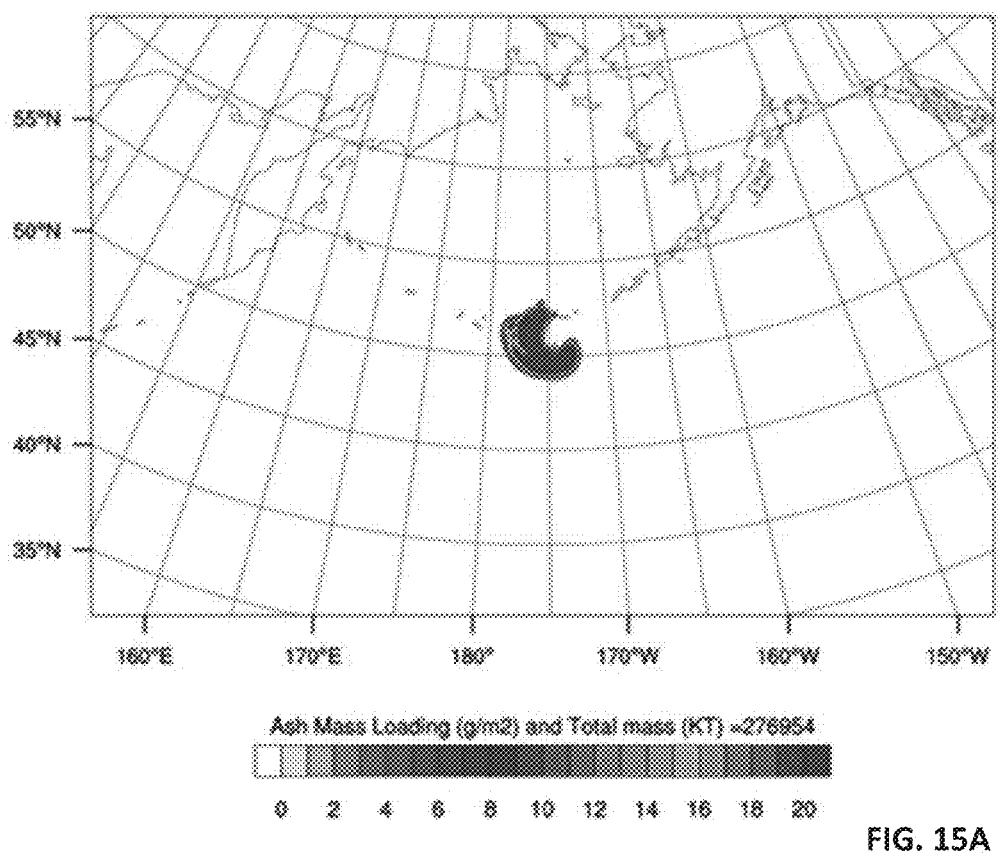
FIG. 15A shows a WRF-Chem plot of ash distribution total mass on August 8 at 06Z.
Figure 15B:
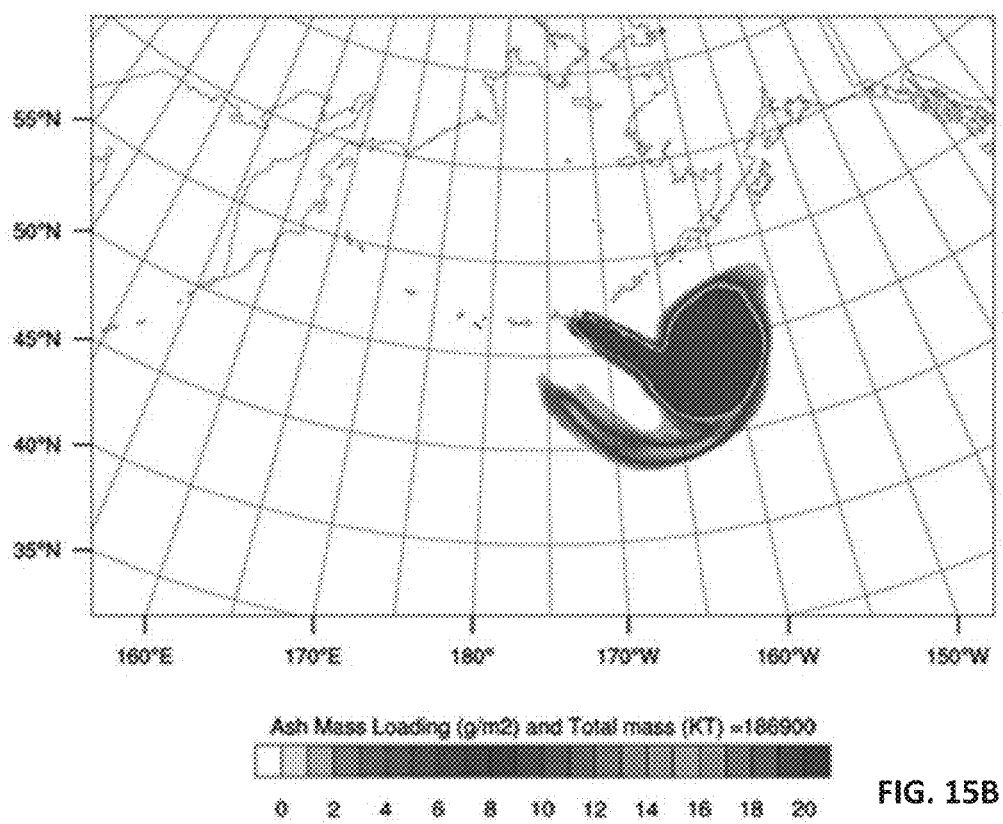
FIG. 15B shows a WRF-Chem plot of ash distribution total mass on August 9 at 18Z.
Figure 15C:
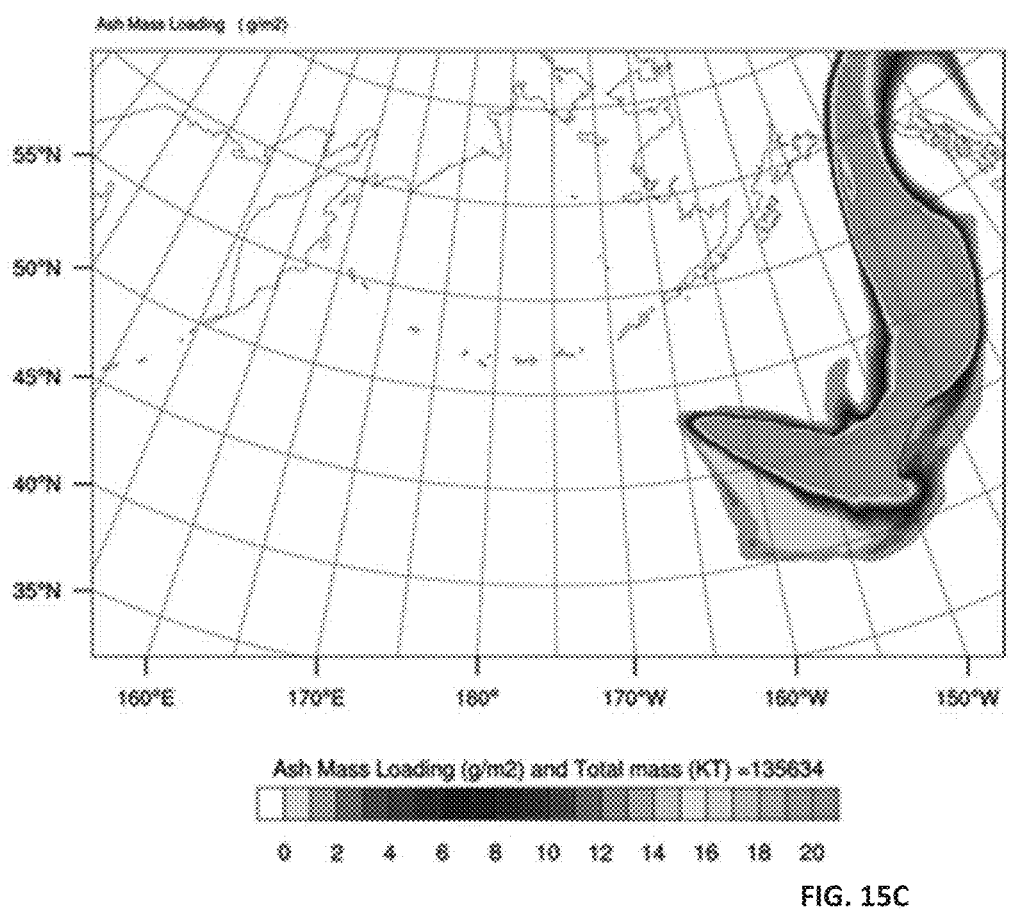
FIG. 15C shows a WRF-Chem plot of ash distribution total mass on August 10 at 02Z.

The BTD image created in the WRF-Chem forecast can show the airborne ash (g/m$^2$) at three time intervals. At the beginning, the ash cloud can be still attached to the volcanic plume (FIG. 15A shows total mass on August 8 at 06Z, Zulu time). After the third eruption of Kasatochi, the cloud has separated and drifted to the east, with an estimated 18 megatons of airborne ash (FIG. 15B shows total mass on August 9 at 18Z). The ash cloud continues to drift east, reaching Alaska and Canada (FIG. 15C shows total mass on August 10 at 02Z). When this ash reached Alaska, the measured sulfur dioxide led to the closure of Alaska's airspace.

Figure 16A:
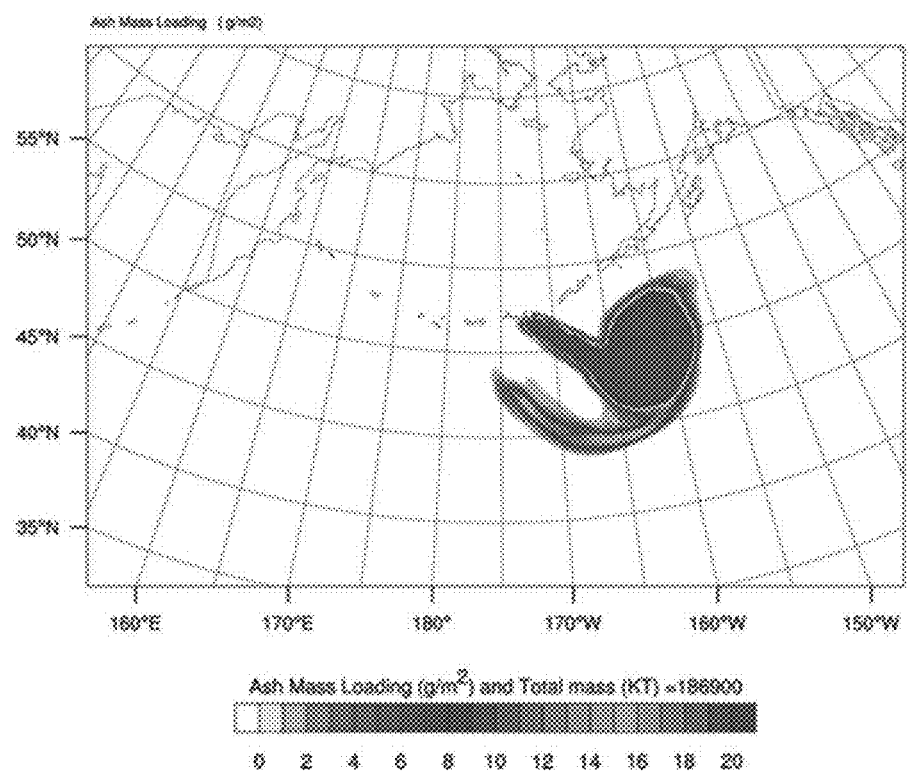
FIG. 16A shows WRF-Chem ash mass loading.
Figure 16B:
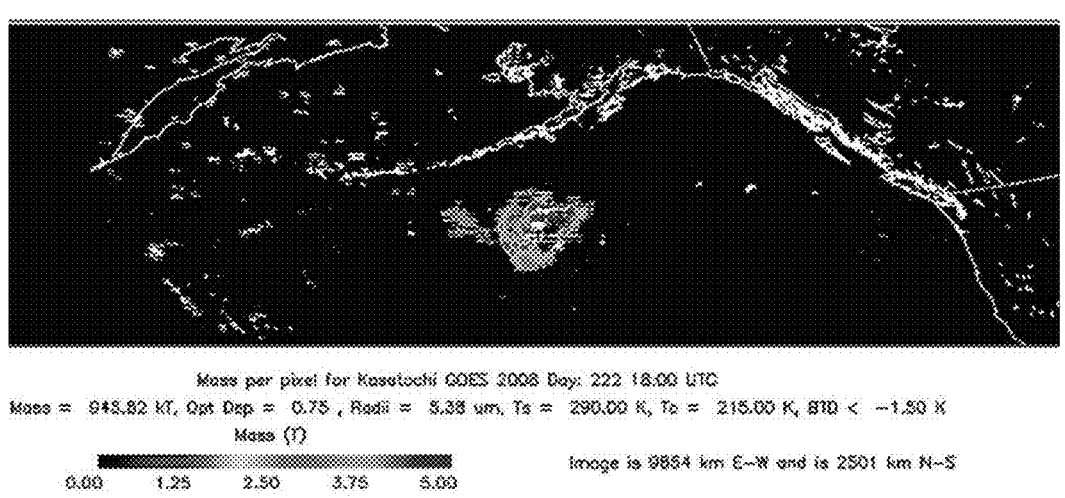
FIG. 16B shows GOES mass loading at 18Z on Aug. 9, 2008.

The example synthetic images from above can be compared to the actual satellite imagery to test the validation process as seen in FIG. 16. For example, FIG. 16A shows WRF-Chem ash mass loading, and FIG. 16B shows GOES mass loading at 18Z on Aug. 9, 2008. The validation shows a good match of the ash cloud's location, but the ash mass loading can be quite different. The total mass at 18Z on Aug. 9, 2008 from WRF-Chem is 186 megatons. At the same time, the VAR retrieval shows 945 kilotons. The WRF-Chem modeled ash mass is more than 150 times that from the retrieved satellite data.

At least two assumptions can account for the vast discrepancy between the projected quantity of ash and the observed quantity. First, the eruption rate can come from the measured plume height, which for Kasatochi was 18 km ASL for the third event. This maximum plume height may not have been maintained throughout the nine-hour event and as such the eruption rate should be lower for the later stages of the eruption. The result can be a lower total mass within the simulation and the downwind ash concentrations. The second issue can be, for example, too much fine ash in the modeled cloud used to create the synthetic image.

The upside to discovering this difference between the synthetic image and the satellite image is that the eruption rate and particle size distribution used in the ESP can be adjusted, thus calibrating the model for the next forecast.

In another aspect, two other ESP's that can be adjusted are the particle size distribution (PSD) and the effective radii distribution. As the Kasatochi ash cloud moves across the North Pacific, the PSD with WRF-Chem can be visualized to validate the synthetic image and calibrate the next forecast.

Figure 17A:
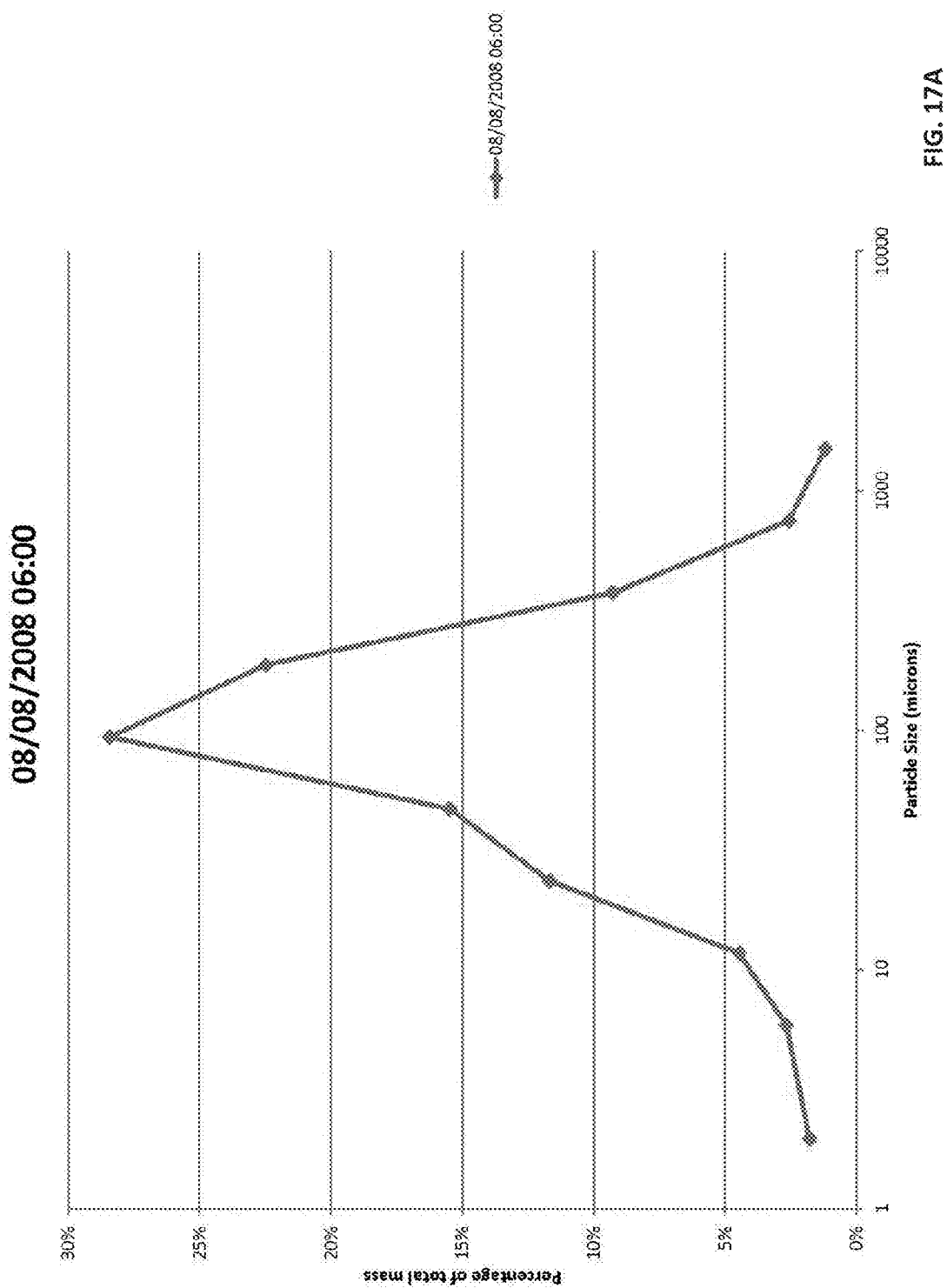
FIG. 17A shows an example WRF-Chem PSD.
Figure 17B:
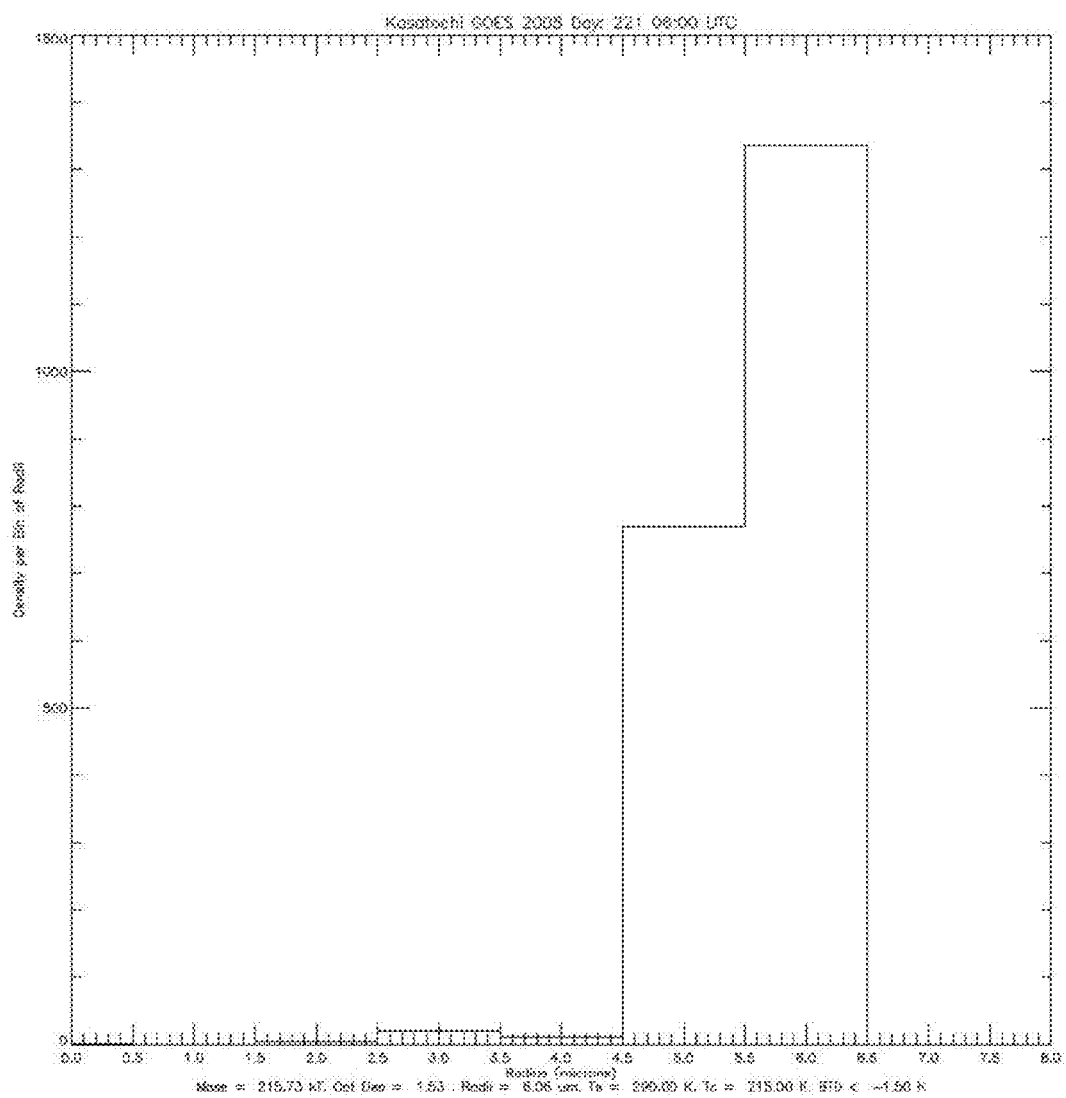
FIG. 17B shows VAR effective radii distribution at 06Z on Aug. 8, 2008.
Figure 17C:
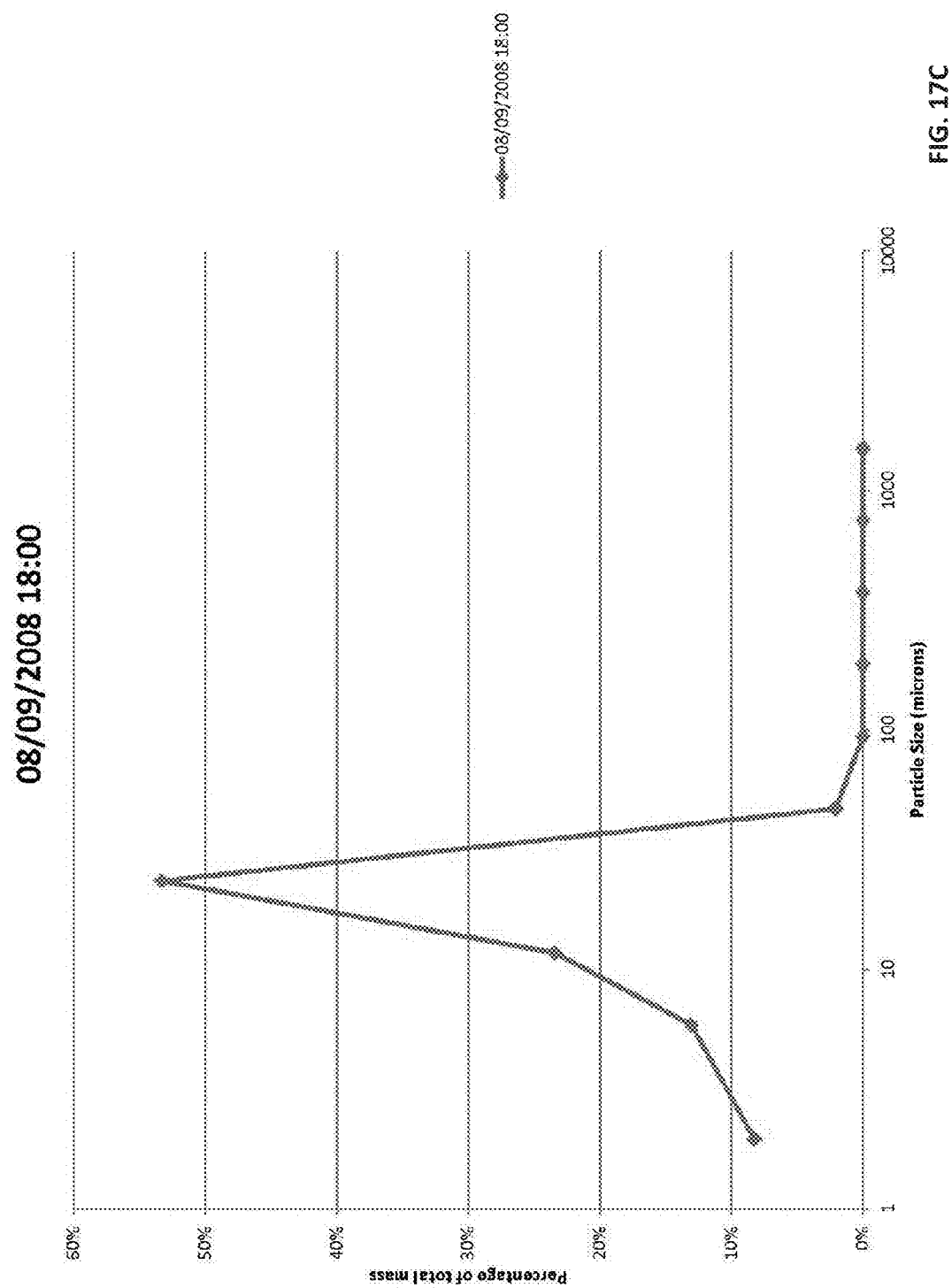
FIG. 17C shows WRF-Chem PSD.
Figure 17D:
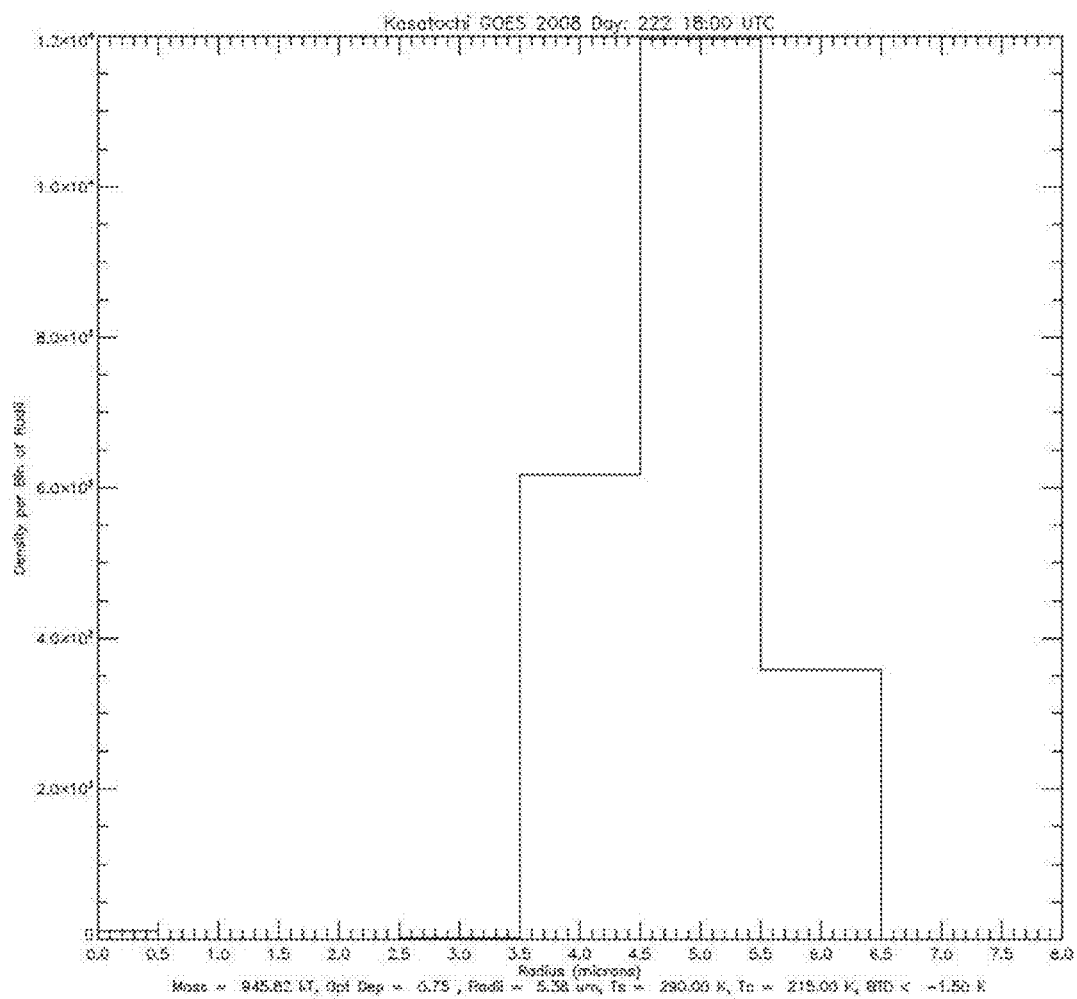
FIG. 17D shows VAR TIR effect radii distribution at 18Z on Aug. 9, 2008.
Figure 17E:
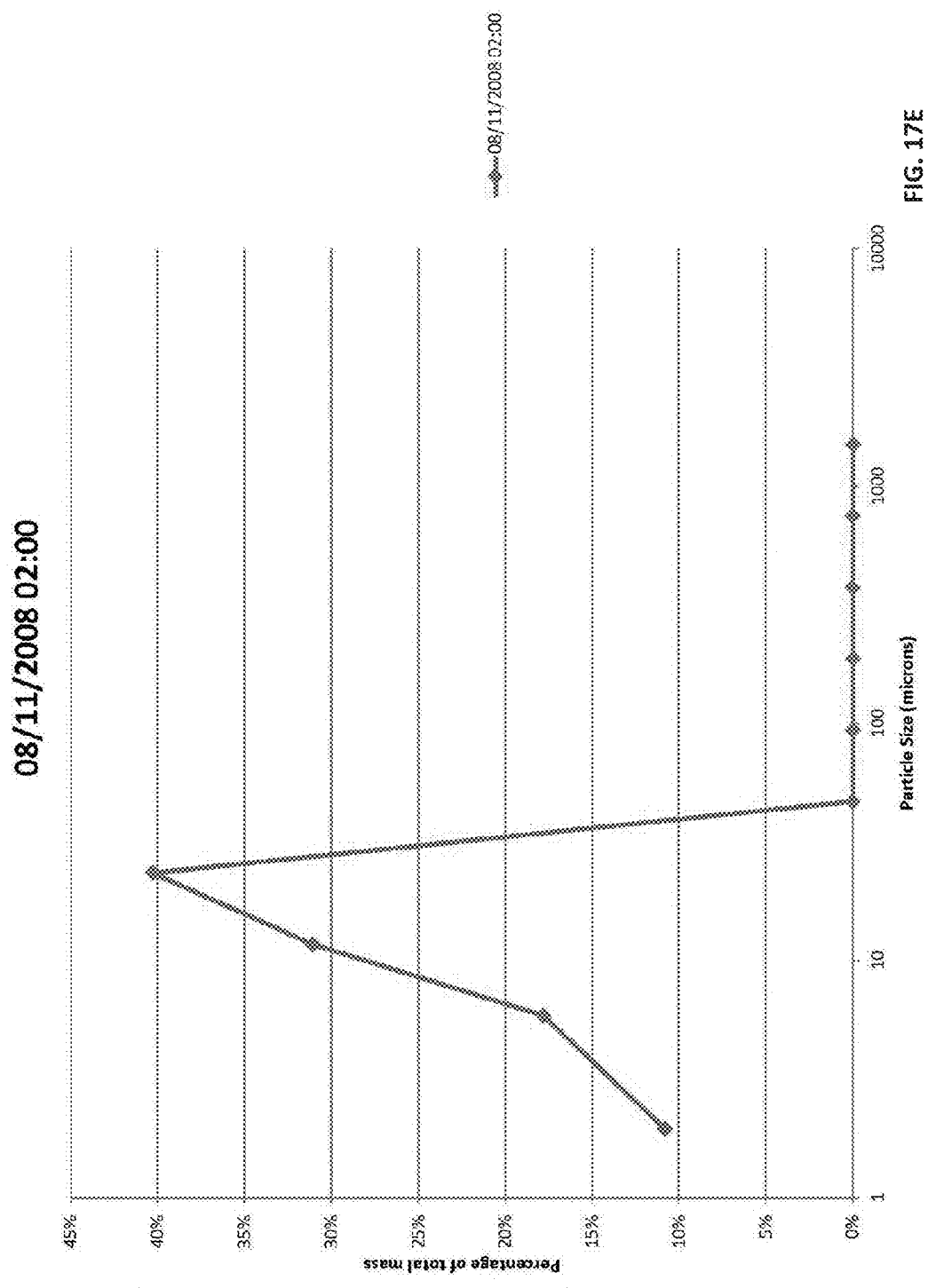
FIG. 17E shows WRF-Chem PSD.
Figure 17F:
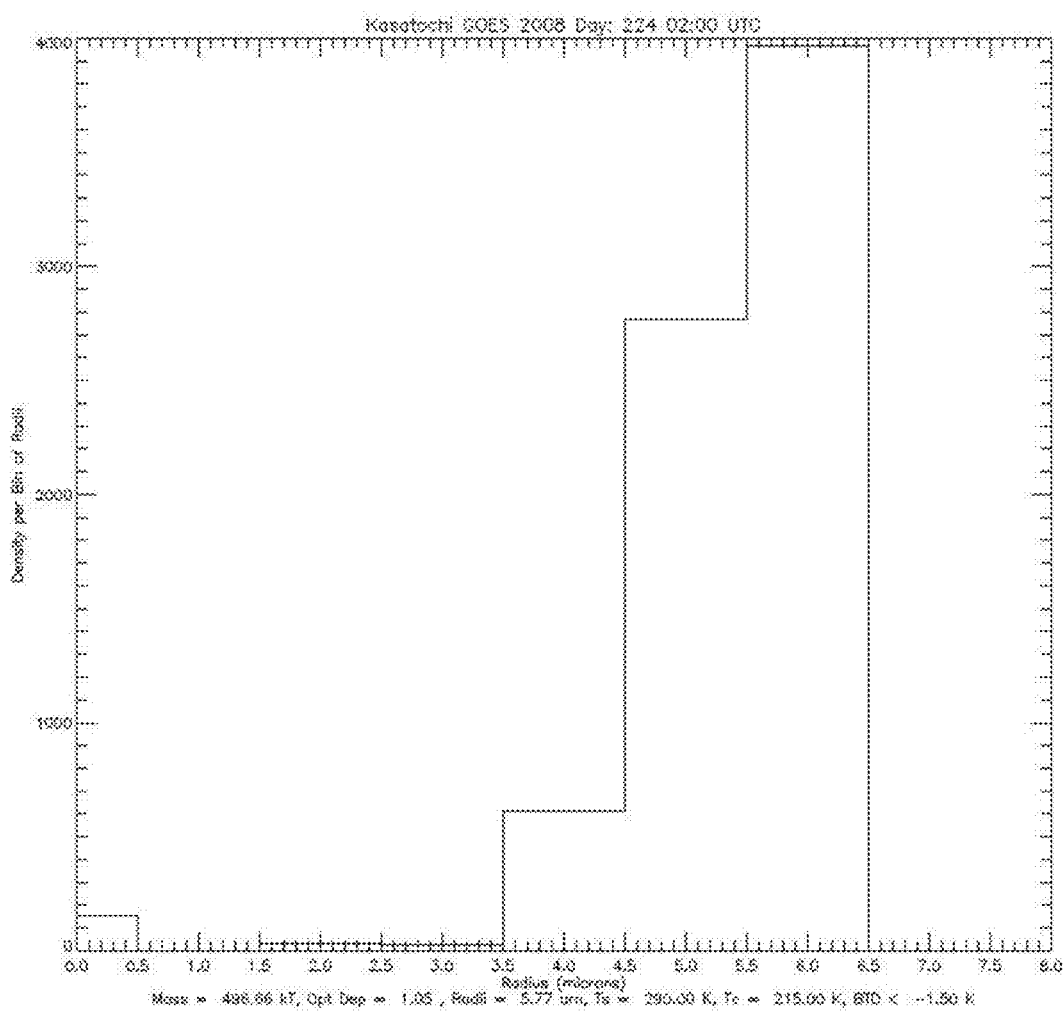
FIG. 17F shows VAR TIR effective radii distribution at 02Z on Aug. 11, 2008.

On Aug. 8, 2008, at 06Z, the image in FIG. 17A shows both coarse and fine ash content. FIG. 17A shows WRF-Chem PSD; FIG. 17B shows VAR effective radii distribution at 06Z on Aug. 8, 2008; FIG. 17C shows WRF-Chem PSD; FIG. 17D shows VAR TIR effect radii distribution at 18Z on Aug. 9, 2008; FIG. 17E shows WRF-Chem PSD; and FIG. 17F shows VAR TIR effective radii distribution at 02Z on Aug. 11, 2008. The mean particle concentration can be estimated to be 100 μm. The TIR image in FIG. 17B, for example, shows the volcanic ash retrieval with an effective particle size distribution around a mean of 6 μm. FIG. 17C and FIG. 17E can show that the larger ash particles do not contribute to the ash cloud image while the finer ash (less than 61.5 μm) can continue to dominate.

It is possible to mitigate the influence of the fine ash in the model if there is an understanding that fine ash in the model can skew the sampling. One example solution can be to convert the ash particle concentrations to an effective radii measurement, and then regenerate the synthetic image using this measurement. FIG. 17D and FIG. 17F show the results of the recalculated synthetic image, which can now be a better representation of the real particle size distribution within the ash cloud.

Figure 18A:
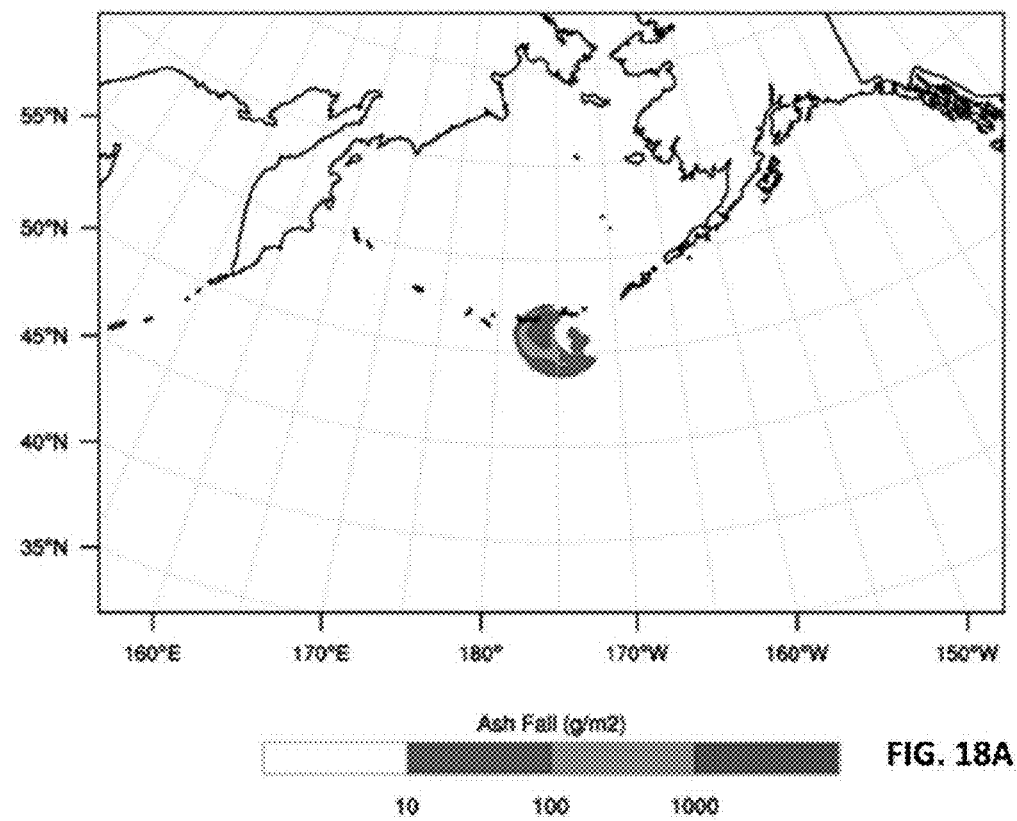
FIG. 18A shows ashfall from WRF-Chem on Aug. 8, 2008 at 08Z.
Figure 18B:
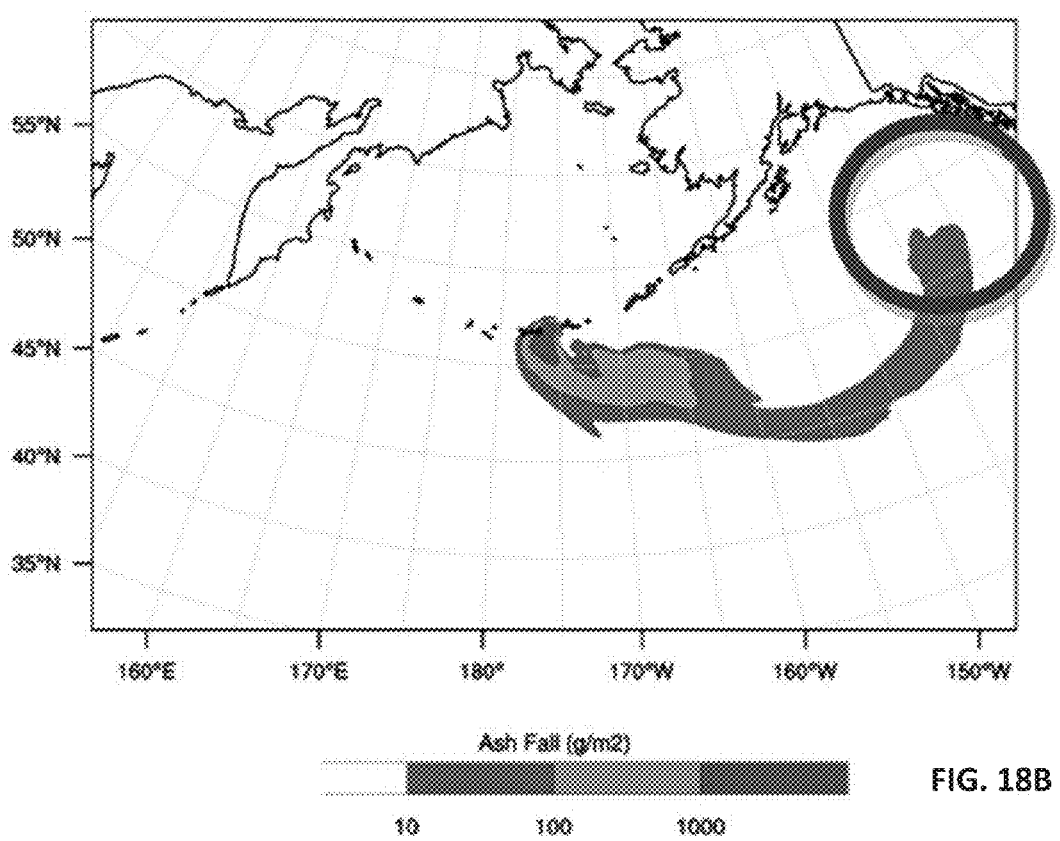
FIG. 18B shows Aug. 11, 2008 at 00Z.

Aside from the airborne ash, the location and amount of ash that will fall out from the cloud can be estimated. FIG. 18A shows ashfall from WRF-Chem on Aug. 8, 2008 at 08Z, and FIG. 18B shows Aug. 11, 2008 at 00Z. As the Kasatochi ash cloud drifted across the ocean, the forecast ashfall was initially confined to an area close to the volcano (FIG. 18A). The forecast shows that on August 11, ashfall had occurred over a large area of the northeastern portion of the Pacific Ocean (FIG. 18B). This observation corresponds with a large phytoplankton bloom observed in the same region of the Pacific, which has been posited to be a result of the ashfall.

The forecast model created with WRF-Chem can provide an interesting time-series of the total airborne mass. By way of example, there were three eruptions of Kasatochi, with the third eruption lofting an estimated 550 megatons of ash to an altitude of 18 km above sea level (ASL). As expected, the heavier ash can settle out first in the model, with ash of 62.5-125 μm size falling out of the atmosphere within twenty-four hours. The mid-sized ash of 31.25-62.5 μm can fall out within forty-eight hours. The finest ash of <15.6 μm, in one example, does not settle out over the modeled time, and likely remains aloft for many months.

Note that, in one aspect, WRF-Chem can lack a process to aggregate the fine ash. This means the model does not estimate how the finer ash clumps and then settles out of the air. This unaccounted aggregation can equate to less modeled fallout of ash. Lack of aggregation can be, in some aspects, a limitation of the WRF-Chem model and several other VATFD models, but aggregation can depend on the amount of water in the ash cloud.

Figure 19A:
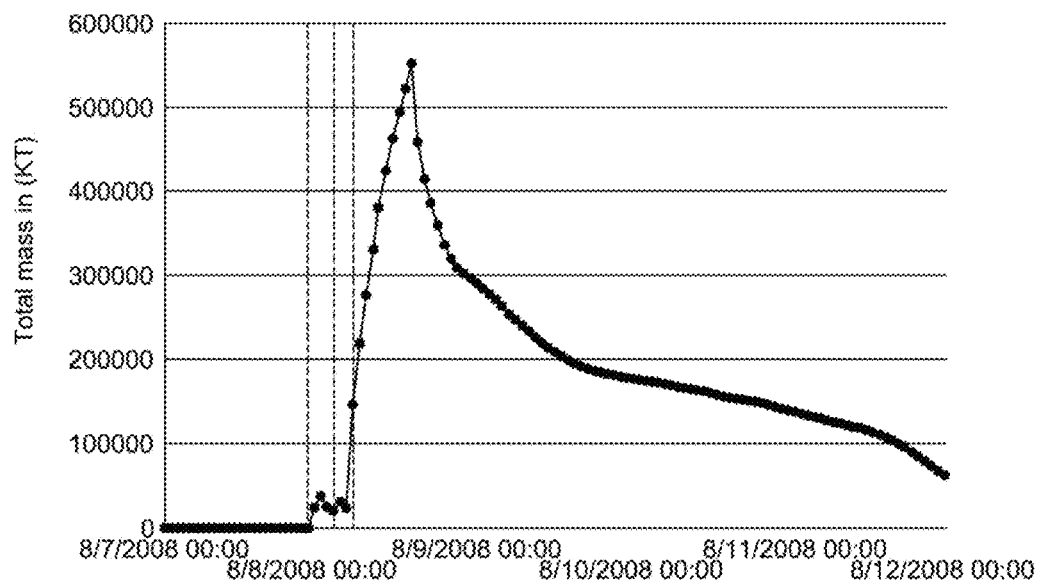
FIG. 19A illustrates plots of Total Mass with all bins combined from WRF-Chem for Kasatochi eruption.
Figure 19B:
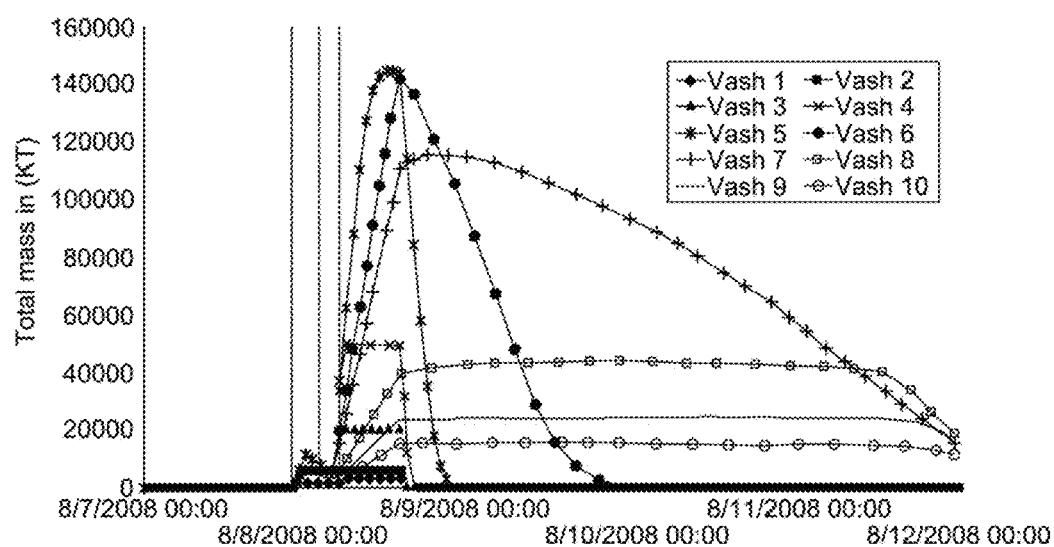
FIG. 19B illustrates plots of Total Mass shown per bin from WRF-Chem for Kasatochi eruption.

FIG. 19A and FIG. 19B show total mass from WRF-Chem for Kasatochi 2008. FIG. 19A shows all bins combined and FIG. 19B shows per bin. The time-series analysis of the volcanic ash between the synthetic image and the subsequent satellite images shows agreement, though the scales are off by a factor of ten (FIG. 19). The forecast can indicate airborne ash with a total mass of 550 megatons compared to the satellite values of 550 kilotons (FIG. 19A).

The scaling can be calibrated in the model by a factor of 0.01 for the S2-type eruption (FIG. 19B). In one aspect, the assumption can be made that the S2-type ESP chosen to represent the Kasatochi volcano is truly representative. Knowledge of the correct particle size distribution can be useful to produce the synthetic image from the 3D WRF-Chem forecast.

In one aspect, the eruption source parameters used to initialize the forecast model can be revised. For example, if the eruption rates are too high for the S2-type volcano or if the fine ash fraction is too small for the S2 eruption, then the eruption source parameters can be revised.

Figure 20A:
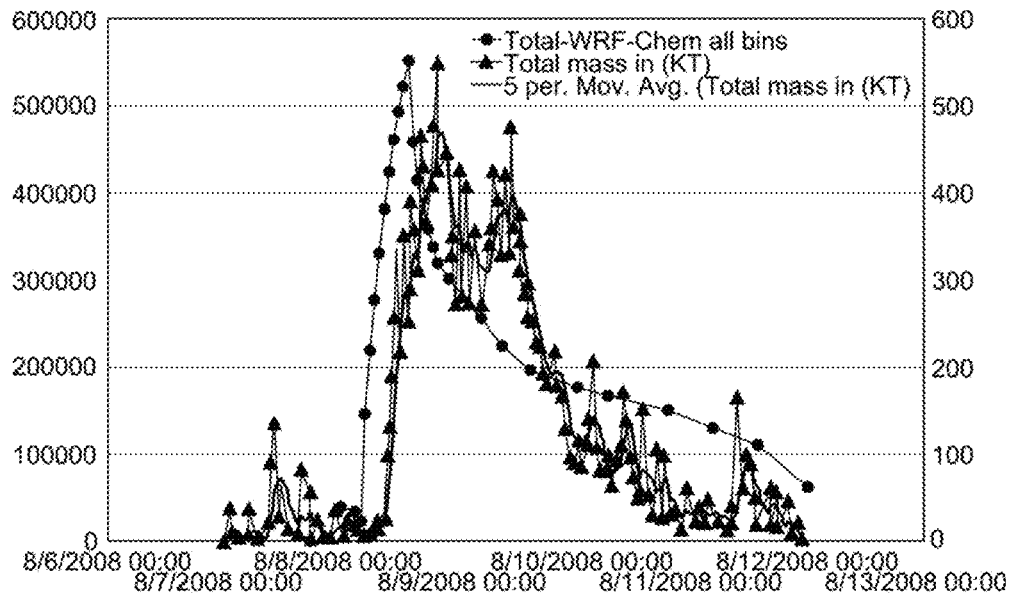
FIG. 20A shows a plot from a WRF-Chem model.
Figure 20B:
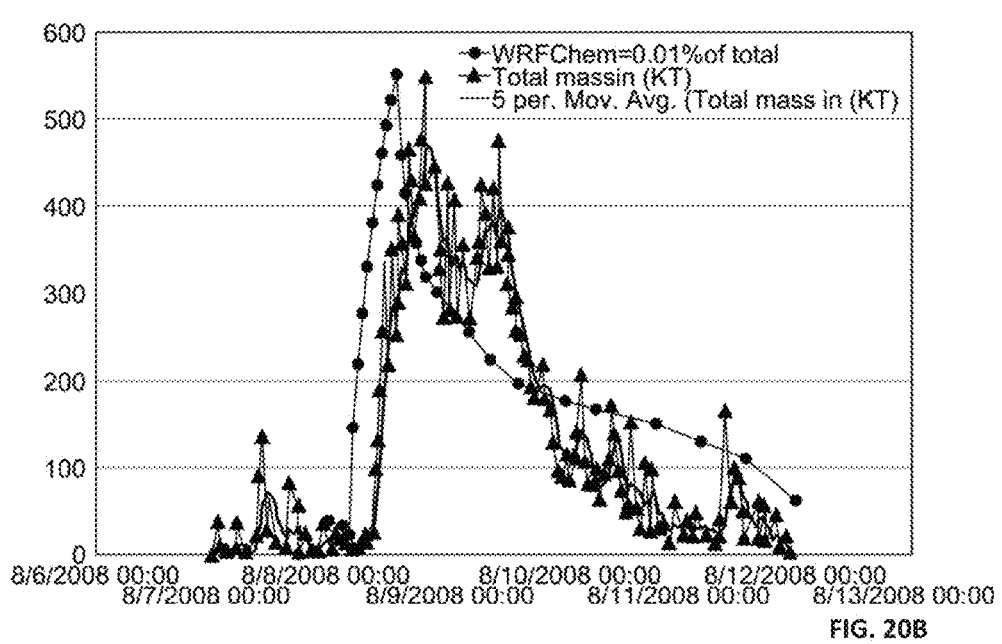
FIG. 20B shows a plot from GOES model.

FIG. 20 shows a comparison of mass measured from satellite to mass predicted by the Models (FIG. 20A shows a WRF-Chem model and FIG. 20B shows a GOES model scaled to match).

Additional data from the NASA Cloud-Aerosol LiDAR with Orthogonal Polarization (CALIOP) sensor on the Cloud-Aerosol LiDAR and Infrared Pathfinder Satellite Observations (CALIPSO) platform can be available. These sensors can be used to profile ash concentrations of ash at various heights. To further test the hypothesis that the synthetic image is a reliable abstraction of the 3D forecast model, CALIPSO data and the CALIOP data can be compared to the synthetic image. In one example, CALIPSO detected the ash cloud between 8-10 km above sea level. The 3D forecast shows the ash cloud at 7-12 km, with the greatest concentration a 9-12 km.

Figure 21A:
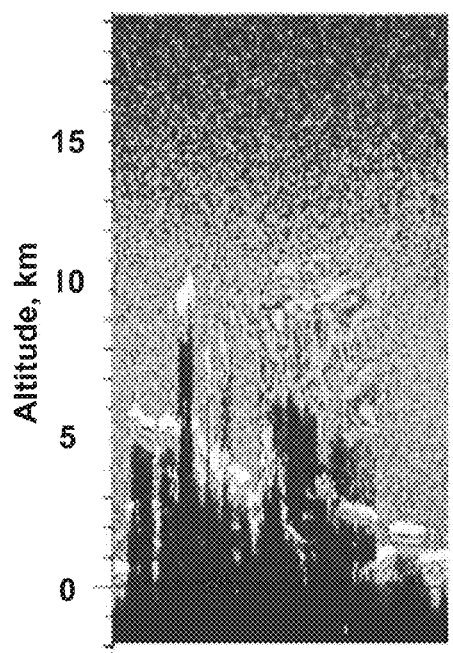
FIG. 21A shows CALIOP Data.
Figure 21C:
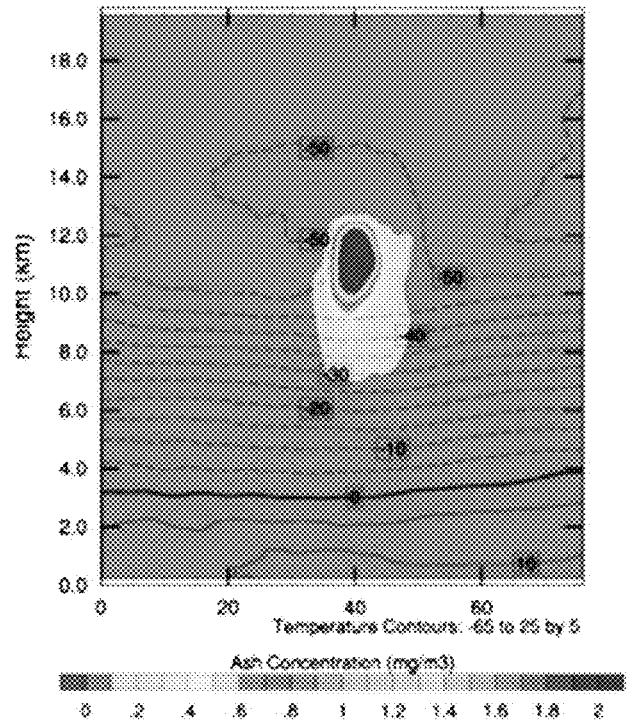
FIG. 21C shows a cross section of a particle cloud.
Figure 21B:
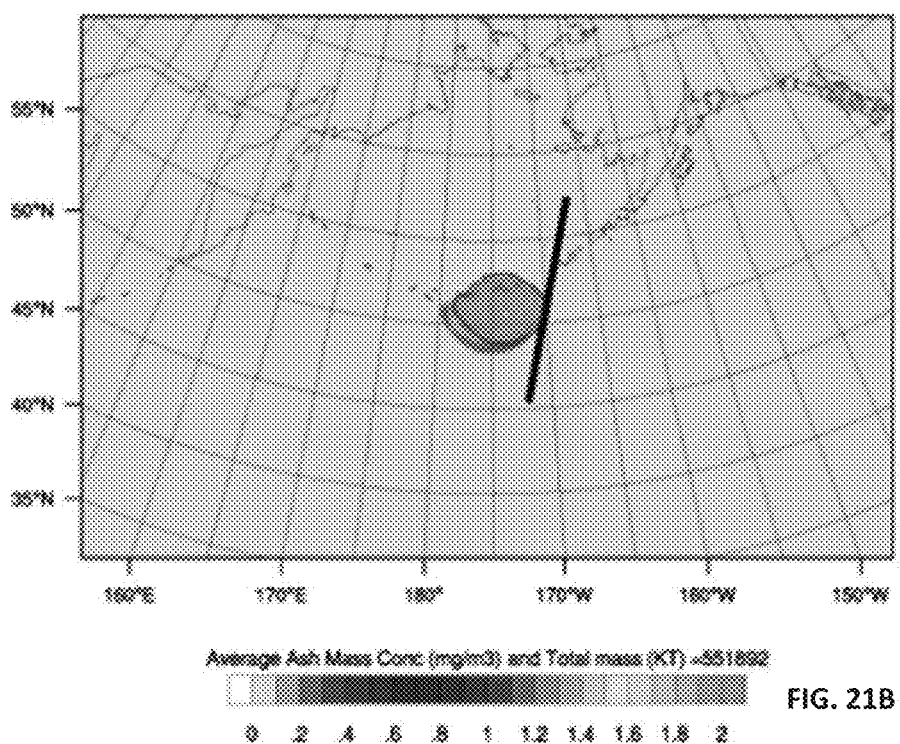
FIG. 21B shows WRF-Chem data.

FIG. 21A, FIG. 21B, and FIG. 21C show a comparison of data (FIG. 21A shows CALIOP Data, FIG. 21B shows WRF-Chem, FIG. 21C shows a cross section). In an aspect, a 2D synthetic image can be created from the 3D forecast model. The synthetic image can then be directly compared to the next satellite image to validate the accuracy of the forecast and make adjustments to the eruption source parameters. The validation process can confirm the accuracy of the ash cloud's spatial location and extent as well as the cloud height and ash concentration within the cloud.

The validation process can also indicate how sensitive the retrieval of ash data from the thermal infrared can be when attempting to model the ESP of eruption rate and particle size distribution. Many assumptions continue to be made when making volcanic-ash-retrieval calculations, especially those related to the scattering of the thermal radiation signal and the temperature differences between the ground and the top of the ash cloud.

In another aspect, the VAFTD model can be integrated with the numerical weather prediction data from the WRF portion of the forecast modeling and a synthetic image can be built. 3D characteristics of the cloud can comprise temperature, humidity, pressure, and water vapor, all of which are integral to WRF-Chem.

The availability and reliability of ESP data to initialize VAFTD models can in some respects be lacking ESP can be useful for an accurate forecasting, yet ESP also can be completely missing from the first moments of the eruption. Thus, in one aspect, VAFTD models can be initialized using ESP assumptions based on similar, historic eruptions.

Even if the ESP measurements were possible at the beginning and for the duration of an eruption, there are no established scientific metrics on how to collect and quantify them. Thus, ESP can been abstracted and generalized based on prevailing theories and assumptions regarding how they affect the VAFTD models.

Immediately after an eruption, VAFTD models can be initialized with estimated ESP. As data become available, such as single channel data and BTD data from TIR satellite imagery, the ESP can be adjusted. Estimated ash concentrations can then be included in the forecast. The next satellite image, as described earlier, can allow the model to be validated and calibrated with revised input parameters.

While the validation and calibration process is an advance in forecast accuracy, it is apparent that direct, in-situ, measurement of volcanic ash can provide better forecasts. However, there are no scientific standards related to the best method to sample and measure ESP.

Example eruption source parameters are listed below in Table 7. Also described are the methods currently used to estimate or measure the ESP. Each ESP can have its own effect on the accuracy of the VAFTD model's accuracy.

TABLE 7

ESP with Measurement Methods

| Source Parameter | Current method for measurement |
| --- | --- |
| Initial Plume height | Satellite remote sensing/local radar |
| Eruption rate | Conversion from maximum plume height via empirical methodology |
| Vertical structure of plume | Assumed to be a defined shape, generally uniform or Gaussian |
| Mass of erupted ash | From eruption rate and duration of the event |
| Duration of eruption | From seismic data recording onset and end |
| Particle size distribution | Assumed from volcanoes past history or ESP |
| Ash concentration | From plume vertical distribution and total mass |
| Aerosol Chemistry | Assumed given volcanoes historical activity and type |

Next example source parameters are discussed, including what can be useful for in-situ collection to better characterize each parameter for the VAFTD model.

In one aspect, can initial plume height (e.g., of a particle cloud, such as a volcanic ash cloud) can be measured. The initial plume height can generally, but not always, be measured from thermal infrared satellite remote sensing datasets, but radar can be used as an alternative. Locally available NEXRAD (next-generation radar) and Doppler radar can be used to measure the heights of recent volcanic ash plumes, namely Mt. Spurr in 1992, Mt. Augustine in 2006, Mt. Redoubt in 2009 (all in Alaska, USA) and Eyjafjallajökull (Iceland) in 2010.

Radio Detection and Ranging (Radar) systems, when close to the eruption, can make frequent and accurate measurements of the ash cloud's height. Minute-by-minute height measurements can be possible. At this rate, it can be possible to measure the evolution of the volcanic plume and its metamorphosis into an ash cloud.

TIR satellites can also be used to estimate volcanic plumes and ash cloud heights. For example, there can be many TIR sensors providing space-based measurements from AVHRR, MODIS, GOES, SEVIRI, and MTSAT, all of which can be used to derive the height of the initial plume top and to track the ash cloud.

TIR satellite data can derive the height of the ash plume top. This derivation can be done by integrating brightness temperature data with numeric weather prediction data. However, it has been shown that TIR derived heights can underestimate the true height where compared to MISR data, but an accurate measure of cloud opacity can be used if using TIR data is used for determining plume height determination.

Figure 22:
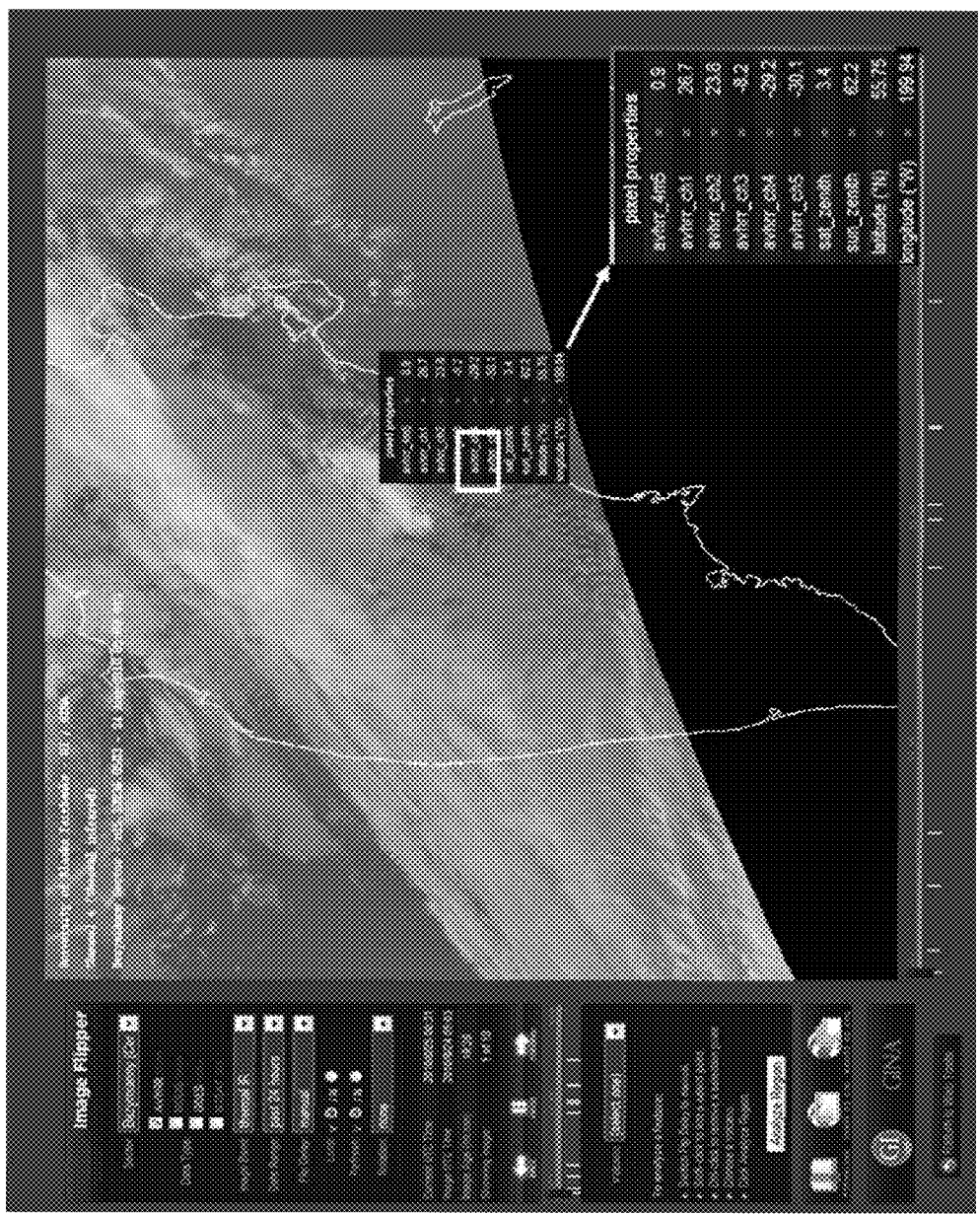
FIG. 22 illustrates plume temperature readings.
Figure 23:
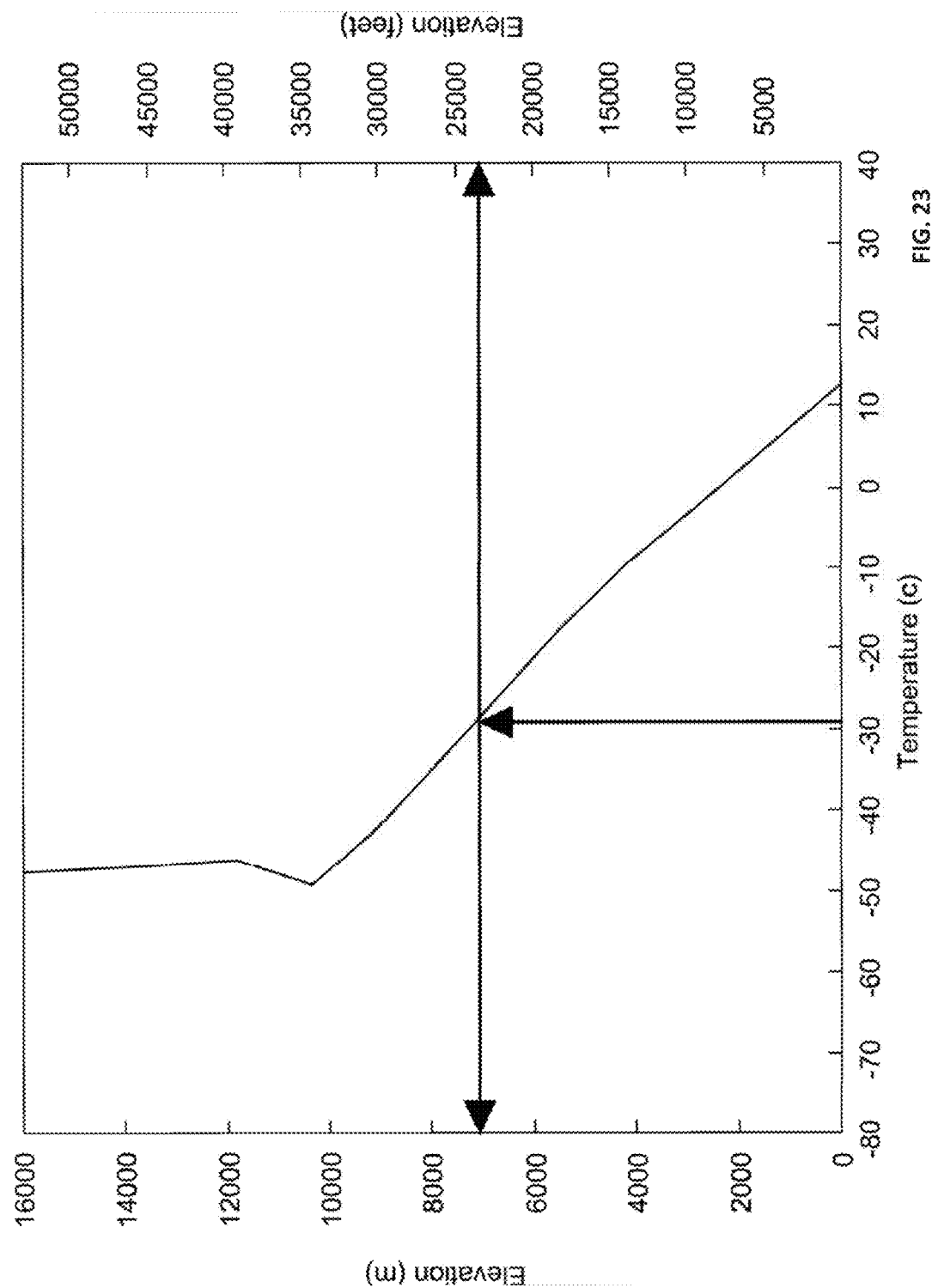
FIG. 23 illustrates height versus temperature readings.

FIG. 22 shows a measured cloud top height from satellite remote sensing data and FIG. 23 shows an example NWP profile indicating a temp of −30° C. at 7 km ASL. In-situ measurements of initial plume height at times, which corresponded to data collected from other methods, can allow for the comparison and validation of the globally applicable methods, like the TIR derived heights. This information can then be used to characterize the accuracies or inaccuracies in the TIR heights, resulting in improved accuracy of the VAFTD modeled ash concentrations.

An eruption rate parameter can be used for ash cloud forecasting because it can affect the calculation of the total mass from the eruption and, coupled with the particle size distribution, can have an effect on downwind ashfall forecasts. VAFTD models can employ an empirical relationship where the eruption rate is related to the measure plume height to the fourth power. Previously measured eruption rates and recorded maximum plume heights can be used to determine their relationships. Estimating eruption rates can be imprecise, and there is a 50% chance of having a factor of four error.

Recently, VAFTD models have been tied to one-dimensional height models to account for the stability of the local atmosphere. Example height models can comprise Plumeria and BENT. Local wind patterns can be an issue with the vertical structure of the cloud and can influence the way in which the eruption rate is derived. These methods can likely be more representative of the conditions that occurred during the volcanic event, but in-situ data can be helpful in determining whether or not these methods produce reliable and accurate eruption rates.

In-situ measurements of the erupting plume can be difficult and can be recorded close to the plume at frequent intervals, so that the rise rate of the erupting column can be measured. Calibration and validation of these recorded datasets with the column-height (one-dimensional, 1D) models can be useful and can be coupled to the VAFTD model simulations.

The in-situ data can be able used to assess the initial 1D model's ability to approximate the eruption rate. As in-situ data may not be available for all events, the modeled eruption rate from the Plumeria or BENT models can be used with the VAFTD models to simulate the ash cloud's downwind concentrations. An improved model for the eruption rate can then provide the VAFTD models with the inputs to simulate the downwind concentrations to a higher level of accuracy.

In an aspect, a vertical structure of the particle cloud can be determined. Determining of the plume's vertical structure and shape can help define the quantity of ash released at any altitude within the column. As vertical structure can be unknown for a volcanic event, several types of structure approximations can be used to initialize a VAFTD model.

One approximation method can comprise defining a 'shape' to the plume's initial vertical distribution. This shape can be (1) Uniform, i.e. ash masses are equally distributed in the vertical from the plume base to the top; (2) Exponential, e.g., the plume's ash mass increases in altitude from the base to the top; or (3) Gaussian, e.g., ash masses are defined to best approximate the typical large 'umbrella shape'. Each of these plume shapes is illustrated in FIG. 24.

Figure 24:
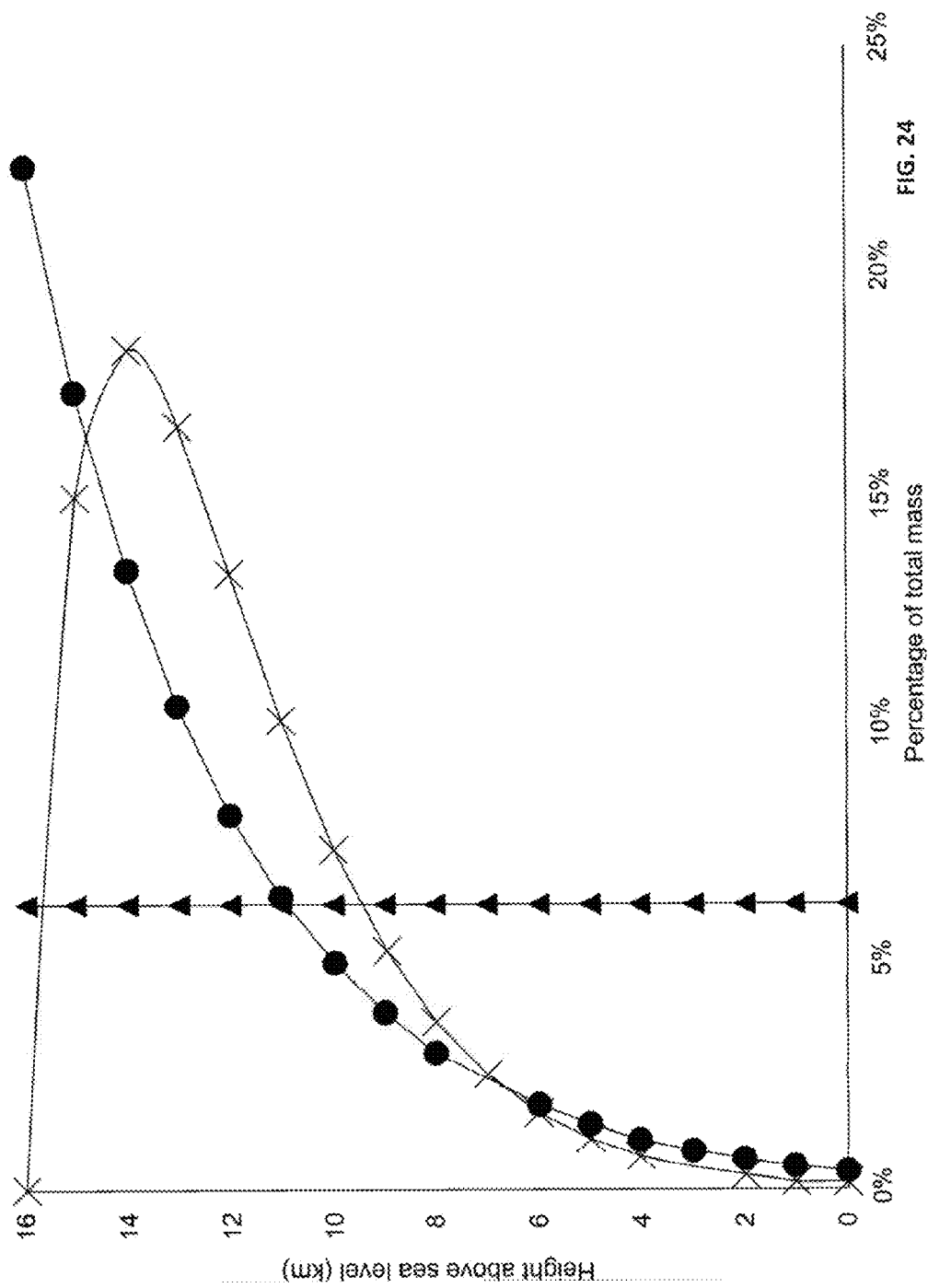
FIG. 24 illustrates a plot of initial mass of ash in VAFTD models using Uniform, Exponential, and Gaussian distributions.

The most appropriate of these distributions in FIG. 24 to use for each event can be assessed from the likely eruption rate or the altitude the cloud has reached. It can be shown, in comparing VAFTD models Puff and HYSPLIT, that when using the same wind fields and similar data for the other ESP parameters, the shape causes deviations in modeled plume. One example model, BENT, can account for the cross winds in determining the eruption rate, and can provide an approximation of the likely plume's vertical structure. This approximation can use inputs on the eruption including thermal flux to examine the plume rise. Given the local atmospheric conditions, it can then produce an approximation of the plume shape.

In-situ measurements can be used to determine a plume's initial structure. This ESP can then be incorporated into the initial VAFTD model forecast. Once satellite remote sensing is available, approaches known in the art can be applied to improve the assessment of the initial vertical structure. In-situ measurements coupled to the VAFTD model and initial plume structure can increase the accuracy of the VAFTD model simulation.

The mass of erupted ash can be a product derived from the eruption rate and duration of the event. Determining the eruption rate was described earlier. In-situ data at the vent can provide the calibration of the rates as well as validation of the modeling methodologies that can then be applied to the world's volcanic events. Event duration is described below and can link directly to the mass of erupted ash.

Event duration (e.g., duration of eruption) can come from ground-based sensors, such as seismological data streams, GPS sensors or infrasound equipment. The start and end of an event can be determined from the signals recorded at local sensors and these events can provide 'event duration.'

In-situ sampling can provide knowledge of the start and end of volcanic ash production, which does not always equate to the start and end of the seismic signal. Knowledge of the start and end of the ash-producing portion can be useful to produce the VAFTD modeled ash clouds for VAL-CAL analysis with the satellite data.

In one aspect, an event that is too long or too short can provide an inaccurate forecast by simulating too much or too little ash ejected into the atmosphere. In-situ sampling can determine if an event was ash producing, and can thus improve the forecast model. For example, it can be shown for the Sarychev eruption in 2009 that satellite TIR data was able to detect twenty-three events, but the MTSAT data was only available every thirty minutes. Thus, smaller events could have been missed. In-situ measurements of ash production can allow increased temporal frequency of event detection and as such can provide a better understanding of the individual events. This information can then be coupled to any local ground-based network to assess the in-situ sampling results.

In one aspect, a particle size distribution of the particle cloud can be determined. Until other data is available to calibrate or validate the model simulation, knowledge of the erupted particle size distribution (PSD) can be used for that first VAFTD model simulation once an event has occurred. Ignoring other interactions, the coarse sized particles (e.g., less than 125 μm) can settle out of the atmosphere on their own more quickly than the finer particles, if no other interactions are considered. Thus, the coarse ash fraction can be useful in creating accurate ash fall maps. Unless interacted upon by other processes such as water-interaction or particle aggregation that increases settling rates, finer grained particles will remain aloft longer than coarser grained particles. Therefore, knowing the proportion of the erupted mass in the full size distribution can help to accurately forecast airborne concentrations and fallout.

Figure 25:
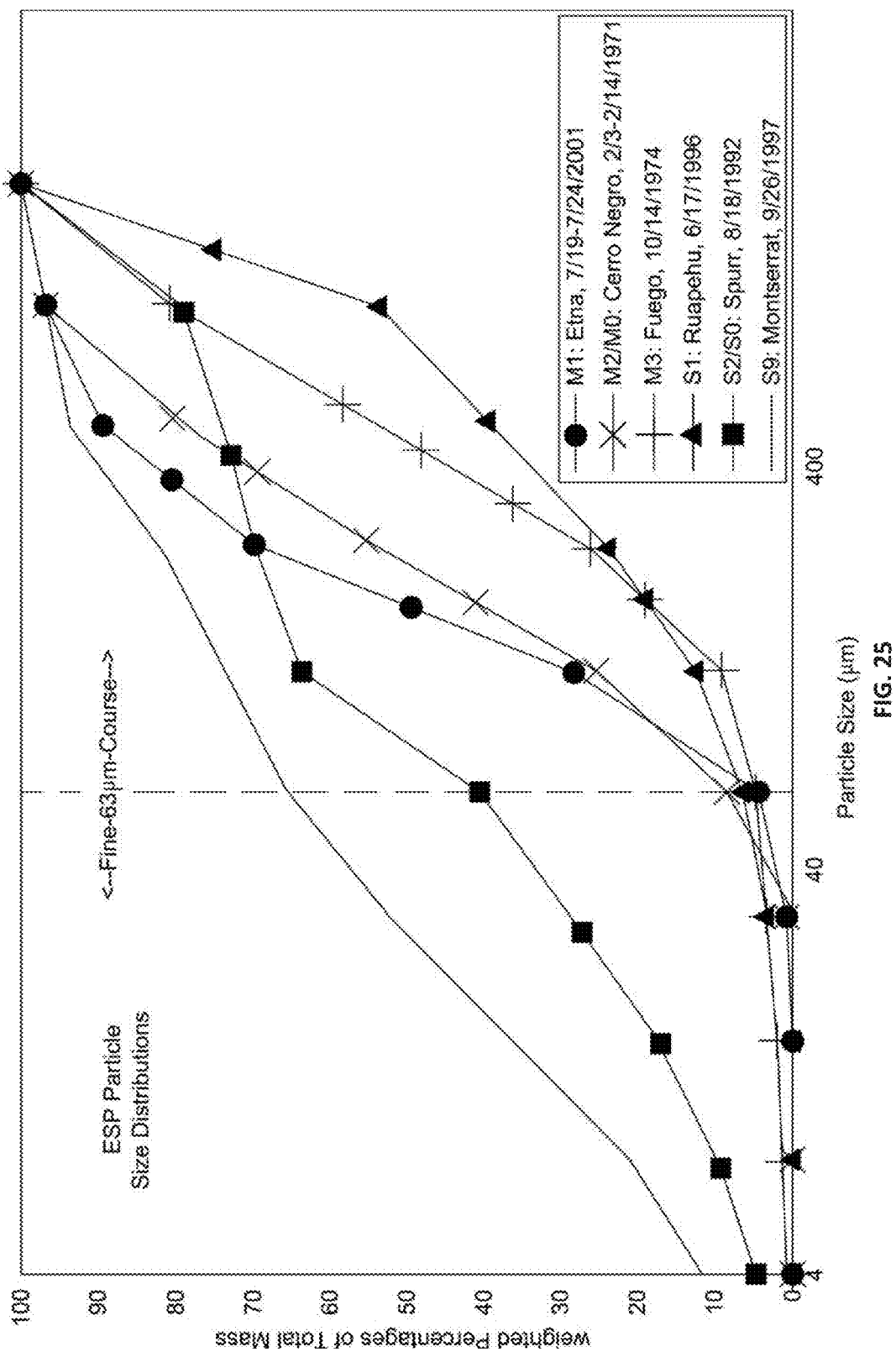
FIG. 25 illustrates particle size distributions.

VAFTD models can make use of a volcano's past history to produce its typical PSD or use a defined eruption source parameter PSD from past studies. Recent studies can show that the fine ash percentages downwind can be below 10% of the erupted mass. These studies used many months of analysis of data taken from observations from Eyjafjallajökull 2010 events crossing Europe to resolve this airborne percentage of the total mass. However, the distribution spectrum of ash size, from mm's to microns, can either use sampling of fallout and/or back calculations of the total erupted mass or direct sampling of the particle sizes and total mass taken from in-situ data. FIG. 25 shows how, for the different ESP type, the percentages in each particle size bin are distributed and how varied each initial ESP type is from another.

Measurements of the percentage of fine ash from in-situ data can provide more accurate assessments of initial particle size distributions. Once more data is available (e.g., data from satellite remote sensing), the VAL-CAL method can be applied and the proposal that 5-10% of the total erupted ash mass is fine ash can be tested. However, along with the percentage of fine ash, the eruption rate and the duration can also be useful metrics. These elements all can each complement the other if VAFTD models can be used to produce accurate downwind concentrations.

The assumption can be made that the percentage of fine ash used by a VAFTD model is from the S2 type, or 40% as shown in FIG. 25. If the eruption rate is then overestimated by a factor of 2, and if the percentage of the erupted mass in the fine ash bins can be reduced by the same factor (e.g., now 20% and not 40%), the same downwind concentrations from the correct eruption rate and original ESP percentage of 40% can be produced. In-situ data can assist to find the full PSD as well as calibrate the eruption rate methods.

In one aspect, ash concentration of the particle cloud can be determined. The ash concentrations parameter for VAFTD models can relate to the vertical shape or vertical distribution as well as the particle density. The significance of the ash concentration in the plume can be more apparent when wind shear, or variations in wind speed and directions, occurs within the column. Accurately propagating the ash cloud in the numerical weather prediction data can become possible if the vertical concentrations in the plume are known. Inaccurate vertical structure or concentrations can provide inaccurate model simulations. When a VAL-CAL can be performed, the VAL-CAL can improve accuracy of the downwind ash concentrations. In-situ measurements of these vertical concentrations throughout the full column can then assist in the creation of a representation of the initial plume structure in the VAFTD model simulation.

In an aspect, aerosol chemistry of a particle cloud can be determined. As a volcanic plume develops, the volcanic ash can be one of several materials emitted from the erupting volcano. Multiple volcanic gases can explosively enter the atmosphere, including magmatic water, sulfur dioxide, carbon dioxide, and many other chemical species. These volcanic gases can affect the VAFTD model, but most models do not account for the interaction among the different chemical species.

Atmospheric water and its interaction with the ash can be a major factor in determining the wet deposition of the ash as it transports downwind. In some aspects, the erupted magmatic water and other volcanic gas species are not represented in VAFTD models. The result can be that the ash particle size, concentrations, and strata at various heights cannot be properly forecast.

These erupting gases can affect proximal ash fallout as well as on the eruption rate that results in the recorded plume height. Higher magmatic water content, as shown in Table 8, can affect the relationship between measured plume height and eruption rate.

TABLE 8

Plumeria Model Maximum Heights as compared to prior data (1997) relationship

| Water content (%) | Eruption rate (kg/s) | Calc. height (Plumeria) | Cal. height from prior data (1997) |
|---|---|---|---|
| 0 | $4.79*10^6$ | 13.503 | 11.96 |
| 10 | $1.70*10^6$ | 11.419 | 9.46 |
| 20 | $1.61*10^6$ | 12.375 | 9.61 |
| 30 | $2.08*10^6$ | 0.778 | 10.55 |
| 40 | $2.82*10^6$ | 0.662 | 11.69 |

Table 8 shows that when the magmatic water content varies within the eruption plume, the potential eruption rate to plume height method can be unpredictable. This uncertainty can be represented in the initial source parameters, which in this example uses 100 m vent, 100 m/s output velocity, 900° C. magma, 3% weight of gas, and standard atmosphere.

In-situ measurements of the magmatic water content as well as of the other volcanic gas species can assist in developing more accurate ESP for the VAFTD models and can also assist in the VAL-CAL analysis of the satellite BTD data. Water content of ash clouds can have an effect on the BTD methodology, as the water will 'coat' the ash particles. The wetted ash produces a very different BTD map from remote sensing data than if the ash was fine and dry. When performing the VAL-CAL analysis, knowledge of the water content of the erupted cloud can improve the modeling of the cloud as well as the likelihood of the satellite BTD maps being masked out from ash detection.

In one aspect, parameters related to a cross-correlation of ESP can be determined. All of the parameters presented here can be useful in fully understanding the initial plume development and can have an effect on the downwind concentrations of the ash cloud. Many of the parameters can be cross-linked, e.g., inaccurate knowledge of one will degrade the estimates of other parameters. Similarly, if in-situ data is available, then the recorded data can provide improved knowledge of not only the measured parameter but also the cross-correlated parameter.

Figure 26:
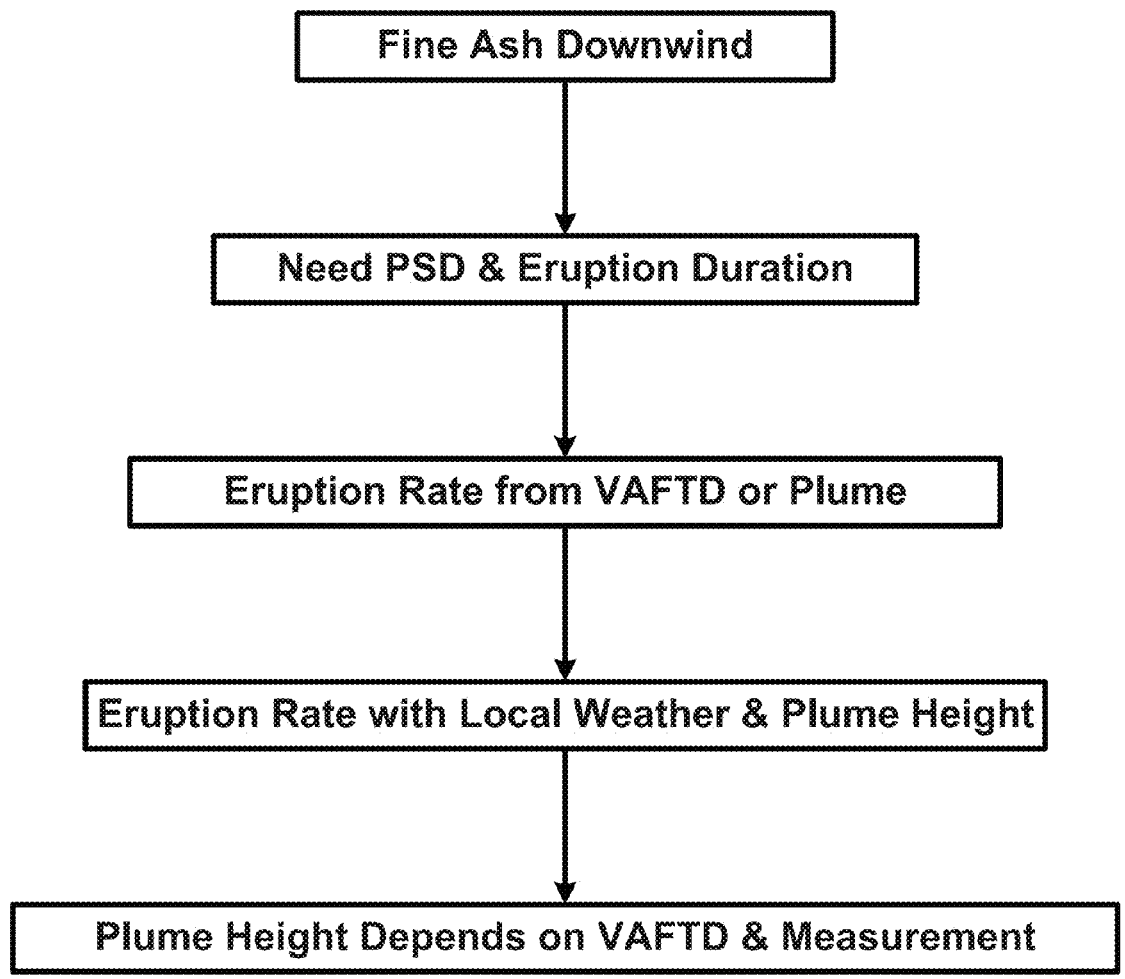
FIG. 26 illustrates a flow chart demonstrating how parameters are related.

The way in which different parameters are related becomes apparent upon examining them, as shown in FIG. 26. The full particle size distribution (PSD) can be used to forecast downwind airborne ash concentrations and to accurately map ash fall.

In an aspect, in-situ measurement of ash concentrations can improve the accuracy of a forecast model. Additionally other measurements can be useful, such as: (1) event duration; and (2) vertical distribution of the ash. The duration can be determined from seismic data, and in-situ measurements can assist in determining the start and end time of ash emission. Measurements of vertical distribution can be useful in improving accuracy if wind shear exists throughout the vertical column. If there is wind shear, knowledge of the location of the highest ash concentrations will then be used for accurate ash cloud simulations. In-situ measurements of these inputs can contribute greatly to model forecast accuracy. The different VAFTD models and the importance of the eruption source parameters as model inputs to forecast an airborne ash cloud are described. The forecast models can comprise the two-dimensional location of the ash cloud as well as the three-dimensional characteristics of the ash cloud's temperature, ash size, and ash concentration.

Each eruption source parameter can introduce uncertainties into the forecast and the errors of the parameters can be propagated through the model. Most of the parameters can be inherently linked, and poor input values can exaggerate forecast error.

In an aspect, the present methods and systems can comprise representing 3D parameters in a 2D synthetic image. The purpose of the synthetic image can be to allow the comparison of the forecast with the next available satellite image, comparing the satellite image to synthetic image in order to validate the forecast's accuracy. Validation can be performed by comparing the satellite image to the synthetic image. In some aspects, the satellite imagery can disagree with the forecast of the ash cloud, and when there are differences observed, the forecast model can be calibrated, improving the accuracy of the next forecast.

Validation and calibration can comprise iterative image validation and forecast calibration and can improve the accuracy of the VAFTD models. The validation/calibration technique can be applied to all VAFTD models. The accuracy of the forecast models can be improved (e.g., doubled) with the first validation/calibration process.

The present methods and systems can be proven with a WRF-Chem model. In one aspect, a WRF-Chem can be used, at least in part, because the model can provide a chemical aerosol model and the model can comprise an integrated numeric weather prediction data integrated, unlike the other VAFTD models.

There are at least another ten VAFTD models to which the VAL-CAL technique can be applied. For example, the HYSPLIT model can likely be the choice of the US Air Force Weather Agency and future development should be first focused on that VAFTD model.

In-situ measurements of many of the eruption source parameters can greatly assist in improving the accuracy of the VAFTD model forecasts. Satellite remote sensing can be a useful substitute for in-situ sampling. Defining the eruption rate, duration of the event and the fine ash percentage can provide the VAFTD models with the useful inputs to improve their model simulations for downwind ash concentration. Once more data is available, a VAL-CAL approach can then be possible and the VAFTD model can be updated and/or adapted to again improve the forecast.

In-situ measurements can provide improvements to the VAFTD model simulations and can calibrate several of the methods used to estimate the input parameters. Calibrating the methods for determining eruption rate from plume height and local conditions can be achieved, by providing actual eruption rate measurements with recorded plume height, and this callibration can allow these eruption rate estimation methods to be more accurately applied across all volcanic events.

As the cloud disperses downwind, in-situ measurements can then be used as a VAL-CAL dataset to further improve the modeled ash cloud concentrations. Many of the VAFTD model inputs can be linked and hence in-situ measurements of particle size, ash concentrations and, where possible, plume height and eruption rate can be useful for improving VAFTD model forecasts.

An example mass size discriminator (MSD) can comprise an MSD designed by Polartronix. The MSD can be an optical device that can calculate the amount of ash and the size of the ash particles. The immediate use of the MSD can be to perform in-situ ash measurements, perhaps using unmanned aerial systems. The present methods and systems can benefit greatly from the MSD sensor on an unmanned aerial system. Another application can comprise the MSD sensor mounted on aircraft to determine a maintenance schedule based on encounters with ash. This configuration could also be used to notify aircrews if there are safety issues during these ash encounters.

Figure 27:
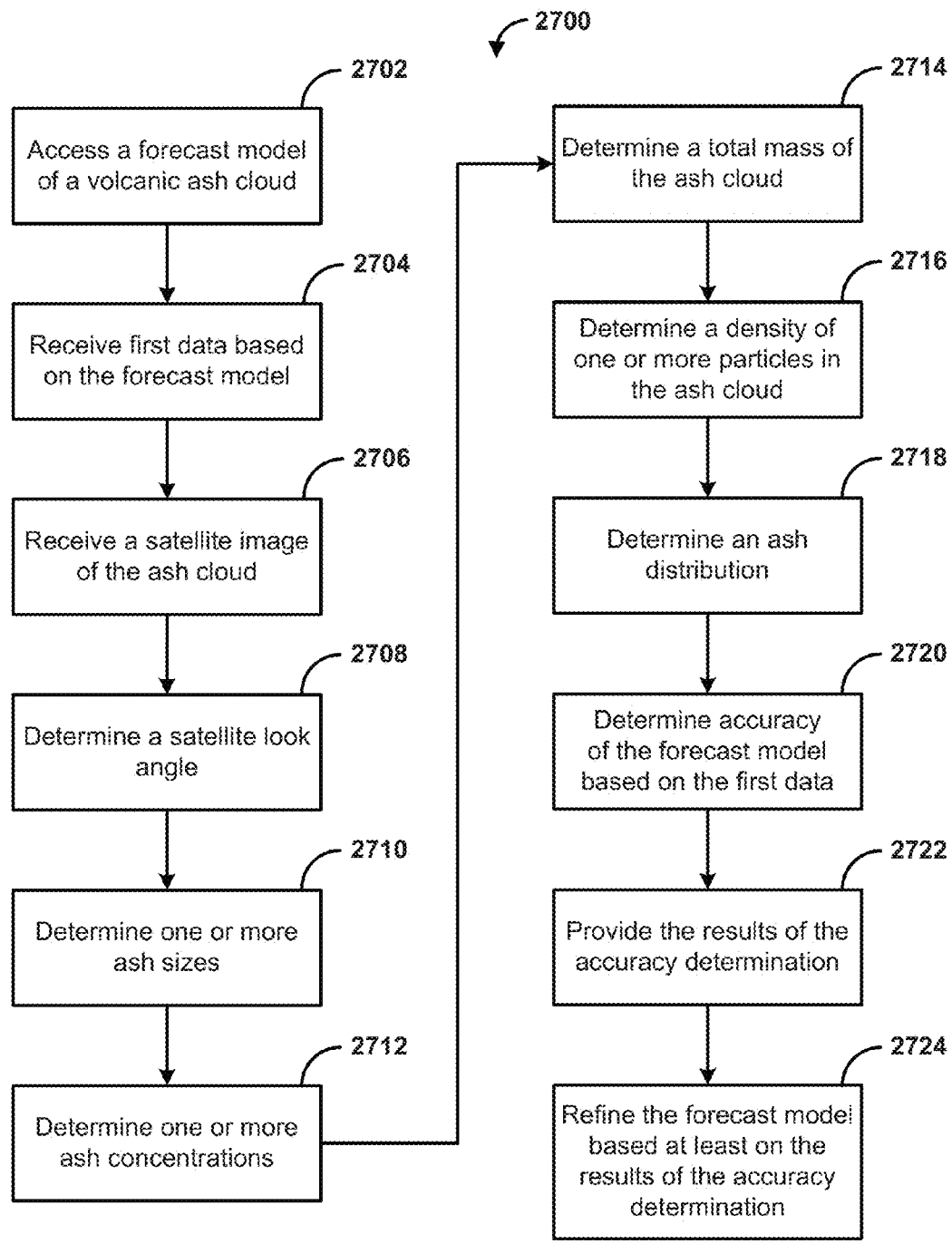
FIG. 27 illustrates a flow chart of a method of analyzing weather activity.

FIG. 27 is a flow chart illustrating a method 2700 for analyzing weather activity. A step 2702, a forecast model of a volcanic ash cloud can be accessed. Accessing the forecast model can comprise generating the forecast model of the volcanic ash cloud. Accessing the forecast model can comprise receiving (e.g., from a local or remote device) the forecast model of the volcanic ash cloud. In one aspect, the forecast model can comprise three spatial dimensions. For example, the forecast model can comprise a volcanic ash forecast transport and dispersion model. At step 2704, first data can be received based at least on the forecast model. For example, the first data can be generated based on at least the forecast model. In one aspect, the first data can have at least one fewer spatial dimension than second data associated with the forecast model. For example, the first data can comprise only two spatial dimensions. As an illustration, the first data can comprise an image.

At step 2706, a satellite image of the volcanic ash can be received. For example, the satellite image can be taken from a satellite in geosynchronous orbit, polar orbit, and/or the like. The satellite image can be an image from an optical sensor, infrared sensor, and/or the like. For example, the satellite image can be an image from a thermal infrared sensor. At step 2708, a satellite look angle can be determined. In one aspect, the satellite look angle can be determined based on the position of the satellite, orbit of the satellite, distance of the satellite from a measuring point (e.g., ash cloud elevation) and/or the like.

At step 2710, one or more ash sizes can be determined. For example, the one or more ash sizes can be determined at one or more altitudes. As another example, the one or more ash sizes can be determined based on the satellite look angle. At step 2712, one or more ash concentrations can be determined. The one or more ash concentrations can be determined at one or more altitudes. As another example, the one or more ash sizes can be determined based on the satellite look angle. At step 2714, a total mass of the volcanic ash cloud can be determined. At step 2716, a density of one or more particles in the volcanic ash cloud can be determined. At step 2718, an ash distribution can be determined. For example, the ash distribution can be a vertical ash distribution, horizontal ash distribution, and/or the like. The ash distribution can determine the location (e.g. elevation, geolocation) of various parts (e.g., top, bottom, side) of a volcanic ash cloud. In one aspect, the ash distribution can be determined based on the satellite look angle.

At step 2720, accuracy of the forecast model can be determined. Accuracy of the forecast model can be determined based at least the first data. Accuracy of the forecast model can be determined based at least on information associated with a volcano. For example, the information associated with the volcano can comprise a geochemistry of the volcano, an eruption rate of the volcano, and/or the like. In another aspect, accuracy of the forecast model can be determined based at least on measurements of at least a portion of the volcanic ash cloud. For example, accuracy can be determined based on a comparison of at least a portion of the first data and the measurements of at least a portion of the volcanic ash cloud. Measurements of at least a portion of the volcanic ash cloud can comprise at least a portion of the satellite image, the one or more ash sizes, the ash concentrations, the total mass of the ash cloud, the satellite look angle, the density of the one or more particles in the ash cloud, the ash distribution, and/or the like. In one aspect, the measurements can be obtained from RADAR, LiDAR, an optical sensor, infrared sensor, a dropsonde, an unmanned aircraft, a weather balloon, and/or the like. For example, steps 2710, 2712, 2714, 2718, and/or the like can be performed based on measurements and/or data from RADAR, LiDAR, an optical sensor, infrared sensor, a dropsonde, an unmanned aircraft, a weather balloon, and/or the like.

At step 2722, results of the determining the accuracy (accuracy determination) of the forecast model can be provided. For example, the results can be provided to a local device, remote device, to another application, to another portion of the same application performing the accuracy determination, and/or the like. The results can comprise a difference between one or more values, parameters, and/or the like. The results can indicate a suggested value and/or parameter to update. The results can indicate a suggested updated value and/or parameter.

At step 2724, the forecast model can be refined based at least on the determined accuracy, thereby improving a representation of the volcanic ash cloud. For example, one or more parameters of the forecast model can be updated, changed, added, or otherwise modified based on differences between the forecast model and the measurements of at least a portion of the volcanic ash cloud. In one aspect, refining the forecast model can comprise changing one or more ash sizes in the forecast model. In another aspect, refining the forecast model can comprise changing one or more ash concentrations in the forecast model.

Figure 28:
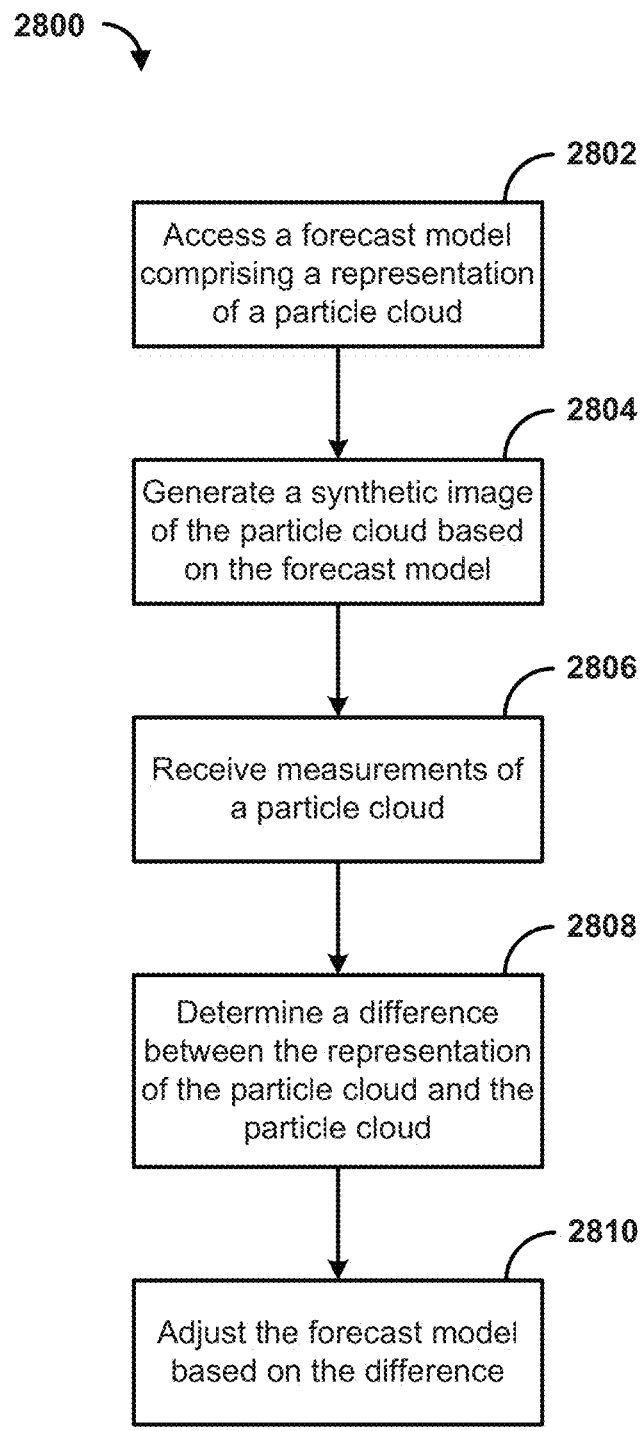
FIG. 28 illustrates a flow chart of a method of validating model predictions.

FIG. 28 illustrates a flow chart of a method 2800 of validating model predictions. At step 2802, a forecast model (e.g., three dimensional forecast model) comprising a representation of a particle cloud can be accessed. For example, the forecast model can be indicative of (e.g., comprise a model of) least one of volcanic ash, fire smoke, industrial pollution, natural pollution, explosions, aerosols and meteorological events.

At step 2804, a synthetic image (e.g., two dimensional synthetic image) of the forecast model can be generated. The 2D synthetic image can be generated based on the forecast model. In one aspect, the 2D synthetic image can be generated based on a time parameter. For example, the forecast model can comprise a time parameter indicating a time at which the particle cloud is represented. The forecast model can indicate information (e.g., location, density, concentration, particle size, and/or the like) about the particle cloud for a time specified by the time parameter. The information about the particle cloud can vary over time. Thus, different time parameters can be indicative of different information about the particle cloud.

At step 2806, measurements of the particle cloud can be received. The measurements can be associated with (e.g., made at, within a range of) a time indicated by the time parameter. Receiving measurements can comprise calculating at least one of particle size, particle density, particle concentration, particle altitude, total particle mass, water content and cloud profile based on the synthetic image. Receiving measurements can comprise using at least one of RADAR, LIDAR, satellite imagery, satellite remote sensing, infrared (IR) reverse absorption, brightness temperature differencing, visible spectrometry, infrared spectrometry, and in-situ sensing by at least one of balloon, unmanned aerial vehicle, dropsonde, rocket power aircraft, electrically powered aircraft, air breathing engine aircraft, and/or the like. In one aspect, infrared spectrometry can be used to measure a brightness temperature to reduce the amount of normal atmospheric water clouds included in generating measurements. In another aspect, IR reverse absorption can be used to measure particle size, particle density and total particle mass. In one aspect, receiving measurements can comprise receiving satellite imaging from a plurality of look-angles and calculating a vertical height of the particles.

At step 2808, a difference can be determined (e.g., calculated) between the between the representation of the particle cloud and the particle cloud based on the measurements and the synthetic image. Determining the difference can comprise comparing a 2D satellite image made at a selected time to the synthetic image.

At step 2810, the forecast model (e.g., values, parameters, equations of the forecast model) can be adjusted (e.g., modify, change, delete, add, update) based on the difference between the representation of the particle cloud and the particle cloud.

Figure 29:
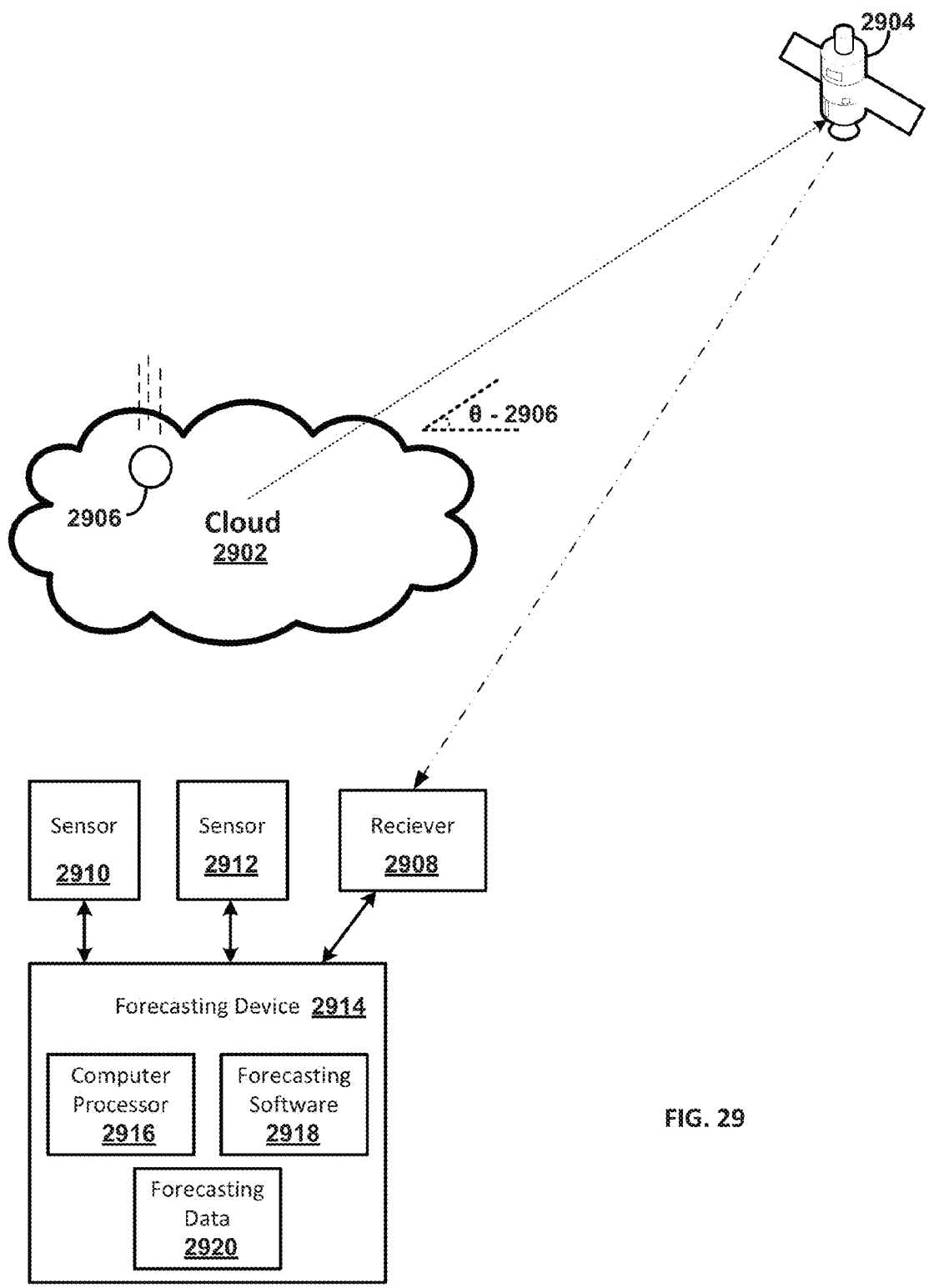
FIG. 29 illustrates a schematic of the measuring devices and interfaces with a computer.

FIG. 29 is a block diagram illustrating a system 2900. A particle cloud 2902 is examined by a satellite 2904, which is at an angle 2906 to the cloud, which is called the look angle. In one aspect, the look angle can be the angle between the ash cloud and the satellite 2904. By way of example, a satellite 2904 directly above the center of the ash cloud can be at a look angle of approximately 90 degrees, but a satellite closer to the horizon can have a smaller look angle, for example, of approximately 10 degrees based on the position of the satellite. Additionally, other coordinate systems can be used to define the look angle. When the satellite 2904 is not directly overhead, the images of the object taken by the satellite 2904 can be foreshortened or elongated by the look angle. In one aspect, variations in the image data caused by different look angles 2906 can be compensated for by mathematical operations. In one aspect, the look angle 2906 can be calculated based on position data received from the satellite. For example, the satellite 2904 can send ephemeris data indicating the position of the satellite 2906 at the time the image was taken. In aspect, the satellite 2904 can receive data related one or more portions of the cloud 2902. These portions can later be combined or otherwise analyzed together so as to provide an overall representation of the cloud 2902. In one aspect, the satellite 2904 can provide satellite data to a receiver 2908. The receiver 2908 can comprise a satellite receiver, wireless receiver, and/or other receivers. For example, the receiver 2908 can receive data from other sensors such as weather balloons, dropsonde or one of many other types of sensor.

The receiver 2908 can provide data (e.g., by wire, RF, other well-known methods) to the forecasting device 2914. The forecasting device 2914 can comprise a computer, having one of more computer processors 2916. The forecasting device 2914 can comprise forecasting software 2918. The forecasting device 2914 can comprise forecasting data 2920, which can represent data obtained at various prior times. As an example, the forecasting data 2920 can be compared with data from the receiver 2908 to provide a difference between forecast and data, and the difference may be used to improve the forecasting software 2918 for future forecasts.

Using the disclosures above a method of rapidly validating the accuracy of forecasts, for example, of a VAFTD model can be performed. The method can comprise generating a two-dimensional synthetic image of the predicted three-dimensional volcanic ash characteristics, and then differencing the synthetic image against the next available satellite image. Although satellite images are 2D, however the image collected of the earth is at a precisely known look angle, creating an oblique view of the volcanic ash. Earth observation satellites have thermal infrared (IR) sensors and data can be processed to estimate ash characteristics, while the oblique view allows the ash heights to be estimated. By comparing and differencing the synthetic image against the satellite image it is possible to validate the accuracy of the VAFTD model. For example, ray tracing techniques can be applied to the satellite image to construct a representation of the ash cloud at the same or similar look angle as the two-dimensional image generated from the forecast model. Then, the ray-traced representation of the satellite image can be compared to the two-dimensional image generated from the forecast model in order to detect the differences between the forecast model and the actual ash cloud.

The differences between the two images can be used to calibrate the VAFTD model, improving the accuracy of the next forecast in four dimensions. For example, after calculating and/or visually observing the differences between the two images, the forecast model can be updated. The forecast model can be updated by entering new values for the ash sizes, ash concentrations, humidity data, and other parameters related to atmospheric conditions.

Various remote sensing methods can be used to estimate the ash size and concentration including RADAR, LIDAR, visible and IR spectroscopy, and optical images. In-situ measurements can be difficult to obtain for the same reasons that aircraft avoid ash clouds, air breathing engines can be damaged or shut down due to the ash. Balloons and dropsonde can be used to pass through the clouds and make measurements, but this approach can be slow and expensive, so remote sensing by satellite is a better approach. Additionally, in some cases, ground sensors 2910 and 2912 can use RADAR, LIDAR, or other detection technologies to gather information about the ash cloud.

The remote data from the satellite, in conjunction with ground and balloon sensing, can be used to initialize the model parameters, and the rapid calculations made possible by the use of the synthetic image method can rapidly improve the model performance for each volcanic eruption, resulting in improved forecast accuracy in near real time.

Figure 30:
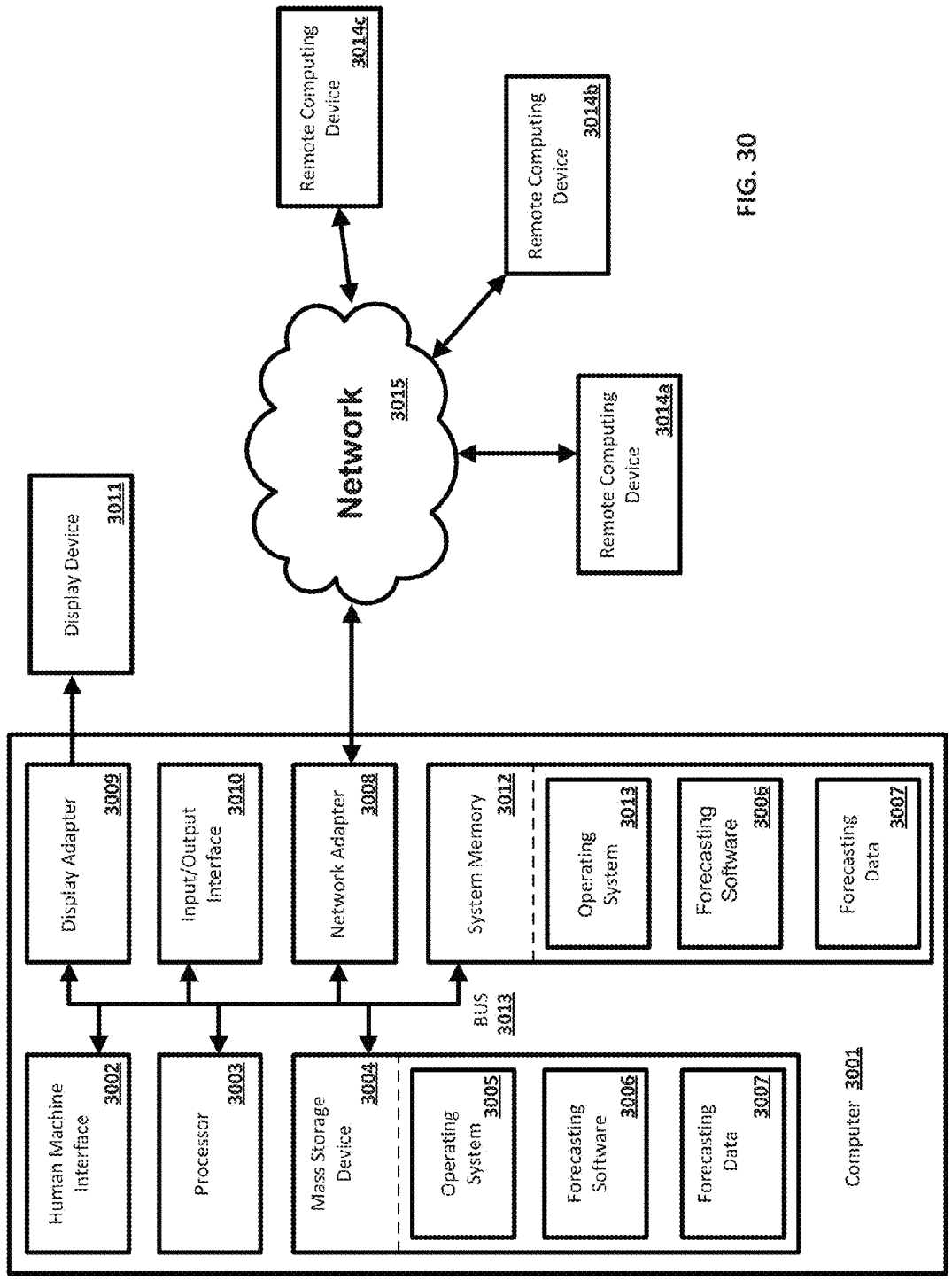
FIG. 30 illustrates a schematic of a computer system implementing the method.

In an exemplary aspect, the methods and systems can be implemented on a computer 3001 as illustrated in FIG. 30 and described below. By way of example, the forecasting device 2914 of FIG. 29 can be a computer as illustrated in FIG. 30. Similarly, the methods and systems disclosed can utilize one or more computers to perform one or more functions in one or more locations. FIG. 30 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well-known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, main frame computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments in which tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 3001. The components of the computer 3001 can comprise, but are not limited to, one or more processors or processing units 3003, a system memory 3012, and a system bus 3013 that couples various system components including the processor 3003 to the system memory 3012. In the case of multiple processing units 3003, the system can utilize parallel computing.

The system bus 3013 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 3013, and all buses specified in this description can also be implemented over a wired or wireless network connection and each of the subsystems, including the processor 3003, a mass storage device 3004, an operating system 3005, forecasting software 3006, forecasting data 3007, a network adapter 3008, system memory 3012, an Input/Output Interface 3010, a display adapter 3009, a display device 3011, and a human machine interface 3002, can be contained within one or more remote computing devices 3014a,b,c at physically separate locations, connected through buses of this form, in effect implementing a fully distributed system.

The computer 3001 typically comprises a variety of computer readable media. Exemplary readable media can be any available media that is accessible by the computer 3001 and comprises, for example and not meant to be limiting, both volatile and non-volatile media, removable and non-removable media. The system memory 3012 comprises computer readable media in the form of volatile memory, such as random access memory (RAM), and/or non-volatile memory, such as read only memory (ROM). The system memory 3012 typically contains data such as forecasting data 3007 and/or program modules such as operating system 3005 and forecasting software 3006 that are immediately accessible to and/or are presently operated on by the processing unit 3003.

In another aspect, the computer 3001 can also comprise other removable/non-removable, volatile/non-volatile computer storage media. By way of example, FIG. 30 illustrates a mass storage device 3004 that can provide non-volatile storage of computer code, computer readable instructions, data structures, program modules, and other data for the computer 3001. For example and not meant to be limiting, a mass storage device 3004 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 3004, including by way of example, an operating system 3005 and forecasting software 3006. Each of the operating system 3005 and forecasting software 3006 (or some combination thereof) can comprise elements of the programming and the forecasting software 3006. Forecasting data 3007 can also be stored on the mass storage device 3004. Forecasting data 3007 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 3001 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 3003 via a human machine interface 3002 that is coupled to the system bus 3013, but can be connected by other interface and bus structures, such as a parallel port, game port, an IEEE 1394 Port (also known as a Firewire port), a serial port, or a universal serial bus (USB).

In yet another aspect, a display device 3011 can also be connected to the system bus 3013 via an interface, such as a display adapter 3009. It is contemplated that the computer 3001 can have more than one display adapter 3009 and the computer 3001 can have more than one display device 3011. For example, a display device can be a monitor, an LCD (Liquid Crystal Display), or a projector. In addition to the display device 3011, other output peripheral devices can comprise components such as speakers (not shown) and a printer (not shown) which can be connected to the computer 3001 via Input/Output Interface 3010. Any step and/or result of the methods can be output in any form to an output device. Such output can be any form of visual representation, including, but not limited to, textual, graphical, animation, audio, tactile, and the like. The display 3011 and computer 3001 can be part of one device, or separate devices.

The computer 3001 can operate in a networked environment using logical connections to one or more remote computing devices 3014a,b,c. By way of example, a remote computing device can be a personal computer, portable computer, smartphone, a server, a router, a network computer, a peer device or other common network node, and so on. Logical connections between the computer 3001 and a remote computing device 3014a,b,c can be made via a network 3015, such as a local area network (LAN) and/or a general wide area network (WAN). Such network connections can be through a network adapter 3008. A network adapter 3008 can be implemented in both wired and wireless environments. Such networking environments are conventional and commonplace in dwellings, offices, enterprise-wide computer networks, intranets, and the Internet.

For purposes of illustration, application programs and other executable program components such as the operating system 3005 are illustrated herein as discrete blocks, although it is recognized that such programs and components reside at various times in different storage components of the computing device 3001, and are executed by the data processor(s) of the computer. An implementation of forecasting software 3006 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ artificial intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. expert inference rules generated through a neural network or production rules from statistical learning).

The examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

The invention claimed is:

1. A method, comprising:
  receiving first data based at least on a forecast model of a volcanic ash cloud, wherein the first data has at least one fewer spatial dimension than second data associated with the forecast model, wherein the first data comprises an image;
  determining accuracy of the forecast model based on at least the image of the first data and measurements of at least a portion of the volcanic ash cloud; and
  providing results of the determining the accuracy of the forecast model.

2. The method of claim 1, further comprising accessing the forecast model of the volcanic ash cloud, wherein the accessing the forecast model comprises at least one of generating the forecast model of the volcanic ash cloud and receiving the forecast model of the volcanic ash cloud.

3. The method of claim 1, further comprising:
  determining one or more ash sizes, wherein the measurements of at least a portion of the volcanic ash cloud include the one or more ash sizes, wherein the one or more ash sizes are determined at one or more altitudes; and
  determining one or more ash concentrations, wherein the measurements of at least a portion of the volcanic ash cloud include the ash concentrations, wherein the one or more ash concentrations are determined at one or more altitudes.

4. The method of claim 1, further comprising receiving a satellite image of the volcanic ash, wherein the measurements of at least a portion of the volcanic ash cloud comprise at least a portion of the satellite image.

5. The method of claim 4, further comprising determining a satellite look angle.

6. The method of claim 5, further comprising:
  calculating one or more ash sizes based on the satellite look angle; and
  calculating one or more ash concentrations based on the satellite look angle.

7. The method of claim 1, wherein refining the forecast model comprises changing at least one of, one or more ash sizes in the forecast model and one or more ash concentrations in the forecast model.

8. The method of claim 1, wherein the first data comprises only two spatial dimensions.

9. The method of claim 1, further comprising refining the forecast model based at least on the results of the determining the accuracy of the forecast model, thereby improving a representation of the volcanic ash cloud.

10. The method of claim 1, wherein the forecast model comprises a volcanic ash forecast transport and dispersion model.

11. The method of claim 1, wherein the measurements of at least a portion of the volcanic ash are obtained from at least one of RADAR, LiDAR, an optical sensor, a dropsonde, an unmanned aircraft, and a weather balloon.

12. The method of claim 1, wherein determining accuracy is based on a comparison of a portion of the first data and the measurements of at least a portion of the volcanic ash.

13. The method of claim 1, further comprising:
  determining a total mass of the volcanic ash cloud, wherein the measurements of at least a portion of the volcanic ash cloud comprise the one or more ash sizes; and
  determining a density of one or more particles in the volcanic ash cloud, wherein the measurements of at least a portion of the volcanic ash cloud comprise the one or more ash sizes.

14. The method of claim 1, further comprising determining accuracy of the forecast model based at least on information associated with a volcano.

15. The method of claim 14, wherein the information associated with the volcano comprises at least one of a geochemistry of the volcano and an eruption rate of the volcano.

16. A method comprising:
  accessing a three dimensional forecast model comprising a representation of a particle cloud;
  generating a two dimensional synthetic image of the three dimensional forecast model based on a time parameter;
  receiving measurements of the particle cloud, wherein the measurements are associated with a time indicated by the time parameter;
  determining a difference between the representation of the particle cloud and the particle cloud based on the measurements and the two dimensional synthetic image; and adjusting the three dimensional forecast model based on the difference between the representation of the particle cloud and the particle cloud.

17. The method of claim 16, wherein receiving measurements of the particle cloud comprises using at least one of RADAR, LIDAR, satellite imagery, satellite remote sensing, infrared reverse absorption, brightness temperature differencing, visible spectrometry, infrared spectrometry, a balloon, an unmanned aerial vehicle, a dropsonde, a rocket power aircraft, an electrically powered aircraft, and an air breathing engine aircraft.

18. The method of claim 16, wherein determining a difference between the representation of the particle cloud and the particle cloud based on the measurements of the particle cloud and the two dimensional synthetic image comprises comparing the two-dimensional synthetic image to a two dimensional satellite image made at the time indicated by the time parameter.

19. The method of claim 16, wherein receiving measurements of the particle cloud comprises receiving satellite imaging from a plurality of look-angles and calculating a vertical height of particles of the particle cloud.

20. A system, comprising:
  a memory having computer-executable instructions encoded thereon; and
  at least one processor functionally coupled to the memory and configured, by the computer-executable instructions, for,
    receiving first data based at least on a forecast model of a volcanic ash cloud, wherein the first data has at least one fewer spatial dimension than second data associated with the forecast model, wherein the first data comprises an image;
    determining accuracy of the forecast model based on at least the image of the first data and measurements of at least a portion of the volcanic ash cloud; and
    providing results of the determining the accuracy of the forecast model.

* * * * *